(12) United States Patent
Discenzo et al.

(10) Patent No.: US 7,539,549 B1
(45) Date of Patent: May 26, 2009

(54) MOTORIZED SYSTEM INTEGRATED CONTROL AND DIAGNOSTICS USING VIBRATION, PRESSURE, TEMPERATURE, SPEED, AND/OR CURRENT ANALYSIS

(75) Inventors: Fred Discenzo, Brecksville, OH (US); Peter Unsworth, Lewes (GB); Sarat Babu Vetcha, Secunderabad (IN); Kenneth A. Loparo, Chesterland, OH (US); Carl J. Dister, North Olmsted, OH (US); Edward J. Tomkin, Cuyahoga Falls, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 811 days.

(21) Appl. No.: 09/866,414

(22) Filed: May 25, 2001

Related U.S. Application Data

(63) Continuation-in-part of application No. 09/407,617, filed on Sep. 28, 1999, now Pat. No. 6,757,665, and a continuation-in-part of application No. 09/163,933, filed on Sep. 29, 1999, now Pat. No. 6,289,735, and a continuation-in-part of application No. 09/461,787, filed on Dec. 15, 1999, now Pat. No. 6,326,758.

(51) Int. Cl.
*G05B 13/02* (2006.01)
(52) U.S. Cl. .................... 700/28; 702/183; 324/772
(58) Field of Classification Search ............ 700/48, 700/49, 28, 193, 78; 702/183; 310/67 R; 324/772
See application file for complete search history.

(56) References Cited

U.S. PATENT DOCUMENTS

| | | | |
|---|---|---|---|
| 4,380,172 A | 4/1983 | Imam et al. | |
| 4,425,798 A | 1/1984 | Nagai et al. | |
| 4,429,578 A | 2/1984 | Darrel et al. | |
| 4,525,763 A | 6/1985 | Hardy et al. | 361/24 |
| 4,755,790 A | 7/1988 | Umehara | 340/53 |
| 4,933,834 A * | 6/1990 | Gotou et al. | 700/78 |
| 4,965,513 A | 10/1990 | Haynes et al. | 324/158 |
| 4,985,857 A | 1/1991 | Bajpai et al. | |
| 5,043,862 A | 8/1991 | Takahashi et al. | |

(Continued)

OTHER PUBLICATIONS

European Search Report Dated: Dec. 19, 2002 for European Patent Application EP 02 017 653.3.

(Continued)

*Primary Examiner*—Jungwon Chang
(74) *Attorney, Agent, or Firm*—Amin Turocy & Calvin LLP; R. Scott Speroff; William R. Walbrun

(57) ABSTRACT

Systems and methods are disclosed for controlling and diagnosing the health of a motorized system. The systems may comprise a diagnostics system and a controller, wherein the diagnostics system employs a neural network, an expert system, and/or a data fusion component in order to assess the health of the motorized system according to one or more attributes associated therewith. The controller may operate the motorized system in accordance with a setpoint and/or a diagnostics signal from the diagnostics system. Also disclosed are methodologies for controlling and diagnosing the health of a motorized system, comprising operating a motor in the motorized system in a controlled fashion, and diagnosing the health of the motorized system according to a measured attribute associated with the motorized system, wherein the motor may be operated according to a setpoint and/or the diagnostics signal.

50 Claims, 38 Drawing Sheets

U.S. PATENT DOCUMENTS

| | | | |
|---|---|---|---|
| 5,049,815 A | 9/1991 | Kliman | 324/158 |
| 5,111,531 A * | 5/1992 | Grayson et al. | 706/23 |
| 5,121,467 A * | 6/1992 | Skeirik | 706/10 |
| 5,189,350 A | 2/1993 | Mallett | 318/434 |
| 5,282,261 A | 1/1994 | Skeirik et al. | |
| 5,313,399 A | 5/1994 | Beale et al. | |
| 5,349,541 A * | 9/1994 | Alexandro et al. | 703/18 |
| 5,355,060 A | 10/1994 | Peterson | |
| 5,419,197 A * | 5/1995 | Ogi et al. | 73/659 |
| 5,442,555 A | 8/1995 | Reifman et al. | |
| 5,456,115 A | 10/1995 | Kuwabara et al. | |
| 5,501,105 A | 3/1996 | Hernandez et al. | |
| 5,533,400 A | 7/1996 | Gasch et al. | |
| 5,541,857 A | 7/1996 | Walter et al. | 364/558 |
| 5,574,646 A | 11/1996 | Kawasaki et al. | |
| 5,586,305 A | 12/1996 | Eidson et al. | |
| 5,602,757 A | 2/1997 | Haseley et al. | 364/551.01 |
| 5,610,339 A | 3/1997 | Haseley et al. | |
| 5,614,676 A | 3/1997 | Dutt et al. | |
| 5,640,103 A * | 6/1997 | Petsche et al. | 324/772 |
| 5,659,667 A | 8/1997 | Buescher et al. | |
| 5,661,380 A | 8/1997 | Obara et al. | |
| 5,677,611 A | 10/1997 | Yoshihara et al. | |
| 5,757,645 A | 5/1998 | Schneider et al. | |
| 5,772,403 A | 6/1998 | Alllison et al. | |
| 5,784,273 A * | 7/1998 | Madhavan | 700/71 |
| 5,841,651 A | 11/1998 | Fu et al. | |
| 5,846,056 A | 12/1998 | Dhindsa et al. | |
| 5,859,774 A | 1/1999 | Kuzuya et al. | |
| 5,940,291 A | 8/1999 | Dawson et al. | |
| 5,941,305 A * | 8/1999 | Thrasher et al. | 166/53 |
| 5,986,422 A | 11/1999 | Iwashita et al. | |
| 6,002,232 A | 12/1999 | McConnell et al. | |
| 6,004,017 A * | 12/1999 | Madhavan | 700/71 |
| 6,006,170 A * | 12/1999 | Marcantonio et al. | 702/182 |
| 6,014,598 A | 1/2000 | Duyar et al. | |
| 6,014,612 A | 1/2000 | Larson et al. | |
| 6,021,758 A | 2/2000 | Carey et al. | 123/436 |
| 6,029,095 A | 2/2000 | Boissy et al. | |
| 6,088,633 A | 7/2000 | Yamamoto | |
| 6,112,846 A | 9/2000 | Mukai et al. | |
| 6,138,078 A | 10/2000 | Canada et al. | 702/44 |
| 6,144,181 A | 11/2000 | Rehm et al. | |
| 6,144,924 A * | 11/2000 | Dowling et al. | 702/60 |
| 6,157,156 A | 12/2000 | Tsuruta | |
| 6,192,325 B1 | 2/2001 | Piety et al. | |
| 6,260,004 B1 * | 7/2001 | Hays et al. | 702/183 |
| 6,294,891 B1 | 9/2001 | McConnell et al. | |
| 6,369,472 B1 * | 4/2002 | Grimm et al. | 310/67 R |
| 6,415,200 B1 * | 7/2002 | Kato et al. | 700/193 |
| 6,445,959 B1 | 9/2002 | Poth et al. | |
| 6,584,430 B1 | 6/2003 | Rosenblum et al. | |

OTHER PUBLICATIONS

Comments on Rolling Element Bearing Analysis@; by Ronald L. Eshleman, et al.; Vibrations; vol. 13; No. 2; Jun. 1997; pp. 11-17.

Search results for "time horizon" www.techdictionary.com visited Mar. 25, 2005.

* cited by examiner

| DIAGNOSTICS SIGNAL | |
|---|---|
| CLASS 0 | normal; no cavitation |
| CLASS 1 | incipient cavitation; mainly balance hole cavitation |
| CLASS 2 | medium cavitation; mainly vane cavitation |
| CLASS 3 | full cavitation; large amount of bubbles on the suction eye but no surging |
| CLASS 4 | surging cavitation; full blown cavitation with surging |

FIG. 9

| | $f_0$ | $f_1$ | $f_2$ | $f_3$ | $f_4$ | ... | ... | ... | $f_n$ | |
|---|---|---|---|---|---|---|---|---|---|---|
| | $A_3$ | $A_{34}$ | $A_{67}$ | $A_{78}$ | $A_{84}$ | • | • | • | $A_K$ | HEALTHY PUMP |
| | $A_{34}$ | $A_{-68}$ | $A_{-90}$ | $A_{-65}$ | $A_{45}$ | • | • | • | $A_H$ | PUMP FAULT 1 |
| | $A_{56}$ | $A_{45}$ | $A_{45}$ | $A_{56}$ | $A_{78}$ | • | • | • | $A_X$ | PUMP FAULT 2 |
| | $A_{-23}$ | $A_{45}$ | $A_7$ | $A_{90}$ | $A_{12}$ | • | • | • | $A_Z$ | PUMP FAULT 3 |
| | $A_{67}$ | $A_{38}$ | $A_3$ | $A_{45}$ | $A_{47}$ | • | • | • | $A_X$ | PUMP FAULT 4 |
| | $A_{78}$ | $A_{67}$ | $A_{12}$ | $A_{67}$ | $A_{37}$ | • | • | • | $A_C$ | PUMP FAULT 5 |
| | $A_{234}$ | $A_{27}$ | $A_{478}$ | $A_{24}$ | $A_{127}$ | • | • | • | $A_Q$ | PUMP FAULT 6 |
| | $A_{-98}$ | $A_{78}$ | $A_{26}$ | $A_{12}$ | $A_{128}$ | • | • | • | $A_B$ | PUMP FAULT 7 |
| | $A_{26}$ | $A_{96}$ | $A_{83}$ | $A_{56}$ | $A_{234}$ | • | • | • | $A_M$ | PUMP FAULT 8 |
| | $A_4$ | $A_{32}$ | $A_{187}$ | $A_{56}$ | $A_{34}$ | • | • | • | $A_I$ | PUMP FAULT 9 |
| | $A_0$ | $A_{16}$ | $A_{73}$ | $A_{76}$ | $A_{33}$ | • | • | • | $A_E$ | PUMP FAULT N-1 |
| | $A_{75}$ | $A_{17}$ | $A_{45}$ | $A_{69}$ | $A_{44}$ | • | • | • | $A_Q$ | PUMP FAULT N |

FIG. 14g

IF all the attributes are NORMAL THEN condition is normal
IF slip is SLLO and noise_2 is HI THEN condition is low-cav
IF noise_4 and noise_5 are VERHI THEN condition is sev-cav
IF noise_4 and noise_5 are HI THEN condition is sev-cav
IF FsAmp is SLLO and noise_5 are SLHI THEN condition is sev-cav
IF FsAmp is LO and noise_5 is SLHI THEN condition is sev-cav
IF FsAmp is VERLO and noise_5 is SLHI THEN condition is sev-cav
IF FsAmp is SLLO and noise_4 are HI THEN condition is sev-cav
IF FsAmp is LO and noise_4 is HI THEN condition is sev-cav
IF FsAmp is VERLO and noise_4 is NORMAL and noise_5 is NORMAL THEN condition is sev-block
IF FsAmp is LO and noise_4 is NORMAL and noise_5 is NORMAL THEN condition is sev-block
IF FsAmp is SLLO and slip is SLLO and noise_4 is NORMAL and noise_5 is NORMAL THEN condition is sev-block
IF slip and FsAmp are VERLO THEN condition is sev-block
IF FrAmp is HI THEN condition is impel-fault
IF framp is VERHI THEN condition is impel-fault

Fig. 23

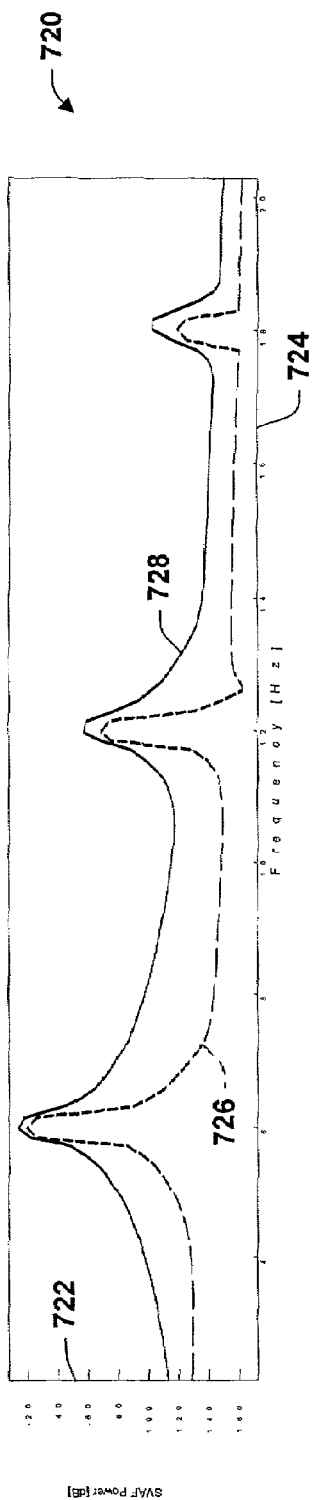
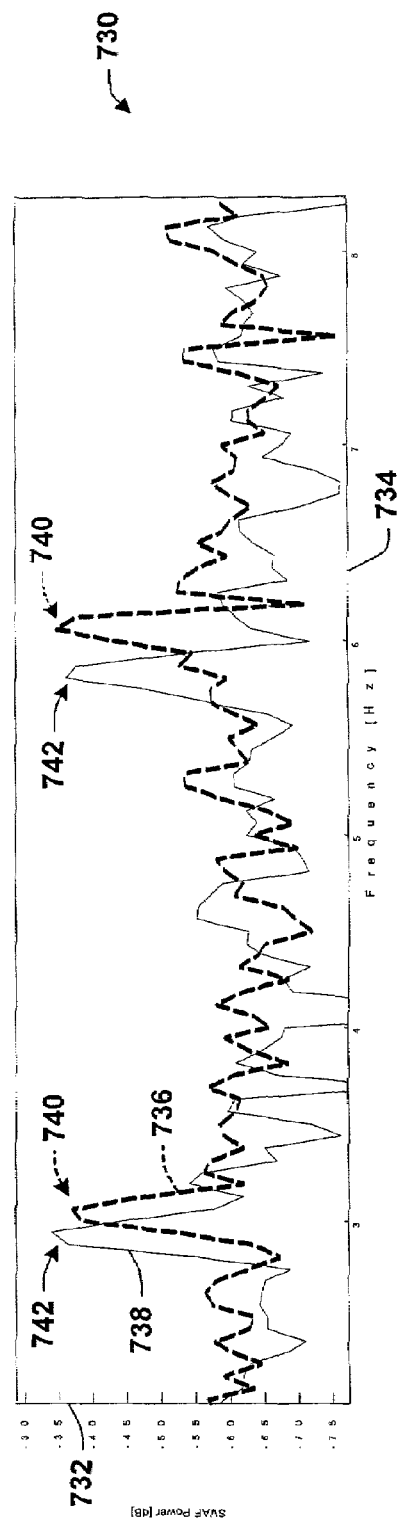
FIG. 33
FIG. 34

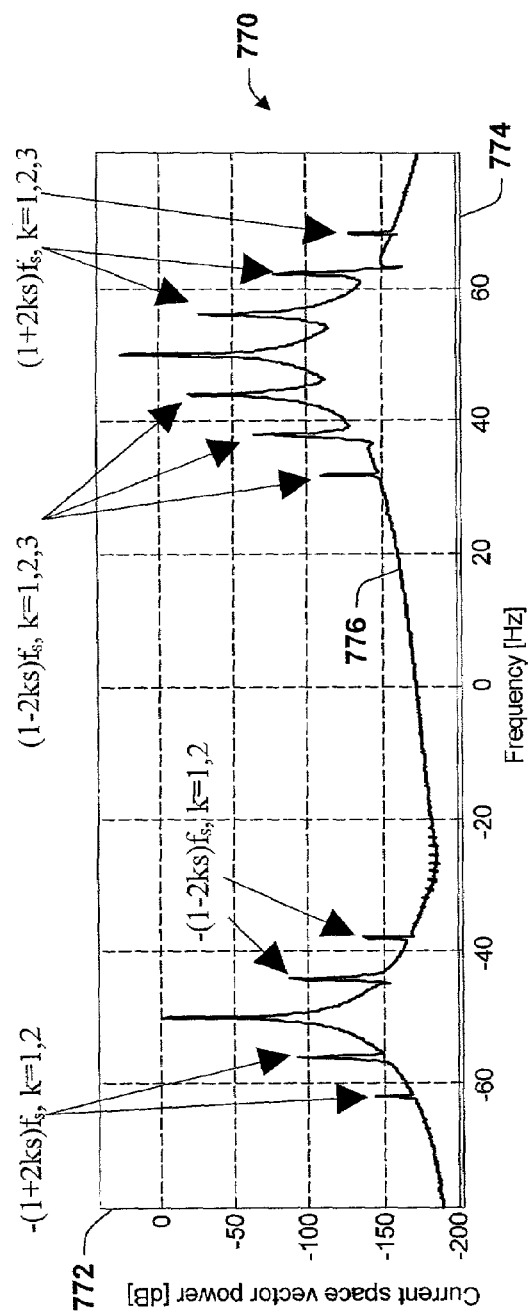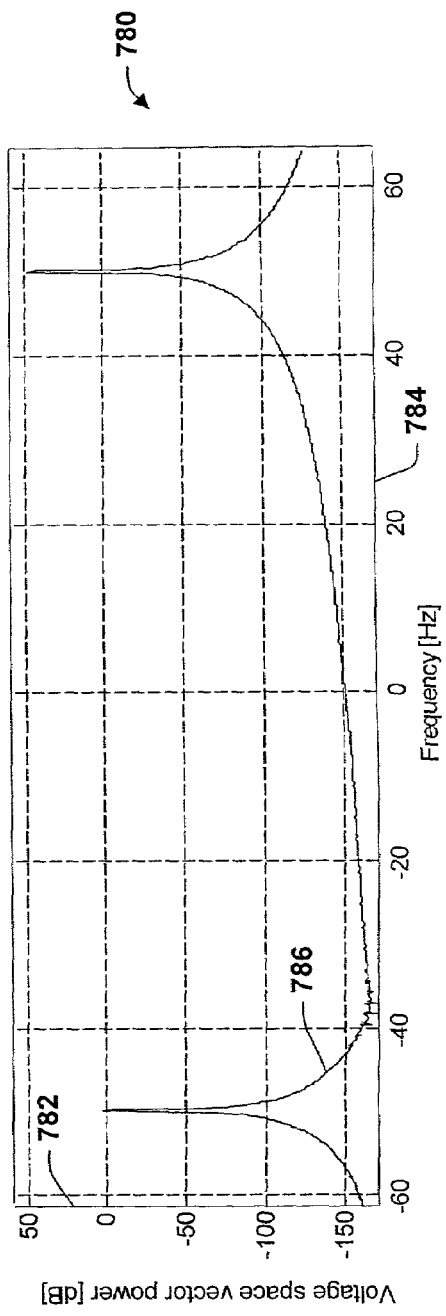

MOTORIZED SYSTEM INTEGRATED CONTROL AND DIAGNOSTICS USING VIBRATION, PRESSURE, TEMPERATURE, SPEED, AND/OR CURRENT ANALYSIS

CROSS REFERENCE TO RELATED APPLICATIONS

This application is a continuation-in-part of application Ser. Nos. 09/407,617, filed on Sep. 28, 1999, now U.S. Pat. No. 6,757,665; 09/163,933, filed on Sep. 29, 1999, now U.S. Pat. No. 6,289,735; and 09/461,787, filed on Dec. 15, 1999, now U.S. Pat. No. 6,326,758, the disclosures of which are hereby incorporated by reference as if fully set forth herein.

FIELD OF THE INVENTION

The invention described below generally relates to controlling and diagnosing the health of a machine, and more particularly, to systems and methods for controlling and diagnosing motorized systems according to vibration, pressure, temperature, speed, and/or current analysis.

BACKGROUND OF THE INVENTION

Many industrial processes and machines are controlled and/or powered by electric motors. Motorized systems include pumps providing fluid transport for chemical and other processes, fans, conveyor systems, compressors, gear boxes, motion control devices, screw pumps, and mixers, as well as hydraulic and pneumatic machines driven by motors. Such motors are combined with other system components, such as valves, pumps, conveyor rollers, fans, compressors, gearboxes, and the like, as well as with appropriate motor drives, to form industrial machines and actuators. For example, an electric motor may be combined with a motor drive providing electrical power to the motor, as well as with a pump, whereby the motor rotates the pump shaft to create a controllable pumping system.

Controls within such motorized systems provide for automatic system operation in accordance with a setpoint value, and may additionally allow for manual operation. Thus, for instance, a motorized pump system may be operated so as to achieve a user specified outlet fluid flow rate, pressure, or other system setpoint. In another example, a motorized conveyor system may include one or more motorized roller systems, wherein the individual roller systems are controlled according to a conveyor speed setpoint. Such motorized system controls may include a controller receiving a setpoint from a user or from another system, which inputs one or more system performance values and provides appropriate control signals to cause the motorized system to operate in a controlled fashion according to a control scheme. For example, a motorized pump system may be controlled about a flow rate setpoint, wherein the associated controller reads the setpoint from a user interface, measures the system outlet flow rate via a flow sensor, and provides a control signal indicative of pump speed to a motor drive operatively connected to a motorized pump, whereby the control signal is adjusted so as to achieve the setpoint flow rate in closed-loop fashion.

Although operation of such motorized systems and controllers may achieve system operation in accordance with the setpoint, other factors such as system component wear, component faults, or other adverse conditions, and the like, may affect the operation of the motorized system. Thus, for example, degradation in a pump impeller in a motorized pumping system may lead to premature catastrophic failure of the system if left unchecked. In this regard, operation of the pump strictly in accordance with a flow rate setpoint may accelerate the system component wear, degradation, and/or failure, whereas operation at other flow rates may allow the system to last longer. This may be of importance in critical systems where safety is an issue. For instance, the motorized pumping system may be located on board a military vessel at sea, wherein operation according to a flow setpoint may lead to catastrophic pump impeller failure before the vessel can be brought to port for repairs or maintenance, whereas system operation at a reduced flow rate may allow the pump to survive until the next scheduled servicing.

Motor diagnostics apparatus has been employed in the past to provide an indication of wear, damage, and/or degradation in motorized system components, such as motors, prior to catastrophic failure thereof. Such diagnostic devices may be used to monitor the overall health of either the motorized system components being controlled, or the control system itself. In this regard, assessing system health can be used to minimize unscheduled system downtime and to prevent equipment failure. This capability can avoid a potentially dangerous situation caused by the unexpected outage or catastrophic failure of machinery. However, many conventional diagnostic devices inconveniently require an operator to manually collect data from machinery using portable, handheld data acquisition probes.

Other known systems have sensors and data acquisition and network equipment permanently attached to critical machinery for remote diagnostics. Typically the diagnostics equipment is directed to detecting problems with the control system hardware itself or monitoring the integrity of the output, i.e., monitoring when the control system response is outside prescribed time or value limits. As noted above, control system health monitoring, health assessment and prognostics generally are performed in isolation from any associated control system. These systems typically conduct passive monitoring and assess system health using diagnostic algorithms and sensors dedicated to establish system health. This passive monitoring is frequently done using off-line, batch-mode data acquisition and analysis to establish the health of the system.

In conventional motorized systems, therefore, controlled operation is provided about a setpoint, wherein such controlled setpoint operation may exacerbate system component degradation and/or accelerate catastrophic failure thereof. Prior diagnostics apparatus achieves some level of identification of such system component degradation prior to component failure. However, as noted previously, because virtually all diagnostics systems perform off-line diagnostic processing, it has been extremely difficult to implement diagnostics processing real-time in coordination with on-line control. Thus there is a need for improved control and diagnostics systems and techniques by which controlled operation of motorized systems can be achieved while mitigating the extent of component degradation and failure.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter. The invention provides control systems and methodologies for controlling and diagnosing the health of a motorized system and/or components thereof. Diagnosis of the system or component health is accomplished using advanced analytical techniques such as neural networks, expert systems, data fusion, spectral analysis, and the like, wherein one or more faults or adverse conditions associated with the system may be detected and/or diagnosed.

The diagnostics may be performed using one or more measured system parameters, such as vibration, pressure, temperature, speed, power, current, or the like. Frequency spectral analysis may also be employed in order to detect and/or diagnose component wear, degradation, failure, faults, and the like. For example, one or more signals from system sensors may be processed by a diagnostics system and analyzed in the frequency domain, whereby such adverse conditions may be identified and/or predicted. The diagnostics system may further provide one or more diagnostics signals indicative of the health of a motorized system, which may then be provided to an associated controller, whereby the operation of the motorized system may be modified. In this regard, the system operation may be modified to ameliorate detected component or system degradation.

The invention may thereby provide for extending the useful service life of one or more system components. Thus, the invention finds utility in association with a variety of industrial processes and machines which are controlled and/or powered by electric and other types of motors. Such processes and machines include pumps providing fluid transport for chemical and other processes, fans, conveyor systems, compressors, gear boxes, motion control devices, screw pumps, and mixers, as well as hydraulic and pneumatic machines driven by motors.

According to an aspect of the present invention, there is provided a diagnostics and control system for controlling a motorized system and diagnosing the health thereof. The diagnostics and control system may comprise a controller operatively associated with the motorized system and adapted to operate the motorized system in a controlled fashion, and a diagnostics system operatively associated with the motorized system and adapted to diagnose the health of the motorized system according to a measured attribute associated with the motorized system. The measured attribute may comprise vibration, pressure, current, speed, and/or temperature, for example, wherein such attribute information is obtained from one or more sensors operatively connected to the motorized system.

The diagnostics system may provide a diagnostics signal according to the health of the motorized system, and the controller may accordingly provide a control signal to the motorized system according to a setpoint and/or the diagnostics signal. For example, the controller may comprise one or more changeable parameters, such as gains or the like, wherein the parameter may be changeable in response to the diagnostics signal. In this manner, the operation of the motorized system may be adaptable to a variety of system health conditions, whereby the adverse effects of system health problems may be proactively addressed in order to mitigate the effects thereof, including for example, the extension of service life and the reduction in system downtime and/or failures. Moreover, the output of the controller may be provided to the diagnostics system so that the health assessment made by the diagnostics system can be based at least in part on the control signal and the response by the motorized system to this control action.

In addition to component diagnostic information, the invention provides for detecting, diagnosing, and/or adaptive control according to other detected system operating conditions. For instance, the diagnostics system may be advantageously employed in order to detect and diagnose cavitation, blockage, and/or the like in a motorized pump or in the system in which the motorized pump is employed. In this regard, pressure and flow information related to the pumping system may be measured and cavitation conditions may be identified using a classifier system, such as a neural network. The diagnostics system may thus comprise such a classifier system for detecting pump cavitation according to flow and pressure data. The invention may be employed in cavitation monitoring, as well as in control equipment associated with pumping systems, whereby pump wear and failure associated with cavitation conditions may be reduced or eliminated.

Such pumping system cavitation conditions may alternatively or in combination be diagnosed using other measured signals from the system. For instance, it has been found that fault data relating to the operating condition of a motorized pump may be ascertained from variations in current of a motor driving the pump. These features present in the stator frequency spectrum of the motor stator current may be caused by load effects of the pump on the motor rather than changes in the motor itself. The present invention provides a system and method for extracting (e.g., synthesizing) the fault data directly from the instantaneous motor current data. This data relates not only to pump machinery conditions, but also pump process conditions. Thus, by employing current signature analysis of the instantaneous current of the motor driving the pump, problems with the pump and/or process line can be detected without using invasive and expensive pressure and flow meters. Instead, a lower cost current sensor may be used and this sensor may be located in a motor control center or other suitable location remote from the motor and pump.

Artificial neural networks (ANN) may thus be employed analyze the current signature data of the motor that relates to pump faults. Although, multi-iterative, supervised learning algorithms could be used, which could be trained and used only when a fully-labeled data set corresponding to all possible operating conditions, the application of unsupervised ANN techniques that can learn on-line (even in a single iteration) may be provided in accordance with the present invention. The current signature analysis, moreover, may be performed both on the pump to determine the operating state of the pump, and on the motor driving the pump so as to determine the operating state of the motor, simultaneously.

The present invention also provides for preprocessing of the fault signature data before it is being used to train an ANN or design a decision module based on ANN paradigms. The preprocessing eliminates outliers and performs scaling and bifurcation of the data into training and testing sets. Furthermore, it is desired to further post process the output generated by unsupervised ANN based decision modules for condition monitoring applications. This is because unsupervised ANN based decision modules when presented with a new operating condition can only signal the formation of a new output entry indicating that a possible new condition has occurred, but is not necessarily able to provide particular fault information. Post processing is carried out by utilizing the domain knowledge of a human expert to develop an expert system, or by correctly classifying this new operating state and encoding this information in a fuzzy expert system for future reference.

Another aspect of the invention provides systems and methodologies for detecting motor faults by space vector angular fluctuation, which require no human intervention or downtime, in order to identify motor faults such as stator faults, rotor faults, and even imbalances in power applied to the motor in a timely fashion. Systems and methodologies are provided for detecting faults and adverse conditions associated with electric motors. The methodology provides for analyzing the angular fluctuation in a current space vector in order to detect one or more faults associated with the motor. Systems are disclosed having a diagnostics component adapted to obtain a space vector from a current signal relating to operation of the motor, and to analyze the space vector angular fluctuation in order to detect motor faults.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 9 is a schematic diagram illustrating an exemplary cavitation classification in accordance with the invention;

FIG. 14g is a table diagram of current signal amplitudes over a range of frequencies, which may be employed to facilitate diagnosing an operating state of a machine in accordance with the present invention;

FIG. 23 is an example of a set of fuzzy rules in accordance with the present invention;

FIG. 33 is an exemplary plot illustrating an amplitude fluctuation in 2fs and 4fs components due to rotor resistance imbalance according to the invention;

FIG. 34 is an exemplary plot illustrating an amplitude fluctuation in 2fs and 4fs components due to a broken rotor bar in accordance with the invention;

FIG. 37 is an exemplary plot illustrating a current space vector spectrum in accordance with the invention;

FIG. 38 is an exemplary plot illustrating a voltage space vector spectrum in accordance with the invention;

DETAILED DESCRIPTION OF THE INVENTION

Figure 1:
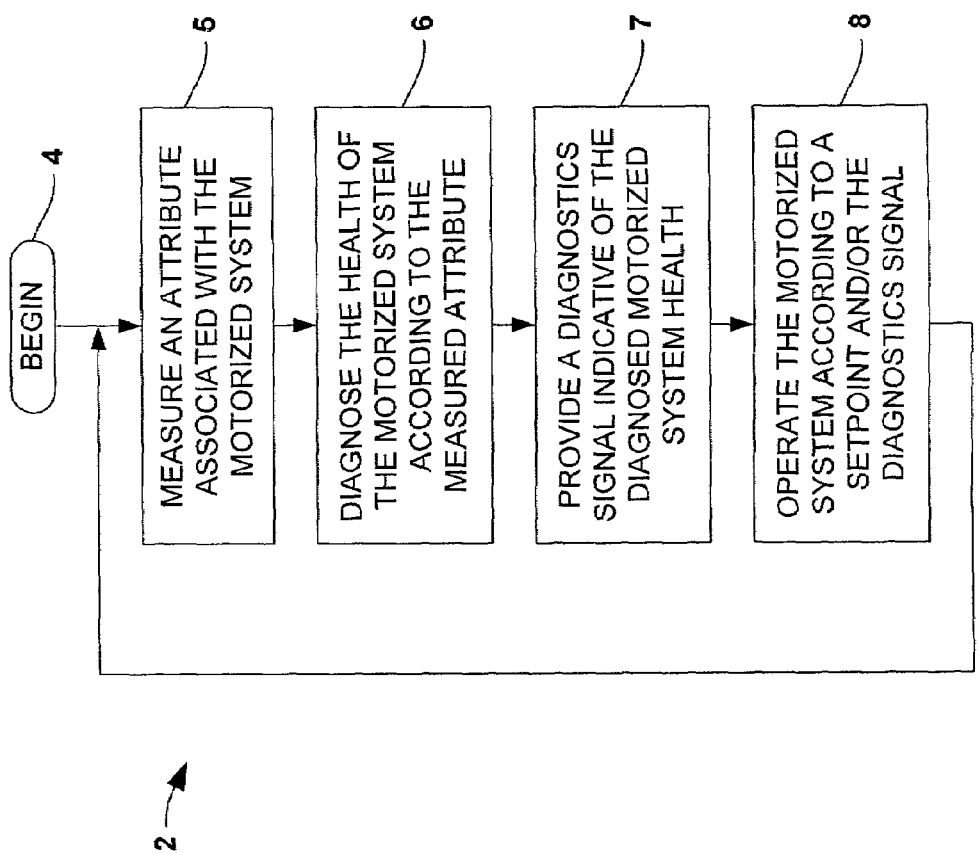
FIG. 1 is a schematic diagram illustrating an exemplary method in accordance with an aspect of the present invention.

The various aspects of the present invention will now be described with reference to the drawings, wherein like reference numerals are used to refer to like elements throughout. The invention provides a diagnostics and control system for controlling a motorized system and diagnosing the health thereof, with a controller operatively associated with the motorized system and adapted to operate the motorized system in a controlled fashion, and a diagnostics system operatively associated with the motorized system and adapted to diagnose the health of the motorized system according to a measured attribute associated with the motorized system.

Referring initially to FIG. 1, an exemplary method 2 is illustrated for controlling a motorized system and diagnosing the health thereof. The method 2 comprises operating a motor in the motorized system in a controlled fashion, and diagnosing the health of the motorized system according to a measured attribute associated with the motorized system. While the exemplary method 2 is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. In addition, not all illustrated blocks, events, or acts, may be required to implement a methodology in accordance with the present invention. Moreover, it will be appreciated that the exemplary method 2 and other methods according to the invention, may be implemented in association with the motorized systems illustrated and described herein, as well as in association with other systems and apparatus not illustrated or described.

Beginning at 4, the exemplary method 2 comprises measuring an attribute at 5, wherein the attribute is associated with a motorized system (e.g., motorized pump, fan, conveyor system, compressor, gear box, motion control device, screw pump, and mixer, hydraulic or pneumatic machine, or the like). The attribute measured at 5 may comprise, for example, vibration, pressure, current, speed, and/or temperature associated with the motorized system. At 6, the health of the motorized system is diagnosed according to the measured attribute. A diagnostics signal is provided at 7, which may be indicative of the diagnosed motorized system health, whereby the motorized system is operated at 8 according to a setpoint and/or the diagnostics signal generated at 7. The provision of the diagnostics signal at 7 may comprise obtaining a frequency spectrum of the measured attribute and analyzing the frequency spectrum in order to detect faults, component wear or degradation, or other adverse condition in the motorized system, whether actual or anticipated. The diagnosis may further comprise analyzing the amplitude of a first spectral component of the frequency spectrum at a first frequency.

In order to provide the diagnostics signal, moreover, the invention may provide the measured attribute to a neural network, an expert system, a fuzzy logic system, and/or a data fusion component, which generates the diagnostics signal indicative of the health of the motorized system. For example, such frequency spectral analysis may be employed at 6 in order to determine faults or adverse conditions associated with the system or components therein (e.g., motor faults, unbalanced power source conditions, etc.). In addition, the diagnosis at 6 may identify adverse process conditions, such as cavitation in a motorized pumping system. The diagnostics signal generated at 7 may be employed by a controller associated with the system, whereby modified operation thereof may be performed in order to ameliorate or avoid actual or anticipated diagnosed health problems.

Another aspect of the invention provides systems and apparatus for controlling and diagnosing the health of motorized systems. Various aspects of the invention will be hereinafter illustrated with respect to an exemplary motorized pumping system. However, it will be appreciated by those skilled in the art that the invention finds application in association with motorized systems in addition to those illustrated and described herein, including but not limited to motorized pumps, fans, conveyor systems, compressors, gear boxes, motion control devices, screw pumps, mixers, hydraulic or pneumatic machines, or the like.

Referring now to FIGS. 2-6, a motorized pump system 12 is illustrated having an exemplary diagnostics and control system 66 for controlling the system 12 and diagnosing the health thereof, in accordance with the present invention. As illustrated and described in greater detail hereinafter, the diagnostics and control system 66 comprises a controller 71 operatively associated with the motorized system 12 and adapted to operate the system 12 in a controlled fashion, and a diagnostics system 70 operatively associated with the motorized system 12 and adapted to diagnose the system health according to a measured attribute. The diagnostics and control system 66 of the invention may measure attributes such as vibration, pressure, current, speed, and/or temperature in order to operate and diagnose the health of the system 12.

Figure 2:
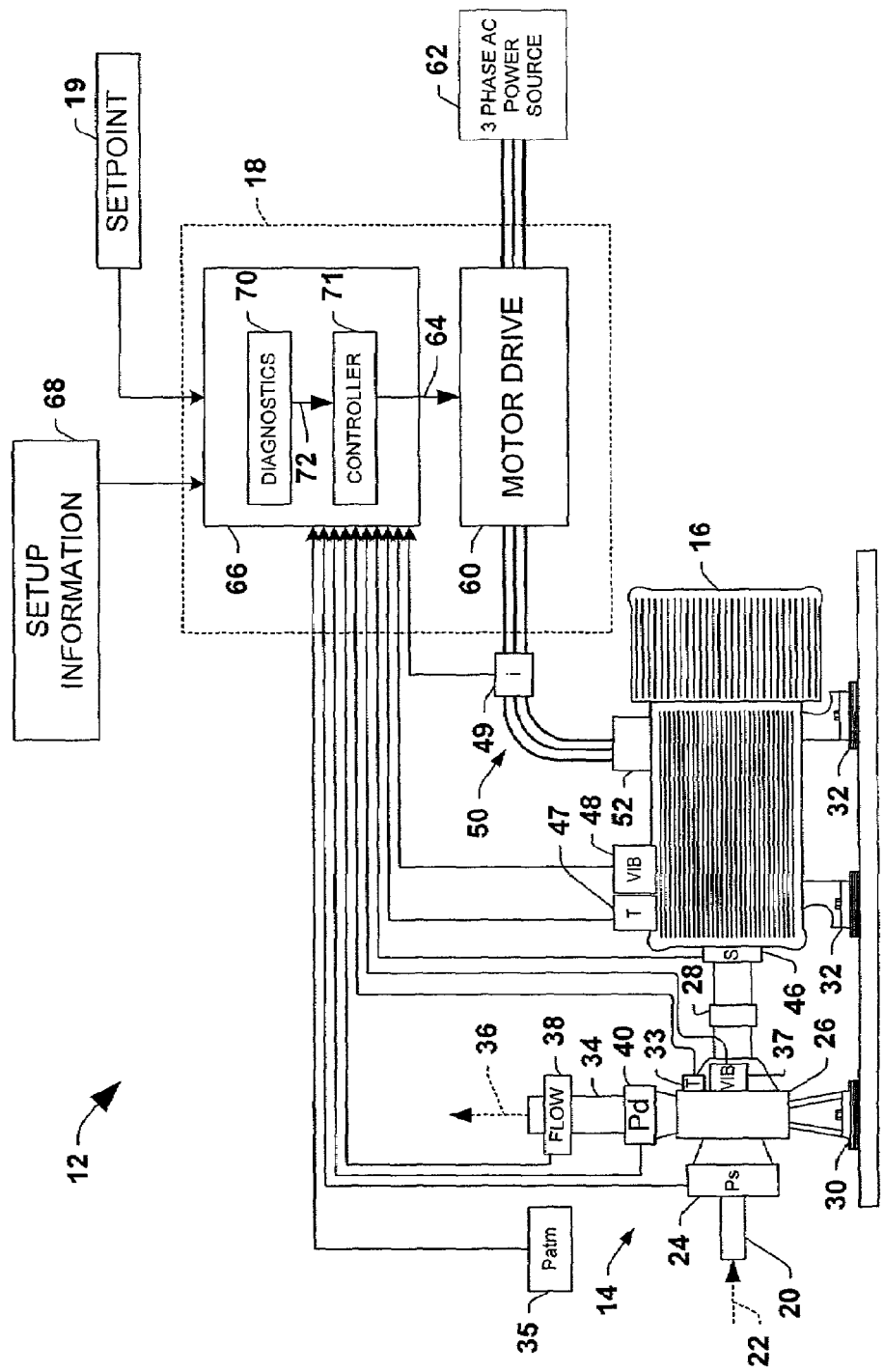
FIG. 2 is a side elevation view illustrating a motorized system having an exemplary diagnostics and control system in accordance with another aspect of the invention.
Figure 3:
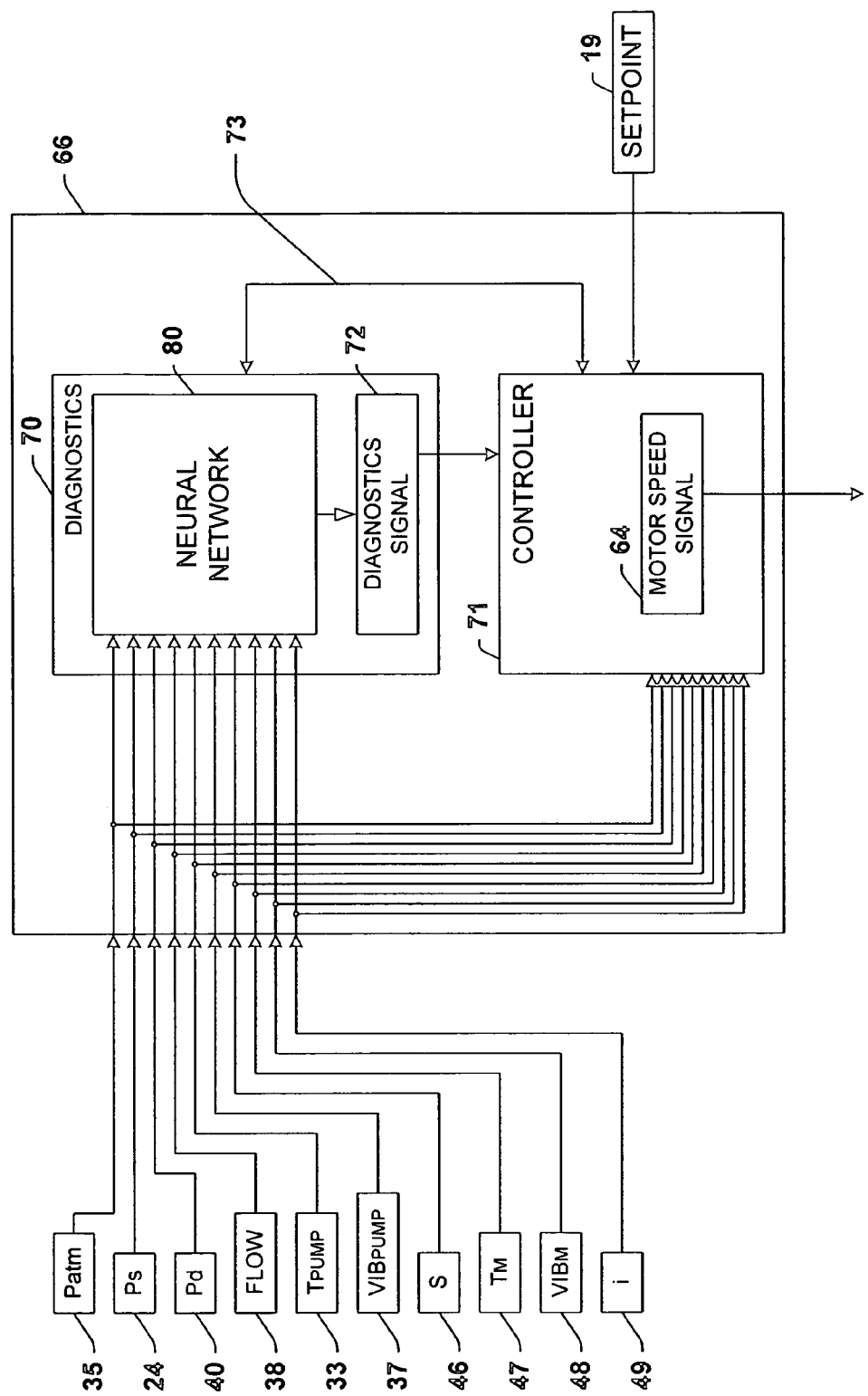
FIG. 3 is a schematic diagram illustrating an exemplary diagnostics system with a neural network in accordance with another aspect of the invention.
Figure 4:
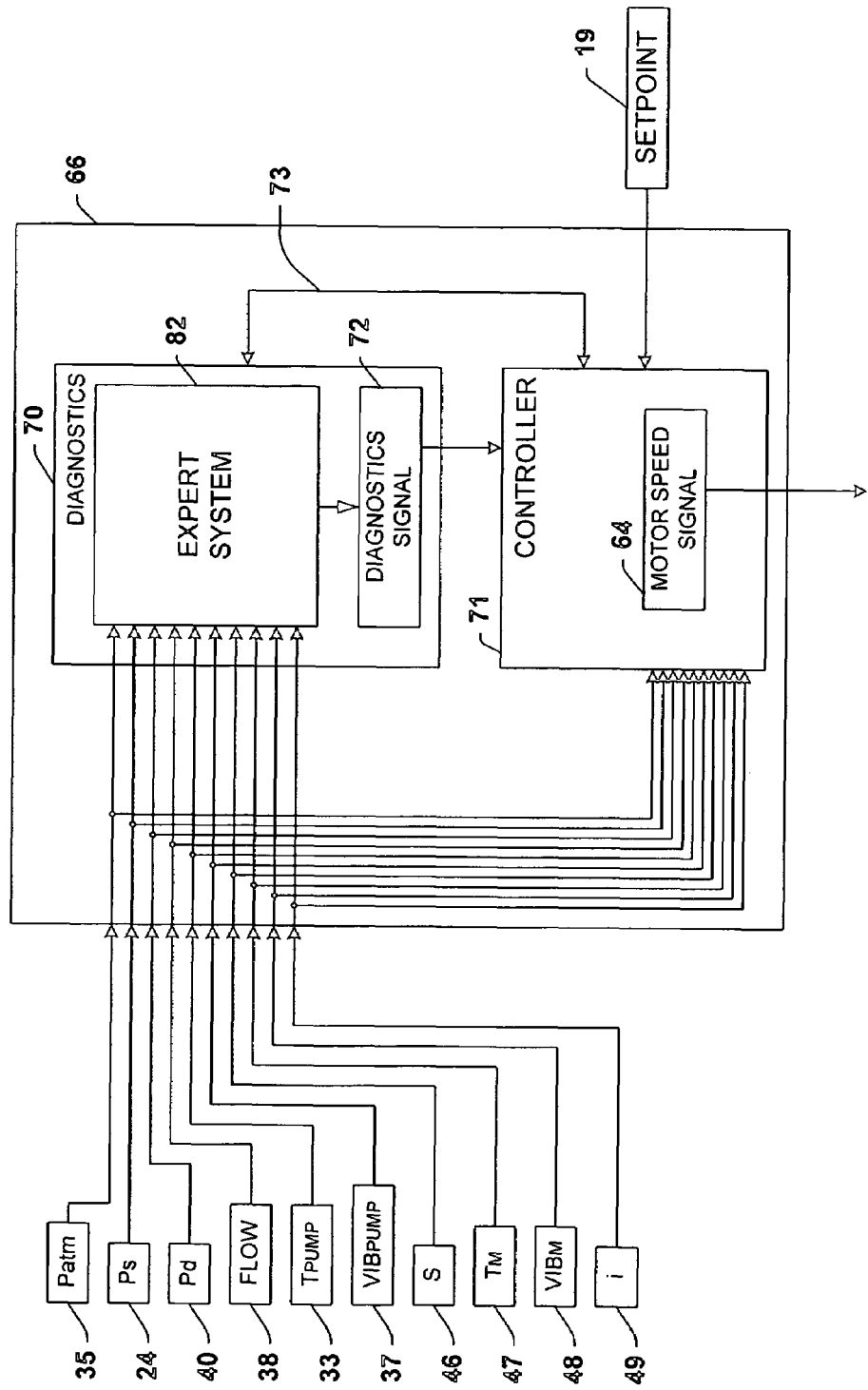
FIG. 4 is a schematic diagram illustrating another exemplary diagnostics system with an expert system in accordance with another aspect of the invention.
Figure 5:
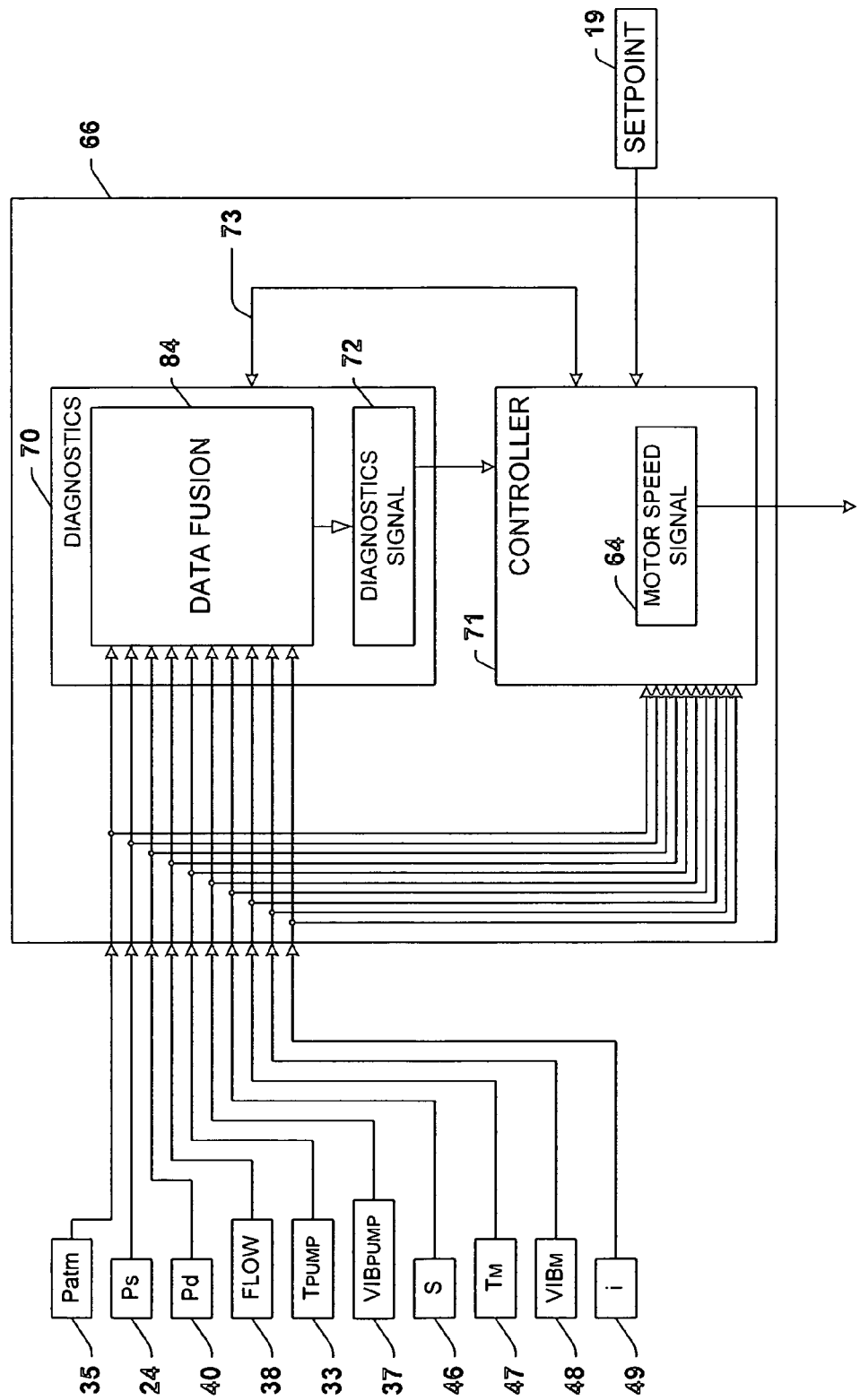
FIG. 5 is a schematic diagram illustrating another exemplary diagnostics system with a data fusion component in accordance with another aspect of the invention.

An exemplary motorized pumping system 12 is illustrated in FIG. 2 having a pump 14, a three-phase electric motor 16, and a control system 18 for operating the system 12 in accordance with a setpoint 19. Although the exemplary motor 16 is illustrated and described herein as a polyphase synchronous electric motor, the various aspects of the present invention may be employed in association with single-phase motors as well as with DC and other types of motors. In addition, while the exemplary pump 14 may comprise a centrifugal type pump, the invention finds application in association with other pump types not illustrated herein, for example, positive displacement pumps. The control system 18 operates the pump 14 via the motor 16 according to the setpoint 19 and one or more measured process variables, in order to maintain operation of the system 12 commensurate with the setpoint 19 and within the allowable process operating ranges specified in setup information 68. For example, it may be desired to provide a constant fluid flow, wherein the value of the setpoint 19 is a desired flow rate in gallons per minute (GPM) or other engineering units.

The pump 14 comprises an inlet opening 20 through which fluid is provided to the pump 14 in the direction of arrow 22 as well as a suction pressure sensor 24, which senses the inlet or suction pressure at the inlet 20 and provides a corresponding suction pressure signal to the control system 18. Fluid is provided from the inlet 20 to an impeller housing 26 including an impeller (not shown), which rotates together with a rotary pump shaft coupled to the motor 16 via a coupling 28. The impeller housing 26 and the motor 16 are mounted in a fixed relationship with respect to one another via a pump mount 30, and motor mounts 32. The impeller with appropriate fin geometry rotates within the housing 26 so as to create a pressure differential between the inlet 20 and an outlet 34 of the pump. This causes fluid from the inlet 20 to flow out of the pump 14 via the outlet or discharge tube 34 in the direction of arrow 36. The flow rate of fluid through the outlet 34 is measured by a flow sensor 38, which provides a flow rate signal to the control system 18.

In addition, the discharge or outlet pressure is measured by a pressure sensor 40, which is operatively associated with the outlet 34 and provides a discharge pressure signal to the control system 18. It will be noted at this point that although one or more sensors (e.g., suction pressure sensor 24, discharge pressure sensor 40, outlet flow sensor 38, and others) are illustrated in the exemplary system 12 as being associated with and/or proximate to the pump 14, that such sensors may be located remote from the pump 14, and may be associated with other components in a process or system (not shown) in which the pump system 12 is employed. Alternatively, flow may be approximated rather than measured by utilizing pressure differential information, pump speed, fluid properties, and pump geometry information or a pump model.

Alternatively or in combination, inlet and/or discharge pressure values may be estimated according to other sensor signals and pump/process information. The system 12 further includes an atmospheric pressure sensor 31, a pump temperature sensor 33 (e.g., thermocouple, RTD, etc.), and a vibration sensor 37 (e.g., accelerometer or the like), providing atmospheric pressure, pump temperature, and pump vibration signals, respectively, to the control system 18. The invention finds application in association with motorized systems having fewer, more, or different combinations of sensors, apart from the sensors illustrated and described herein, wherein sensors providing signals indicative of other system variables may be employed in order to diagnose and control a motorized system in accordance with the present invention.

In addition, it will be appreciated that while the motor drive 60 is illustrated in the control system 18 as separate from the motor 16 and from an exemplary diagnostics and control system 66, that some or all of these components may be integrated. Thus, for example, an integrated, intelligent motor may include the motor 16, the motor drive 60 and the diagnostics and control system 66. Furthermore, the motor 16 and the pump 14 may be integrated into a single unit (e.g., having a common shaft wherein no coupling 28 is required), with or without integral control system (e.g., control system 18, comprising the motor drive 60 and the diagnostics and control system 66) in accordance with the invention.

The control system 18 further receives process variable measurement signals relating to motor (pump) rotational speed, motor temperature, and motor vibration via a speed sensor 46, a motor temperature sensor 47, and a motor vibration sensor 48, respectively. As illustrated and described further hereinafter, a diagnostics system 70 within the diagnostics and control system 66 may advantageously detect and/or diagnose actual or anticipated wear, degradation, failure, and/or faults associated with components of the motorized system 12 (e.g., and/or of components in a larger system of which the motorized system 12 is a part) as well as other system performance conditions, such as cavitation, blockage, or the like.

For instance, the diagnostics system 70 may advantageously be employed in order to detect and/or diagnose cavitation in the pump 14 using a neural network classifier receiving suction and discharge pressure signals from sensors 24 and 40, respectively, as well as flow and pump speed signals from the flow and speed sensors 38 and 46. The motor 16 provides rotation of the impeller of the pump 14 according to three-phase alternating current (AC) electrical power provided from the control system via power cables 50 and a junction box 52 on the housing of the motor 16. The power to the pump 14 may be determined by measuring the current provided to the motor 16 via a current sensor 49 and computing pump power based on current, speed, and motor model information. This may alternatively or in combination be measured and computed by a power sensor (not shown), which provides a signal related thereto to the control system 18. Furthermore, the motor drive 60 may provide motor current, voltage, and/or torque information to the diagnostics and control system 66, for example, wherein pump input power information may be calculated according to the torque and possibly speed information.

The control system 18 also comprises a motor drive 60 providing three-phase electric power from an AC power source 62 to the motor 16 via the cables 50 in a controlled fashion (e.g., at a controlled frequency and amplitude) in accordance with a control signal 64 from the diagnostics and control system 66. The diagnostics and control system 66 receives the process variable measurement signals from the suction pressure sensor 24, the discharge pressure sensor 40, the flow sensor 38, and the speed sensor 46, together with the setpoint 19 and/or other sensor signals, and provides the control signal 64 to the motor drive 60 in order to operate the pump system 12 commensurate with the setpoint 19 and/or a diagnostics signal 72 from a diagnostics system 70.

In this regard, the diagnostics and control system 66 may be adapted to control the system 12 to maintain a desired fluid flow rate, outlet pressure, motor (pump) speed, torque, suction pressure, or other performance characteristic. Setup information 68 may be provided to the diagnostics and control system 66, which may include operating limits (e.g., min/max speeds, min/max flows, min/max pump power levels, min/max pressures allowed, NPSHR values, and the like), such as are appropriate for a given pump 14, motor 16, and piping and process conditions.

The diagnostics and control system 66 comprises a diagnostics system 70, which is adapted to detect and/or diagnose cavitation in the pump 14, according to an aspect of the invention. Furthermore, the diagnostics and control system 66 selectively provides the control signal 64 to the motor drive 60 via a controller component 71 (e.g., which may implement one or more control strategies, such as proportional, integral, derivative (PID) control, or the like) according to the setpoint 19 (e.g., in order to maintain or regulate a desired flow rate) and/or a diagnostics signal 72 from the diagnostics system 70 according to detected cavitation in the pump, whereby operation of the pumping system 12 may be changed or modified according to the diagnostics signal 72. The diagnostics system 70 as well as the controller 71 may be implemented in hardware, software, and/or combinations thereof according to appropriate coding techniques in order to implement the various aspects of the present invention.

The diagnostics system 70 may detect the existence of one or more actual or anticipated conditions associated with the pump system 12, such as system component wear, degradation, failures, faults, or the like. In addition, the diagnostics system 70 may detect and diagnose process conditions associated with the system 12. For instance, the diagnostics system 70 may identify or detect cavitation in the pump 14, and additionally diagnose the extent of such cavitation according to pressure and flow data from the sensors 24, 40, and 38 (e.g., and pump speed data from the sensor 46), or alternatively from current information from sensor 49, whereby the diagnostics signal 72 is indicative of the existence and extent of cavitation in pump 14.

Referring also to FIGS. 3-6, the diagnostics system 70 may comprise a neural network 80, an expert system 82, a data fusion component 84, and/or a fast Fourier transform (FFT) system 86 for generating a frequency spectrum 88, in order to provide the diagnostics signal 72 according to one or more measured system attributes (e.g., via signals from the sensors 24, 33, 35, 37, 38, 40, 46, 47, 48, and/or 49). The measured attributes may also be provided to the controller 71 from one or more of the sensors 24, 33, 35, 37, 38, 40, 46, 47, 48, and/or 49 for performing closed loop control of the system 12 in accordance with the setpoint 19 and/or the diagnostics signal 72. Although the aspects of the invention are described hereinafter within the context of employing a neural network 80, it is to be appreciated the invention may employ other nonlinear training systems/methodologies, for example, backpropagation, Baysian, Fuzzy Set, Non Linear regression, or other neural network paradigms including mixture of experts, cerebellar model arithmetic computer (CMACS), Radial Basis Functions, directed search networks, and functional link nets.

The diagnostics and control system 66 thus comprises the controller 71 operatively associated with the motorized system 12 to operate the system 12 in a controlled fashion via the control signal 64 to the motor drive 60, as well as the diagnostics system 70 operatively associated with the motorized system 12 and adapted to diagnose the health thereof according to one or more measured attributes (e.g., vibration, pressure, current, speed, and/or temperature), such as the signals from sensors 24, 33, 35, 37, 38, 40, 46, 47, 48, and/or 49 in accordance with the present invention. The diagnostics system 70 may further utilize a feedback loop 73 from the controller 71 to further assesses the health of the motorized system 12. It will be noted at this point that although the exemplary motorized system 12 includes a pump 14, that the diagnostics and control system 66 may be employed in association with other motorized systems (not shown) having a motor and a load, including but not limited to valve, pump, conveyor roller, fan, compressor, and/or gearbox type loads.

In accordance with the invention, the diagnostics system 70 provides diagnostics signal 72 according to the health of the system 12 and/or components therein (e.g., motor 16, drive 60, pump 14), wherein the controller 71 may advantageously provide control signal 64 to the drive 60 according to the setpoint 19 and/or the diagnostics signal 72. As another application, the measured attribute or attributes may comprise vibration signals obtained from one or both of the sensors 37 and 48, and/or from other vibration sensors (e.g., accelerometers) associated with the motor 16 or the pump 14. For instance, the diagnostics system 70 may obtain one or more motor vibration signals (e.g., from sensor 48), and diagnose the health of one or more motor bearings, motor shaft alignment (e.g., axial and/or angular alignment of the motor 16 with the pump 14 and/or misalignment thereof), and/or of the motor mounting (e.g., via motor mounts 32) according to the measured vibration.

The diagnostics system 70 in this regard, may be adapted to perform frequency spectral analysis of the measured vibration signal from sensor 48. Such spectral analysis may be performed, for example, via one or more of the neural network 80 and the expert system 82, where the diagnostics signal 72 indicates the health of the motorized system 12 according to frequency spectral analysis of the measured vibration signal. Alternatively or in combination, the diagnostics system 70 may employ the data fusion system 84 in order to derive one or more vibration signals from at least one sensor associated with the motorized system 12. Thus, for example, where the vibration sensors 37 and/or 48 are inoperative, data fusion techniques may be employed in accordance with the invention, to derive vibration information from other available system signals, such as via the current sensor 49.

The present invention may thus employ data fusion in situations in order to take advantage of information fission which may be inherent to a process (e.g., vibration in the motor 16) relating to sensing a physical environment through several different sensor modalities. In particular, one or more available sensing elements (e.g., sensors 24, 33, 35, 37, 38, 40, 46, 47, 48, and/or 49) may provide a unique window into the physical environment where the phenomena to be observed is occurring (e.g., in the motorized system 12 and/or in a system of which the motorized pumping system 12 is a part). Because the complete details of the phenomena being studied (e.g., detecting the operating state of the system 12 or components thereof) may not be contained within a single sensing element window, there is information fragmentation which results from this fission process. These information fragments associated with the various sensing devices may include both independent and dependent components.

The independent components may be used to further fill out (or span) the information space and the dependent components may be employed in combination to improve the quality of common information recognizing that all sensor data may be subject to error and/or noise. In this context, data fusion techniques employed in the data fusion system 84 may include algorithmic processing of sensor data (e.g., from one or more of the sensors 24, 33, 35, 37, 38, 40, 46, 47, 48, and/or 49) in order to compensate for the inherent fragmentation of information because a particular phenomena may not be observed directly using a single sensing element. Thus, the data fusion system 84 provides a suitable framework to facilitate condensing, combining, evaluating and interpreting the available sensed information in the context of the particular application. It will further be appreciated that the data fusion system 84 may be employed in the diagnostics and control system 66 in order to employ available sensors to infer or derive attribute information not directly measurable, or in the event of sensor failure.

Figure 6:
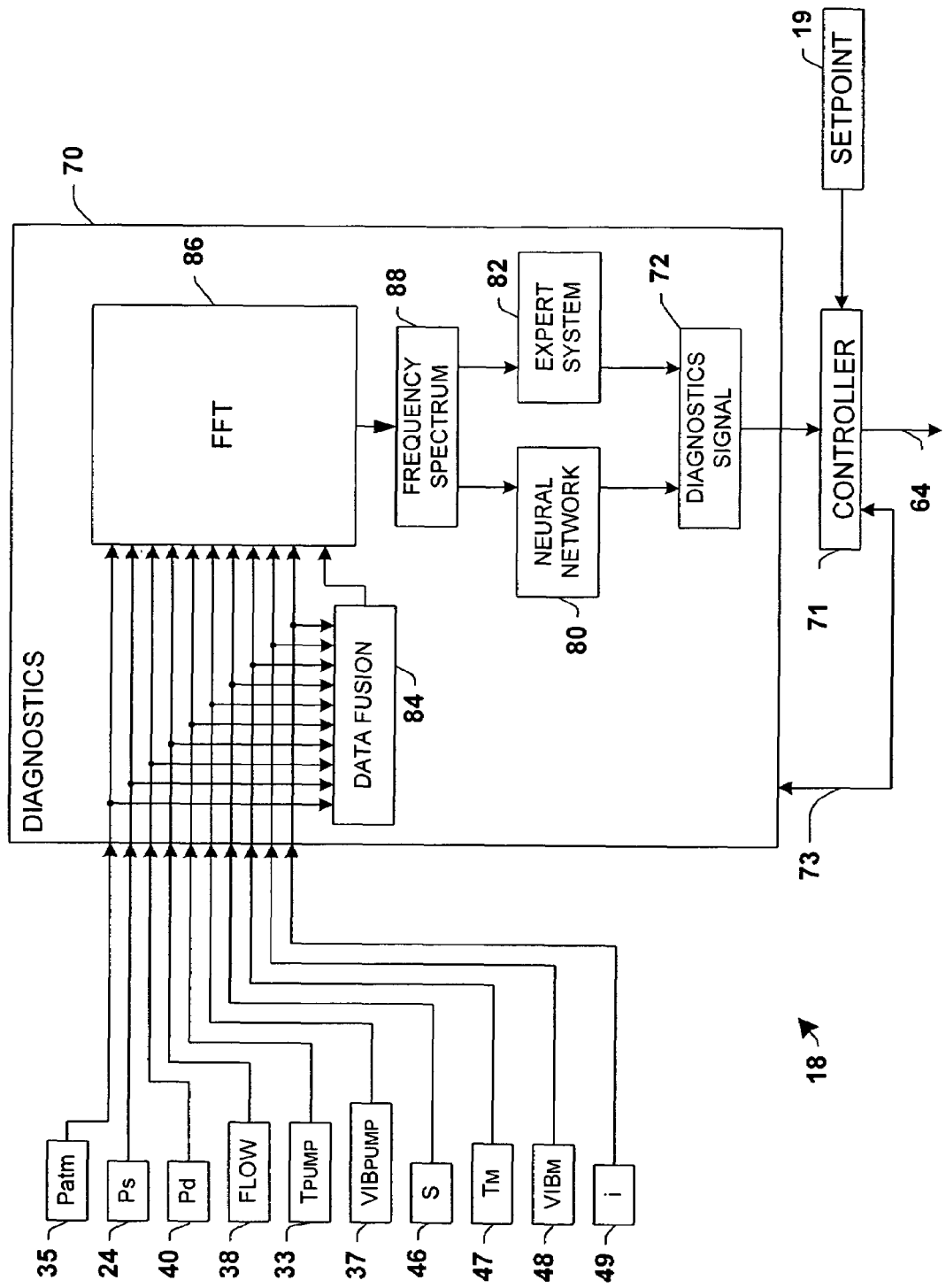
FIG. 6 is a schematic diagram illustrating another exemplary diagnostics system with a data fusion component, and neural network, and an expert system in accordance with another aspect of the invention.

Thus, the present invention provides a data fusion framework and algorithms to facilitate condensing, combining, evaluating and interpreting various sensed data. The present invention also facilitates establishing a health state of a system employing the diagnostics and control system 66, as well as for predicting or anticipating a future state of the system 12 (e.g., and/or of a larger system of which the motorized pump system 12 is a part). As illustrated in FIG. 6, the data fusion system 84 may be employed to derive system attribute information relating to any number of attributes according to measured attribute information (e.g., from the sensors 24, 33, 35, 37, 38, 40, 46, 47, 48, and/or 49) in accordance with the present invention. In this regard, the available attribute information may be employed by the data fusion system to derive attributes related to failed sensors, and/or to other performance characteristics of the system 12 for which sensors are not available. Such attribute information derived via the data fusion system 84 may be employed in generating the diagnostics signal 72, and/or in performing control functions in the controller 71.

In another example, the measured attributes may comprise flow and pressure signals obtained from sensors 24, 38, and/or 40 associated with the pump 14, wherein the diagnostics system 70 provides the diagnostics signal 72 indicative of pump cavitation according to the measured flow and pressure signals. The invention thus provides for health indications relating to component conditions (e.g., wear, degradation, faults, failures, etc.), as well as those relating to process or systems conditions, such as cavitation in the pump 14. The diagnostics system 70 may comprise a classifier system, such as the neural network 80, detecting pump cavitation according to the measured flow and pressure signals, which may be provided as inputs to the neural network 80. The cavitation indication in the resulting diagnostics signal 72 may further be employed to modify operation of the system 12, for example, in order to reduce and/or avoid such cavitation. Thus, an appropriate control signal 64 may be provided by the controller 71 to the motor drive 60 in order to avoid anticipated cavitation, based on the diagnostics signal 72 (e.g., and/or the setpoint 19), whereby the service lifetime of one or more system components (e.g., pump 14) may be extended.

In another related example, cavitation (e.g., actual or suspected) in the pump 14 may be detected via measured (e.g., or derived) current signal measurements, for example, via the sensor 49. The diagnostics system 70 in this instance may provide a diagnostics signal 72 indicative of pump cavitation according to the measured current. In order to detect cavitation using such current information, the diagnostics system 70 may employ the neural network 80 to synthesize a change in condition signal from the measured current. In addition, the diagnostics system 70 may further comprise a preprocessing portion (not shown) operatively coupled to the neural network 80, which conditions the measured current prior to inputting the current into the neural network 80, as well as a post processing portion operatively coupled to the neural network 80 to determine whether the change in condition signal is due to a fault condition related to the motorized system 12. In this regard, the post processing portion may comprise a fuzzy rule based expert system, such as system 82. In addition, the diagnostics system 70 may detect one or more faults relating to the operation of the pump 14 and/or one or more faults relating to the operation of the motor 16 driving the pump 14 according to the measured current.

Other faults may be detected and diagnosed using the diagnostics and control system 66 of the invention. For instance, the diagnostics system 70 may be adapted to obtain a space vector angular fluctuation from a current signal (e.g., from the current sensor 49) relating to operation of the motor 16, and further to analyze the space vector angular fluctuation in order to detect at least one fault in the motorized system 12. Such faults may include, for example, stator faults, rotor faults, and/or an imbalance condition in the power applied to the motor 16 in the motorized system 12

In this situation, the diagnostics system 70 may obtain a current signal associated with the motor 16 from sensor 49, and calculate a space vector from the current signal. The diagnostics system 70 determines a space vector angular fluctuation from the space vector, and analyzes the space vector angular fluctuation in order to detect one or more faults associated with the motor 16. For instance, first, second, and third phase current signals associated with the motorized system 12 may be sampled in order to obtain the current signal, and corresponding first, second, and third phase space vectors may be computed in the diagnostics system 70.

A resulting space vector may then be calculated, for example, by summing the first, second, and third phase space vectors. The diagnostics system 70 may then compare the space vector with a reference space vector, wherein the reference space vector is a function of a constant frequency and amplitude, and compute angular fluctuations in the space vector according to the comparison, in order to determine the space vector angular fluctuation. The diagnostics system 70 then performs frequency spectrum analysis (e.g., using the FFT component 86) of the space vector angular fluctuation to detect faults associated with the motorized system 12. For example, motor faults such as rotor faults, stator faults, and/or unbalanced supply power associated with the pump motor 16 may be ascertained by analyzing the amplitude of a first spectral component of the frequency spectrum at a first frequency, wherein the diagnostics system 70 may detect fluctuations in amplitude of the first spectral component in order to detect one or more faults or other adverse conditions associated with the motorized system 12.

In this regard, certain frequencies may comprise fault related information, such as where the first frequency is approximately twice the frequency of power applied to the motor 16. Alternative to generating a full spectrum, the diagnostics system 70 may advantageously employ a Goertzel algorithm to extract the amplitude of the first spectral component in order to analyze the amplitude of the first spectral component. The diagnostics signal 72 indicating such motor faults may then be employed by the controller 71 to modify operation of the pumping system 12 to reduce or mitigate such faults.

Figure 7:
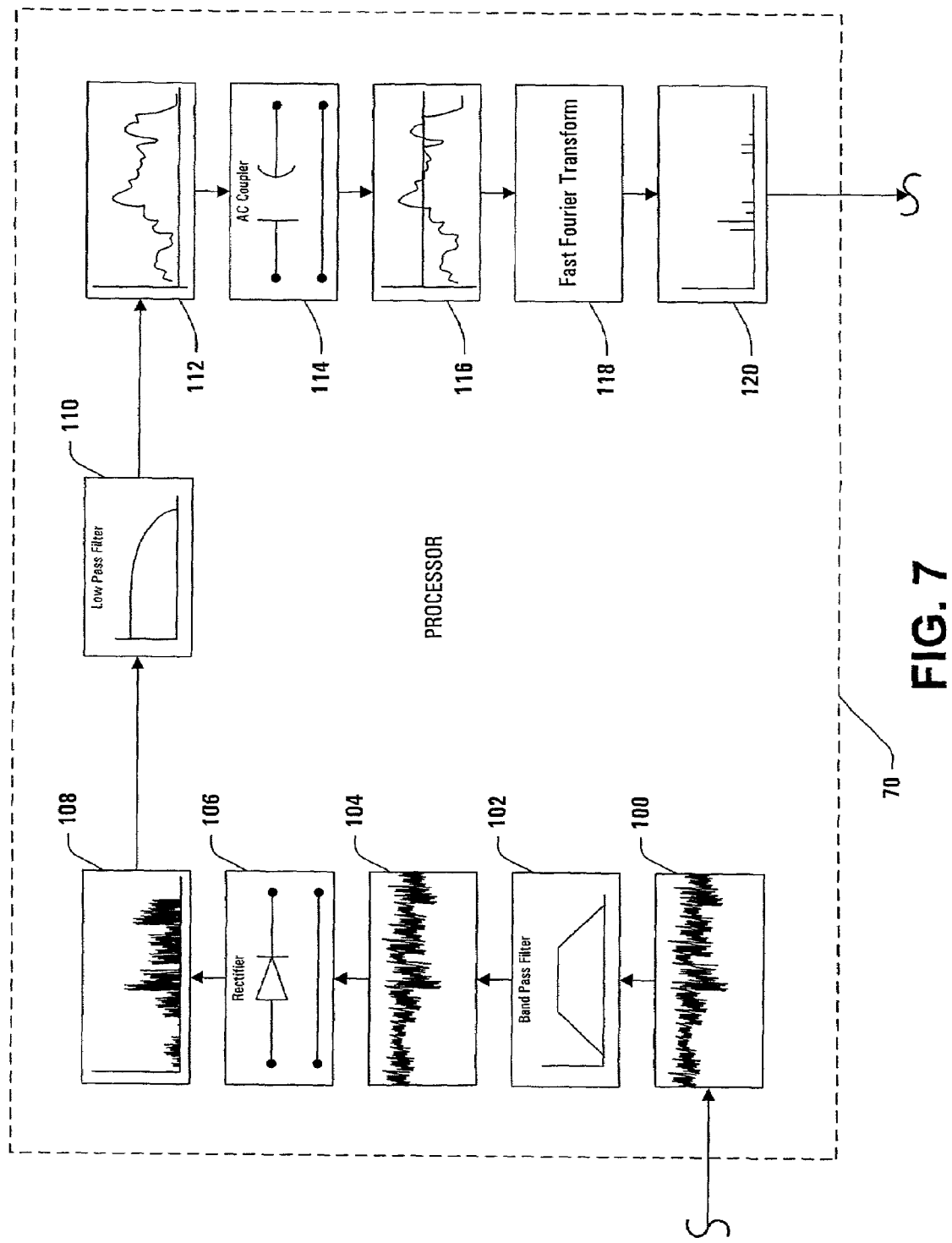
FIG. 7 is schematic flow diagram illustrating a portion of an exemplary diagnostics system in accordance with the invention.

Referring now to FIG. 7, the processing performed on vibration and other sampled data from one or more of the system sensors 24, 33, 35, 37, 38, 40, 46, 47, 48, and/or 49 in the diagnostics system 70 may comprise demodulation. One demodulation technique, sometimes referred to as enveloping, may be performed by the system 70 in order to synthesize sampled digital attribute data 100 into a form usable for detecting and diagnosing component degradation and process conditions in the system 12. The demodulation is illustrated in FIG. 7 in association with vibration data (e.g., from one of the sensors 37 or 48). The digital vibration data 100 enters the diagnostics system 70 and passes through a band pass filter 102, which removes frequencies outside the scope of interest and within the dynamic range of the system 70 to form a filtered signal 104.

The filtered signal 104 passes through a rectifier 106, for example a diode, which forms a rectified signal 108. The rectified signal 108 passes through a low pass filter 110 which removes the high frequencies to form a relatively low frequency signal 112. The low frequency signal 112 is passed through a capacitor 114 to produce a demodulated signal 116. A fast Fourier transform (FFT) is performed on the demodulated signal 116 by FFT operator 118 (e.g., such as FFT component 86 of FIG. 6) in order to produce a vibration spectrum 120, for example, using commercially available fast Fourier transform software such as MATLAB by The Math Works. The FFTs of the vibration signal data are discretized over N number of points to facilitate processing, such as where N=2,048, however, it will be appreciated that the FFTs of each signal may be discretized over any suitable number of such points. The vibration spectrum 120 may then be analyzed by a host processor in the control system 18 in order to determine the health of the motor 16 or other component in the motorized system 12.

Although the demodulation has been described with respect to obtaining FFTs of vibration or other signals, other suitable techniques may be employed. For example, wavelet transforms may be taken of the sensor data. One advantage to using the wavelet transform is that the total size of the transform is a compact representation of the original signal and will require considerably less storage space than the original signal. Alternatively, where particular spectral components are of interest, techniques such as the Goertzel algorithm may be used to obtain such components without the need to generate an entire frequency spectrum. Furthermore, such spectral analysis of vibration data to detect and diagnose bearing faults, may further take into consideration motor (e.g., pump) speed information (e.g., from sensor 46 in order to suitably interpret the FFT and detect defects and isolate particular bearing faults.

Figure 8:
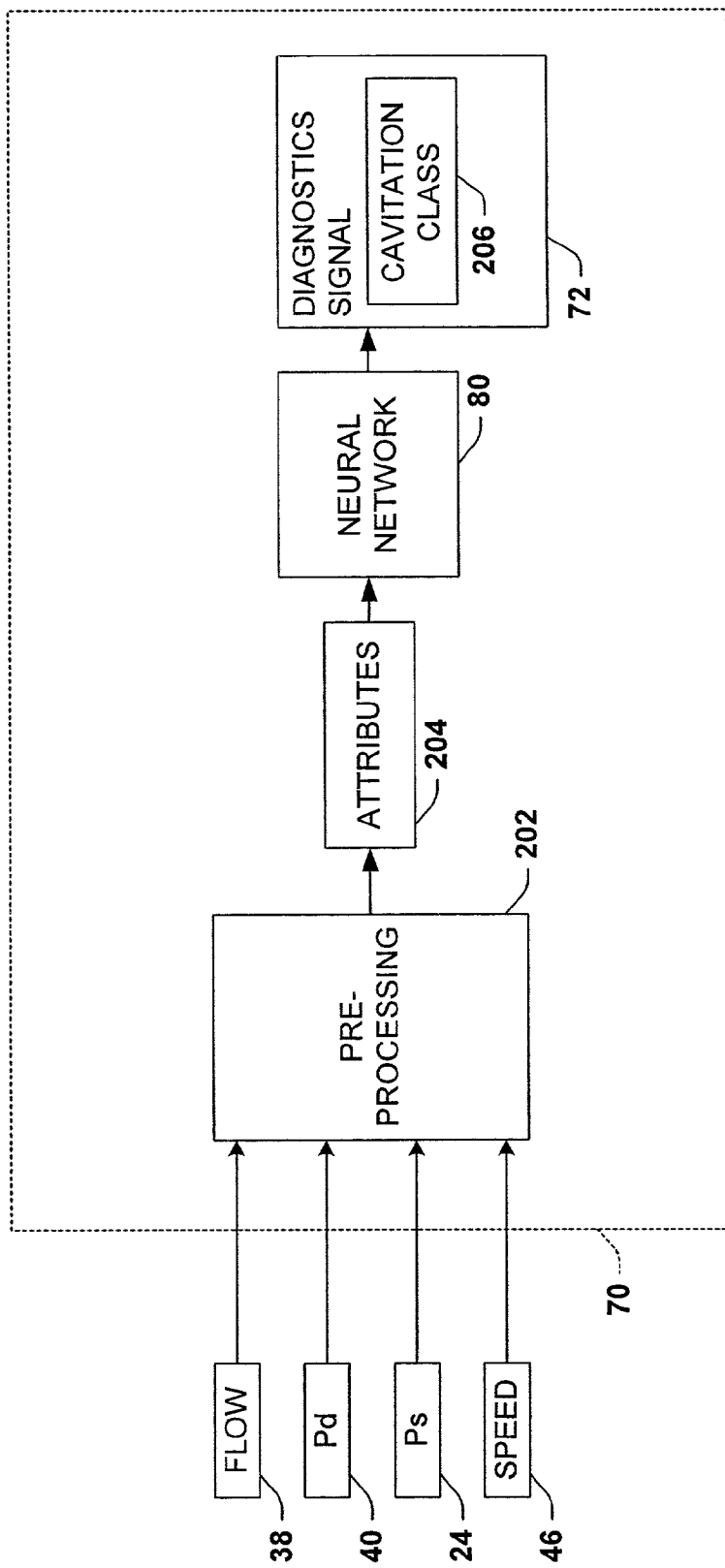
FIG. 8 is a schematic diagram further illustrating the exemplary diagnostics system of FIG. 7.

Referring also to FIG. 8, the diagnostics system 70 may further comprise a pre-processing component 202 receiving pressure and flow data from the sensors 24, 40, and 38, respectively, which provides one or more attributes 204 to the neural network 80, wherein the attributes 204 may represent information relevant to cavitation in the pump 14. The attributes 204 may be extracted from the measured pressure, flow, and/or speed values associated with the pumping system 12, and used to characterize pump cavitation by the neural network 80. The neural network 80, in turn, generates a diagnostics signal 72 which may comprise a cavitation classification 206 according to another aspect of the invention. The neural network classifier 80 thus evaluates data measured in the motorized pumping system 12 (e.g., represented by the attributes 204) and produces a diagnosis (e.g., diagnostics signal 72) assessing the presence and severity of cavitation in the system 12. The neural network 80 in this regard, may employ one or more algorithms, such as a multi-layer perception (MLP) algorithm in assessing pump cavitation.

As illustrated further in FIG. 9, the diagnostics signal 72 output by the classifier neural network 80 is indicative of both the existence and the extent of cavitation in the pumping system 12. For instance, the exemplary signal 72 comprises a classification 206 of pump cavitation having one of a plurality of class values, such as 0, 1, 2, 3, and 4. In the exemplary classification 206 of FIG. 9, each of the class values is indicative of the extent of cavitation in the pumping system 12, wherein class 0 indicates that no cavitation exists in the pumping system 12. The invention thus provides for detection of the existence of cavitation (e.g., via the indication of class values of 1 through 4 in the diagnostics signal 72), as well as for diagnosis of the extent of such detected cavitation, via the employment of the neural network classifier 80 in the diagnostics system 70.

Figure 10:
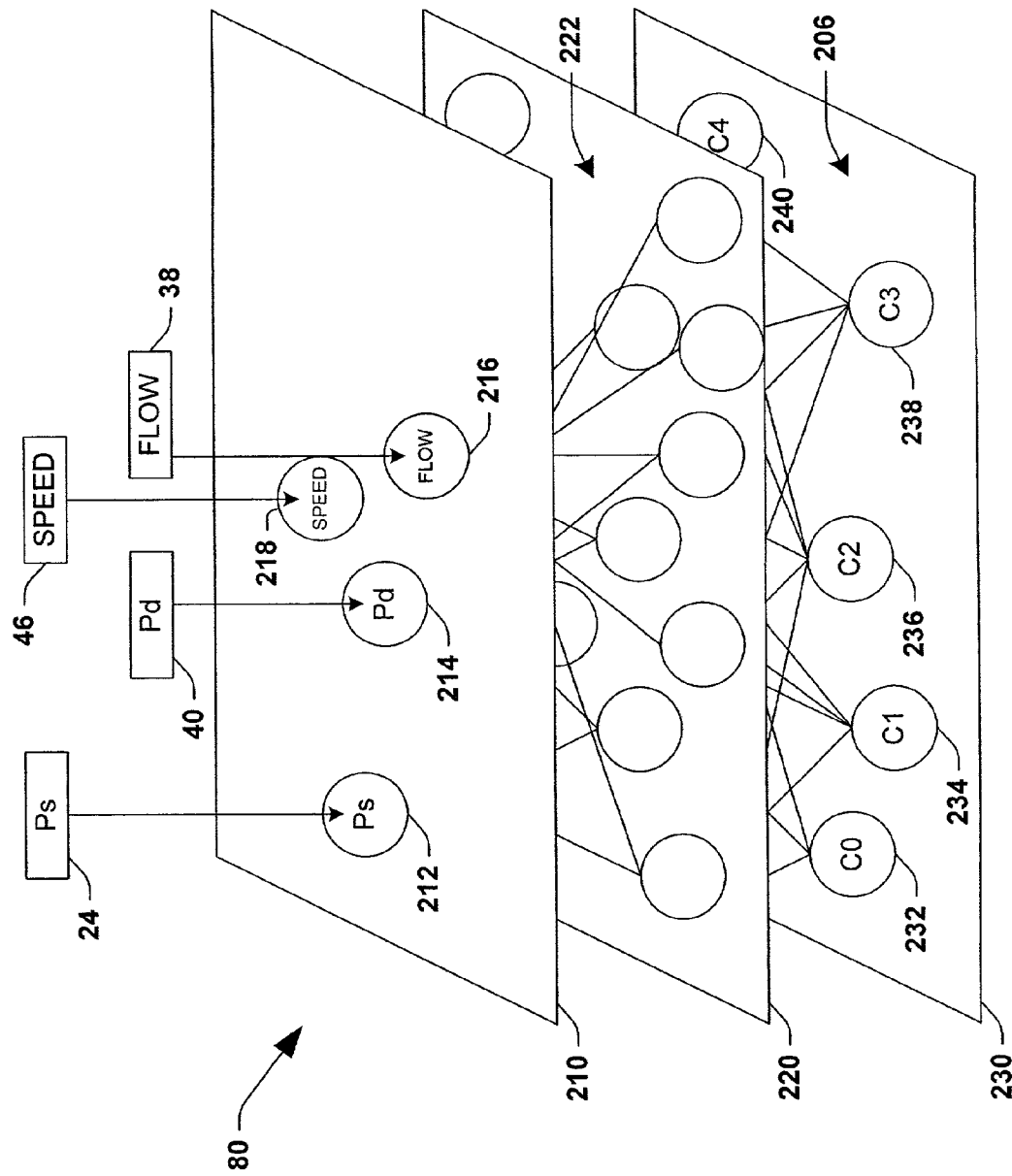
FIG. 10 is a perspective schematic diagram illustrating an exemplary neural network in accordance with another aspect of the invention.

Referring now to FIG. 10, an exemplary neural network 80 comprises an input layer 210 having neurons 212, 214, 216, and 218 corresponding to the suction pressure, discharge pressure, flow rate, and pump speed signals, respectively, received from the sensors 24, 40, 38, and 46 of the pumping system 12. One or more intermediate or hidden layers 220 are provided in the network 80, wherein any number of hidden layer neurons 222 may be provided therein. The neural network 80 further comprises an output layer 230 having a plurality of output neurons corresponding to the exemplary cavitation classification values of the class 206 illustrated and described hereinabove with respect to FIG. 9. Thus, for example, the output layer 230 may comprise output neurons 232, 234, 236, 238, and 240 corresponding to the class values 0, 1, 2, 3, and 4, respectively, whereby the neural network 80 may output a diagnostics signal (e.g., signal 72) indicative of the existence as well as the extent of cavitation in the pumping system (e.g., system 12) with which it is associated.

In this regard, the number, type, and configuration of the neurons in the hidden layer(s) 220 may be determined according to design principles known in the art for establishing neural networks. For instance, the number of neurons in the input and output layers 210 and 230, respectively, may be selected according to the number of attributes (e.g., pressures, flow, speed, etc.) associated with the system 70, and the number of cavitation classes 206. In addition, the number of layers, the number of component neurons thereof, the types of connections among neurons for different layers as well as among neurons within a layer, the manner in which neurons in the network 80 receive inputs and produce outputs, as well as the connection strengths between neurons may be determined according to a given application (e.g., motorized system) or according to other design considerations.

Accordingly, the invention contemplates neural networks having many hierarchical structures including those illustrated with respect to the exemplary network 80 of FIG. 10, as well as others not illustrated, such as resonance structures. In addition, the inter-layer connections of the network 80 may comprise fully connected, partially connected, feed-forward, bi-directional, recurrent, and off-center or off surround interconnections. The exemplary neural network 80, moreover, may be trained according to a variety of techniques, including but not limited to unsupervised learning, reinforcement learning, and back propagation, wherein the learning may be performed on-line and/or off-line. Furthermore, the training of the network 80 may be accomplished according to any appropriate training laws or rules, including but not limited to Hebb's Rule, Hopfield Law, Delta Rule, Kohonen's Learning Law, and/or the like, in accordance with the present invention. In addition, although one or more aspects of the present invention are primarily described herein in the context of employing a neural network, it is to be appreciated the invention may employ other nonlinear training systems and/or methodologies (e.g., example, back-propagation, Baysian, Fuzzy Set, Non Linear regression, or other neural network paradigms including mixture of experts, cerebellar model arithmetic computer (CMACS), Radial Basis Functions, directed search networks, functional link nets, and the like).

Figure 11:
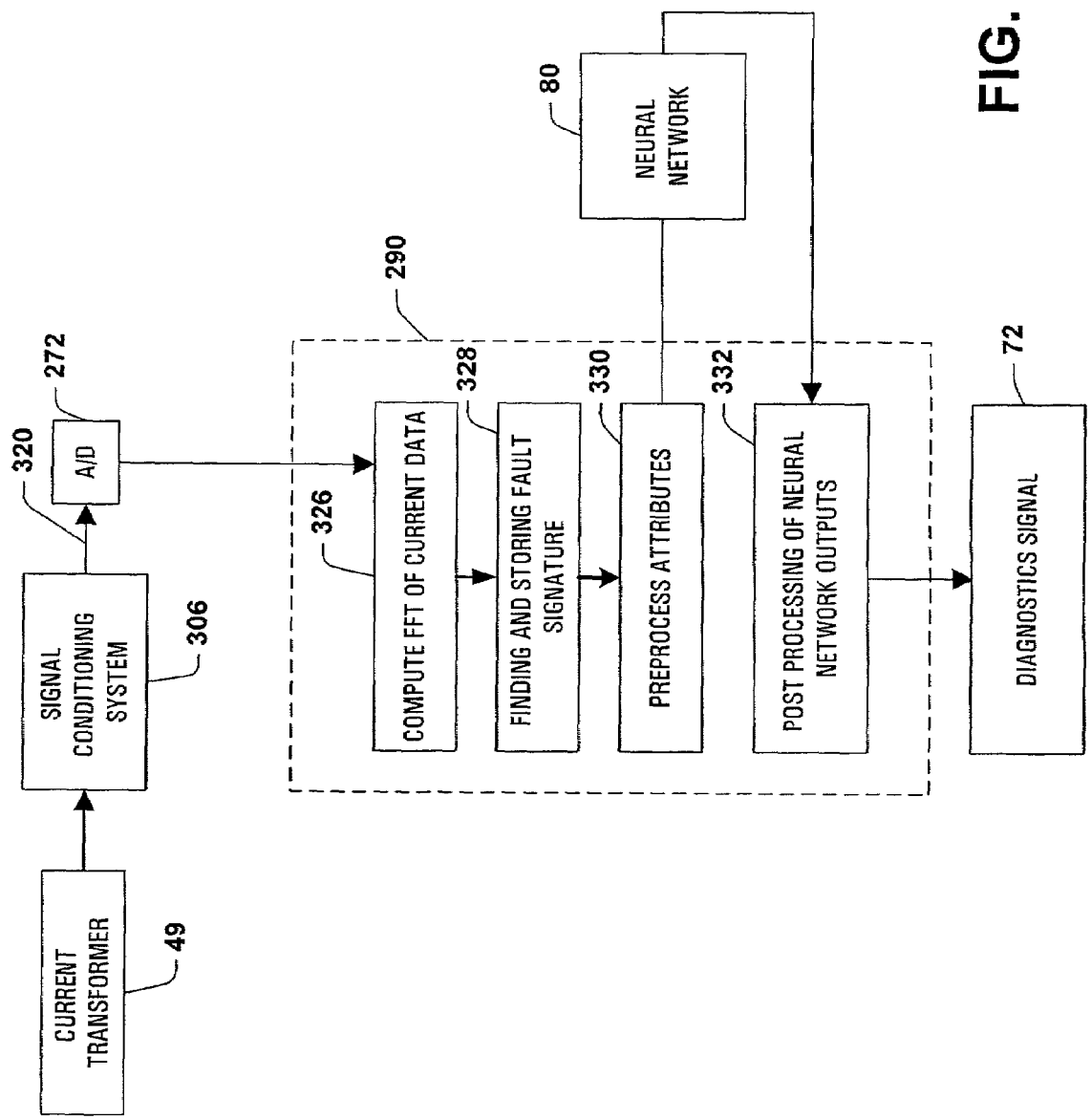
FIG. 11 is a function block diagram illustrating the diagnostics and control system in accordance with the present invention.

Referring now to FIG. 11, the diagnostic system 70 may further perform one or more types of signal conditioning on the measured attribute signals from the system sensors 24, 33, 35, 37, 38, 40, 46, 47, 48, and/or 49. As an example, one or more motor currents may be sampled, for example, from the sensor 49, and processed accordingly, in order to detect and/or diagnose cavitation conditions in the pump 14. In this regard, the current sensor 49 may comprise a current transformer providing a current signal to a signal conditioning system 306, which in turn provides a conditioned current signal 320 to an analog to digital (A/D) converter 272. Thereafter, a digitized current signal is provided from the A/D 272 to a processor 290 in the diagnostics and control system 66 for further processing, as illustrated in FIG. 11.

FIG. 11 illustrates the functional events or acts that the current data from the motor 16 driving the pump 14 is subjected to for pump condition diagnostics. After the current data from current transformer 49 is conditioned by signal conditioning circuit 306, it is converted from analog data to digital data by the A/D converter 272, so that it can be further processed by processor 290. Processor 290 first performs the acts of computing Fast Fourier Transforms 326 of the current data. The processor 290 controls the signal sampling and digitizing rate as well as any buffering of the digitized signals that might be needed. This data collection rate should be selected to provide sufficient data upon which the processor 290 can generate a comprehensive frequency spectrum of the motor current signal suitable for analysis using commercially available Fast Fourier Transform software, such as for example MATLAB by The Math Works.

Figure 13:
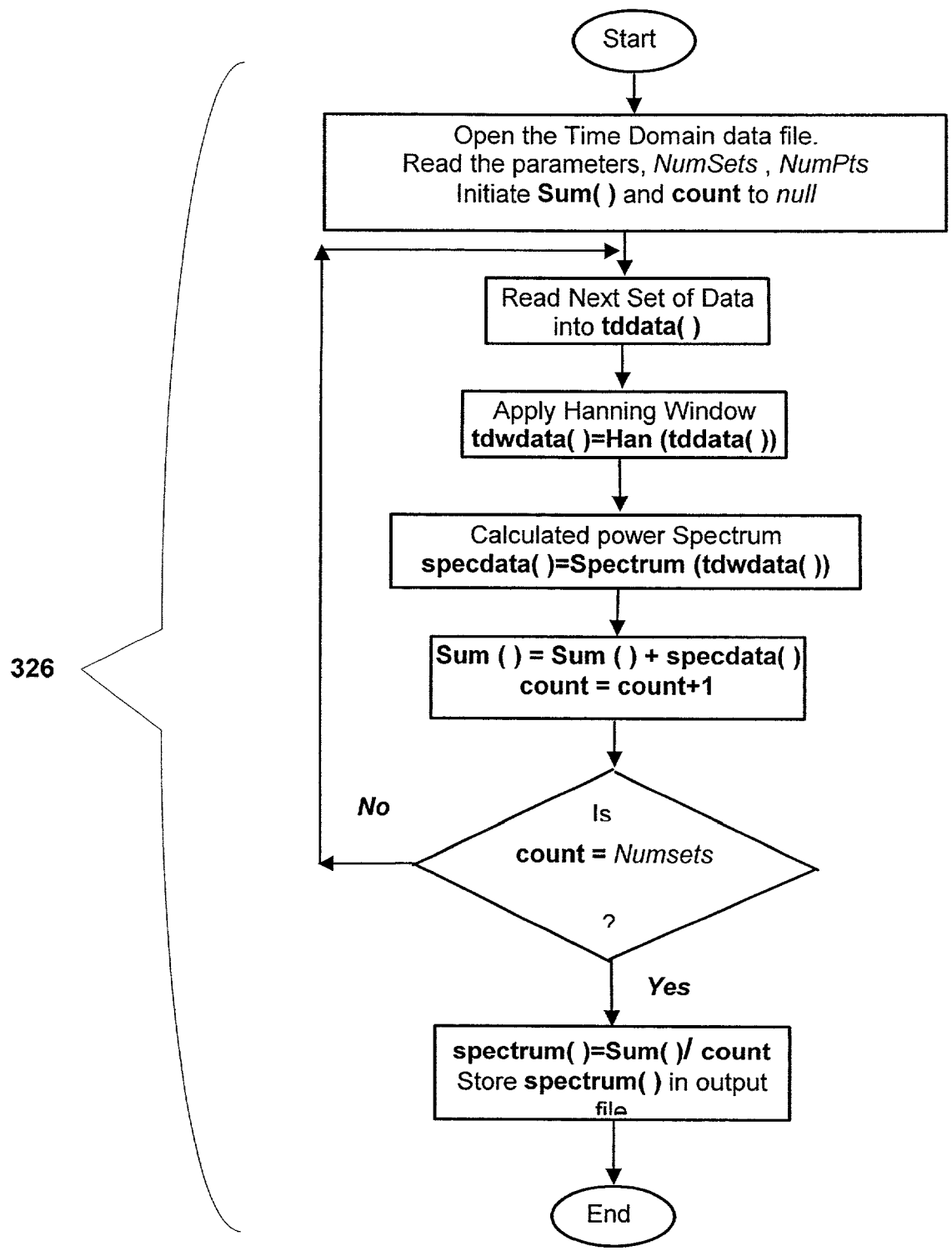
FIG. 13 is a flow diagram for performing a Fast Fourier Transformation on a conditioned signal received from a motor in accordance with the present invention.

The spectral analysis basically involves the application of a 'Hanning Window' to the time-domain data, calculation of power spectrum from each set of the windowed time-domain data for the specified number of sets, and then finding the average spectrum using the Welch method. A flow chart of the general scheme is shown in FIG. 13. The output spectra corresponding to the A/D current signal, is stored into a designated output file for future use. The parameters for the A/D data acquisition, such as the number of sets (NumSets), number of samples per set (NumPts) and the sampling rate are selected to be 8, 8192 and 4096 Samples/sec respectively, however it will be appreciated that any appropriate values for these parameters may be employed in accordance with the present invention. These parameters yield a frequency resolution of 0.5 Hz and a bandwidth of 0 to 2048 Hz in the frequency spectra. The time-domain data consists of a contiguous record of 65536 data values collected over 16 seconds, which is then divided into eight equal sets. The noise smoothing is of a satisfactory level after the averaging of eight consecutive spectra. A Hanning window may be employed for the windowing purpose because of its ability to reduce the leakage effect to a minimum.

Figure 14A:
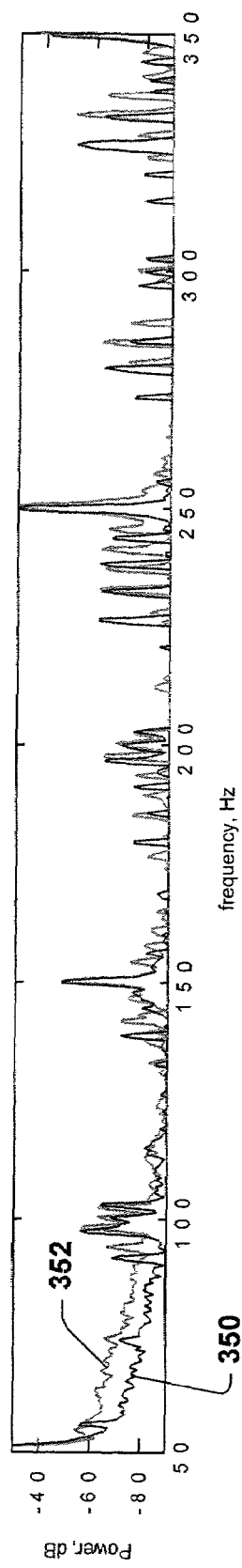
FIG. 14a is a graph of a comparison of a Fast Fourier Transform signal representative of a normal condition of a centrifugal pump and a cavitation condition of the same pump in accordance with the present invention.
Figure 14B:
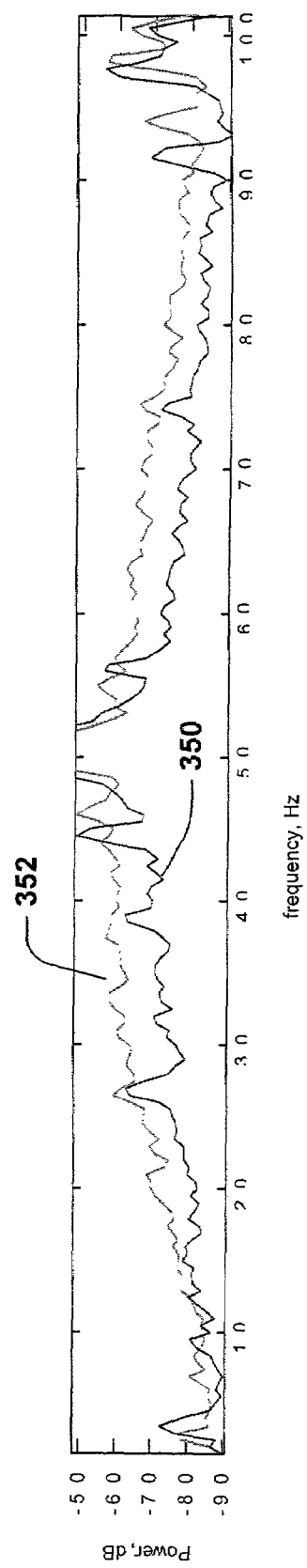
FIG. 14b is a magnified window of the graph of FIG. 14a in accordance with the present invention.
Figure 14C:
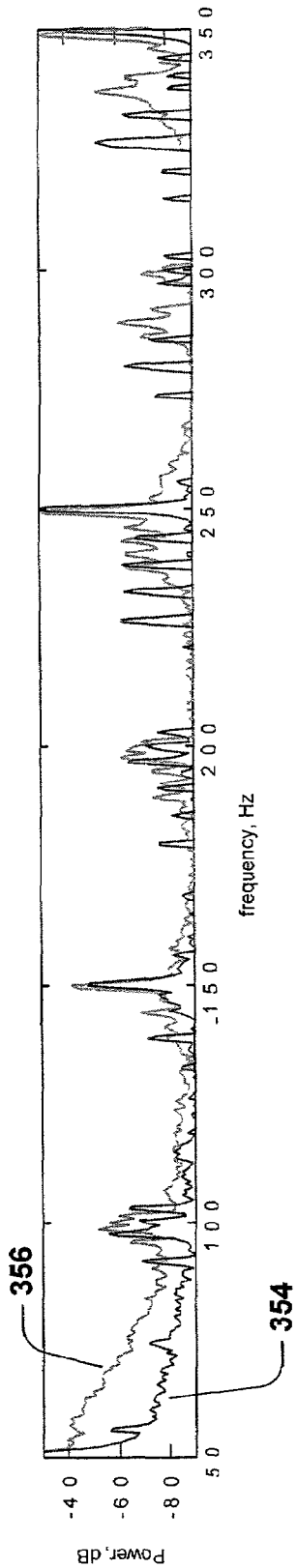
FIG. 14c is a graph of a comparison of a Fast Fourier Transform signal representative of a normal condition of a centrifugal pump and a leakage condition of the same pump in accordance with the present invention.
Figure 14D:
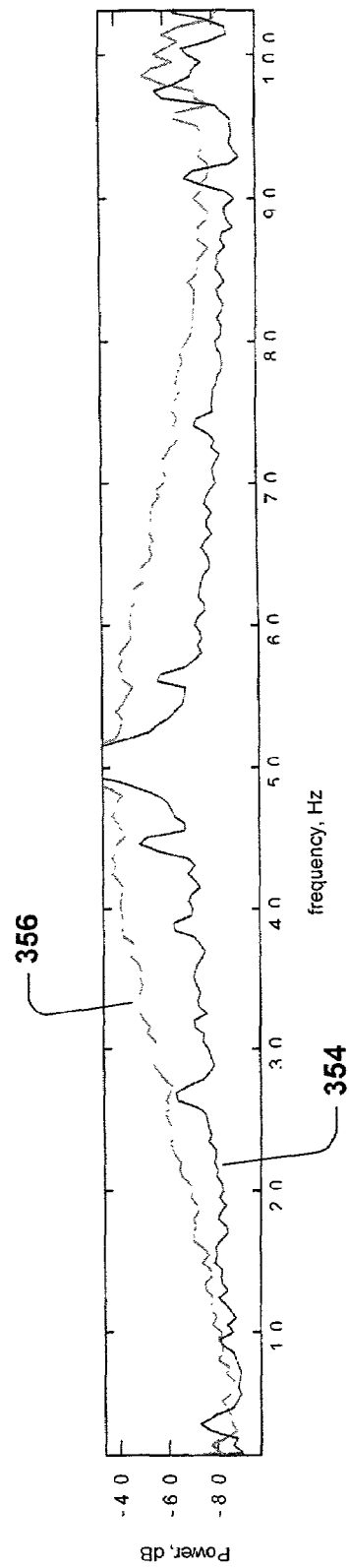
FIG. 14d is a magnified window of the graph of FIG. 14c in accordance with the present invention.
Figure 14E:
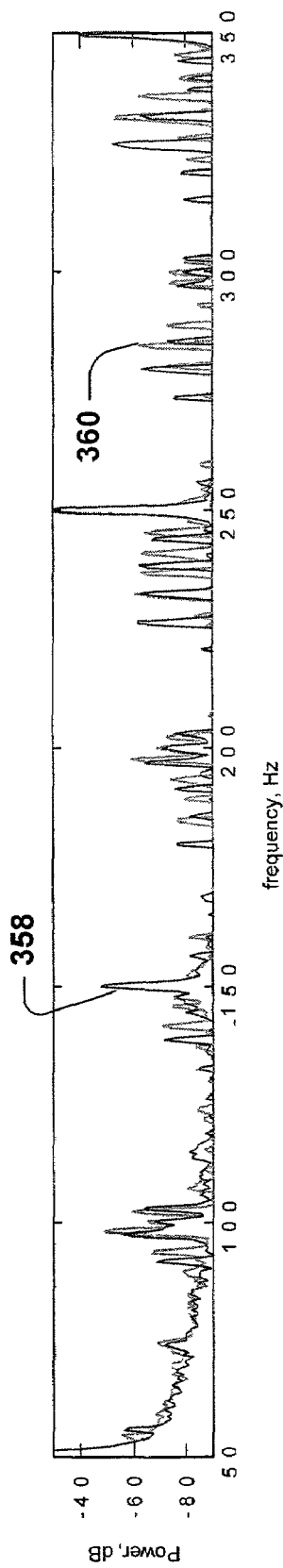
FIG. 14e is a graph of a comparison of a Fast Fourier Transform signal representative of normal condition of a centrifugal pump and a faulty impeller condition of the same pump in accordance with the present invention.
Figure 14F:
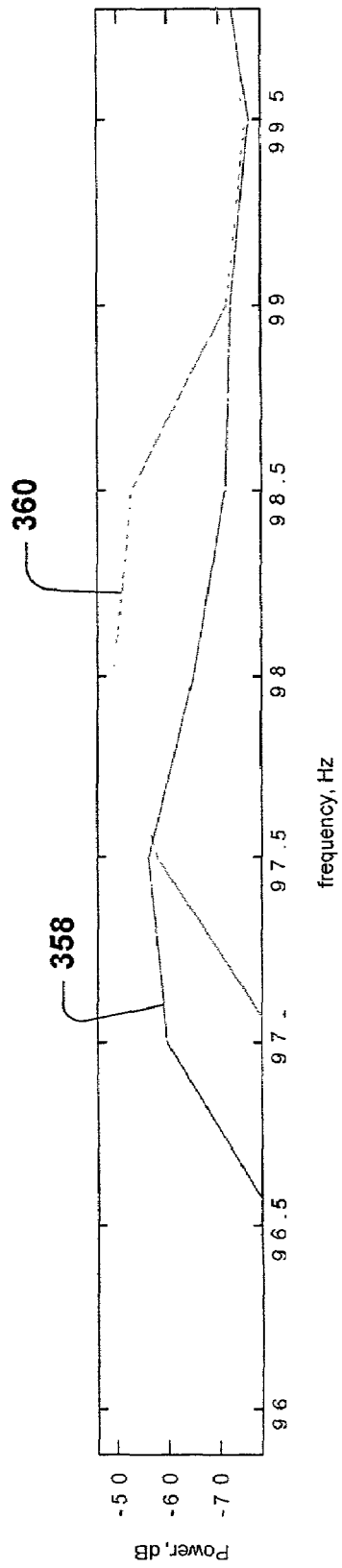
FIG. 14f is a magnified window of the graph of FIG. 14e in accordance with the present invention.

The processor 290 then finds and stores fault signatures relating to the operation of the pump in 328. FIGS. 14*a*-14*f* show how pump faults can be detected comparing frequency spectrums of current motor data relating to normal and fault conditions. FIGS. 14*a*-14*b* show both a frequency spectrum of a centrifugal pump in a normal condition 350 and a cavitation condition 352. FIG. 14*b* illustrates a blown up version of FIG. 14*a* along a limited frequency range, wherein a difference in the spectrums can be seen during cavitation. Furthermore, FIGS. 14*c* and 14*d* show both a frequency spectrum of a centrifugal pump in a normal condition 354 and a leakage condition 356, while FIGS. 14*e* and 14*f* illustrate both a frequency spectrum of a centrifugal pump in a normal condition 358 and a faulty impeller condition 360. It should be appreciated that other fault conditions such as blockage will also lead to different frequency spectrum characteristics of the current data of the motor driving the pump. Furthermore, different types of pumps will exhibit different types of faults with associated different spectrum characteristics. For example, pump faults could include cavitation, blockage, two-phase flow, impeller wear, impeller damage, the impeller impacting with the casing, a pump out of balance, corrosion, surge/hammer or other types of faults.

In one aspect of the invention, the processor 290 could access a table, such as the one shown in FIG. 14*g*. The table 400 is shown which the processor 290 accesses when performing signature analysis to diagnose the health of the pump 14. The table 400 includes current amplitude data ($A_0$ thru $A_Z$) over a range of frequencies ($f_0$ thru $f_Z$). The table 400 is stored in memory in the diagnostics and control system 66, so as to be easily accessible by the processor 290. The table 400 includes various health states of the pump shown generally at 402, which correspond to current amplitudes over the frequency range $f_0$ thru $f_N$. For example, referring to the row identified by reference numeral 404, when the current amplitudes are $A_{234}$ at $f_0$, $A_{27}$ at $f_1$, $A_{478}$ at $f_2$, $A_{24}$ at $f_3$, $A_{127}$ at $f_4$, . . . , $A_Q$ at $f_n$, the table 400 indicates that the pump 14 has a "pump fault 6". The "pump fault 6" could be a cavitation fault or a variety of other pump related faults. As will be appreciated, the table 400 can store N number of current signatures corresponding to various health states of the pump 14, which the processor 290 can employ to diagnose the health of the pump 14.

Figure 15:
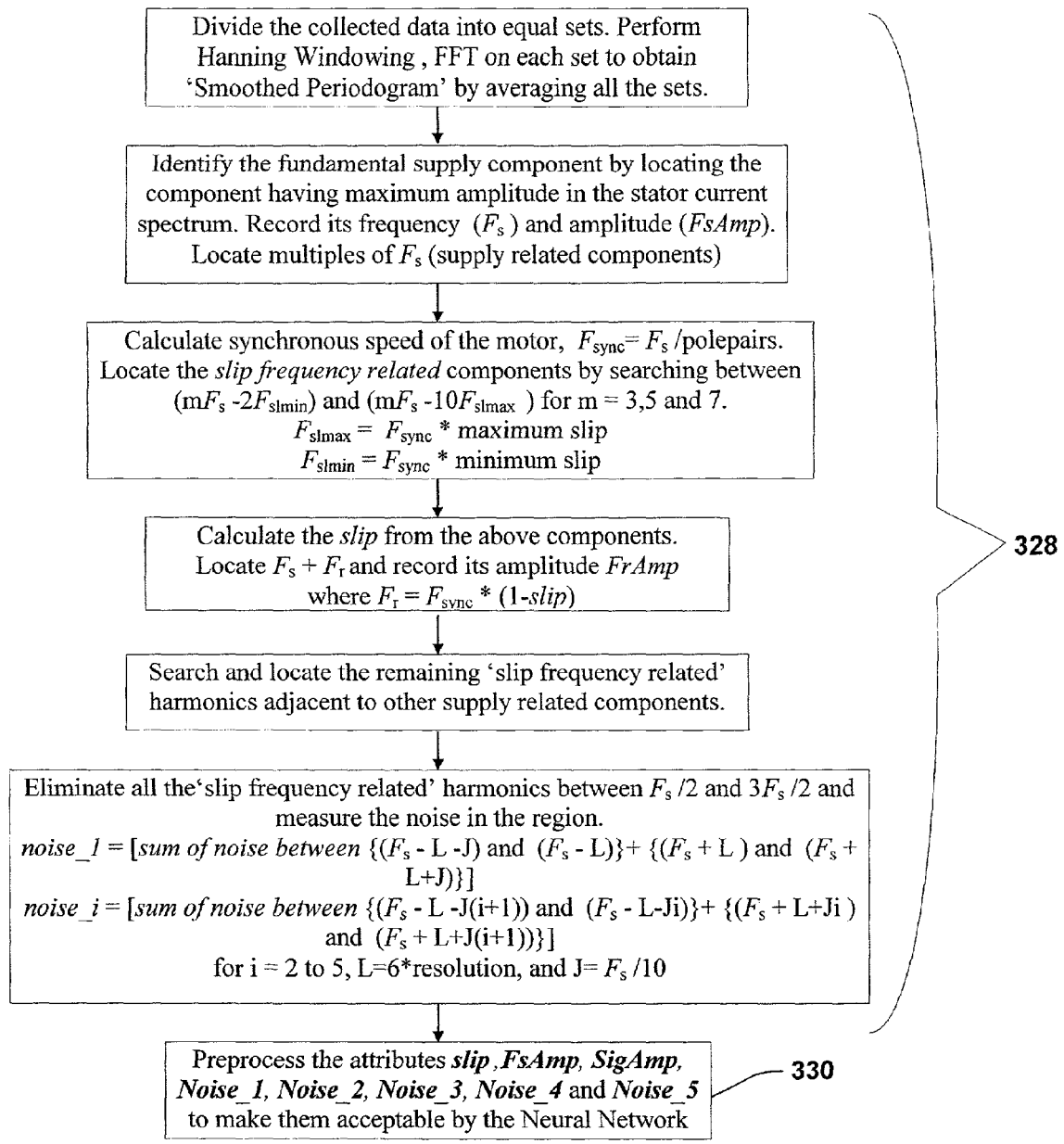
FIG. 15 is a flow diagram for creating a fault signature from the current spectrum on the conditioned signal received from a motor in accordance with the present invention.

Furthermore, certain discriminating fault attributes may be extracted from the frequency spectrum of motor current, which relate certain fault conditions of the pump. Typical attributes such as motor slip and noise directly relate to degree of cavitation. An algorithm performed by processor 290 can be seen in FIG. 15, which evaluates the components of the frequency spectrum and derives certain attributes for a centrifugal pump. The attributes shown in FIG. 15 are slip, FsAmp, SigAmp, Noise_1, Noise_2, Noise_3, Noise_4 and Noise_5, which form the fault signature for the centrifugal pump. For example, if FsAmp is low and slip is low there is fault condition of severe blockage. Other types of faults can be found, such as cavitation and faulty impeller by evaluating the above attributes. The attributes then may be subjected to the act of preprocessing 330 to be acceptable by the neural network 80.

In some cases may be desirable to preprocess the fault signature data before it is being used to train or design a decision module based on ANN paradigms. The preprocessing can be divided into three tasks, namely, elimination of outliers, scaling, and bifurcation of data into training and testing sets. Elimination of outliers is concerned with detecting any such data pattern that has one or more attributes which seem to have an extraordinarily large or small values compared to the allowed range for that attribute(s). Such data patterns are known as outliers, which could be generated due to errors during data collection or fault signature formation or due to noise. Elimination of such data patterns facilitates proper utilization of the data set for designing the network. The adverse effects caused by not eliminating outliers are compression of the useful range of a given attribute during scaling and causing difficulties for the network in converging to a final solution.

The fault signature, which is an array of real values, is known as an analog data pattern, analog exemplar, or feature vector in the field of neural networks. Although it is possible to take the attributes generated in the previous section and apply them directly as inputs to a neural network, it is practically more beneficial in terms of simplicity of the designed network and in terms of the computational load on the processor, to scale the attributes in such a way that each of the attributes has similar boundaries such as $\{0, 1\}$ or $\{-1, 1\}$. For example, in the pump condition monitoring data patterns, the slip attribute would have a value on the order of $10^{-2}$ while the FsAmp attribute can have values greater than $10^3$ and the possible range of their values can also differ greatly. Using such a data set directly, without scaling, in conjunction with a neural network would lead to large values of network parameters (e.g., weight vectors) and the time taken for completely training the network or designing the network would be high. The simplest and most widely used scaling method is the linear scaling method. Alternatively sigmoidal scaling can be used.

Returning to FIG. 11, the processor 290 then transmits the fault signature to neural network 80 after 330. Neural network 80 could be a multi-iterative, supervised learning algorithm such as feed forward, back propagation network. This network could be trained and used with a fully labeled data set corresponding to all possible operating conditions. However, the application of unsupervised ANN techniques that could learn on-line (even in a single iteration) may be desirable. Also, the ability to perform incremental learning such as provided in the proposed unsupervised neural network is desirable. Processor 290 can be programmed to perform the necessary post processing of the fault data in 332 and provide that information in the diagnostics signal 72. It should be appreciated that the functions of diagnosing the motor current data containing pump fault information can be completely performed by the diagnostics and control system 66.

Figure 12:
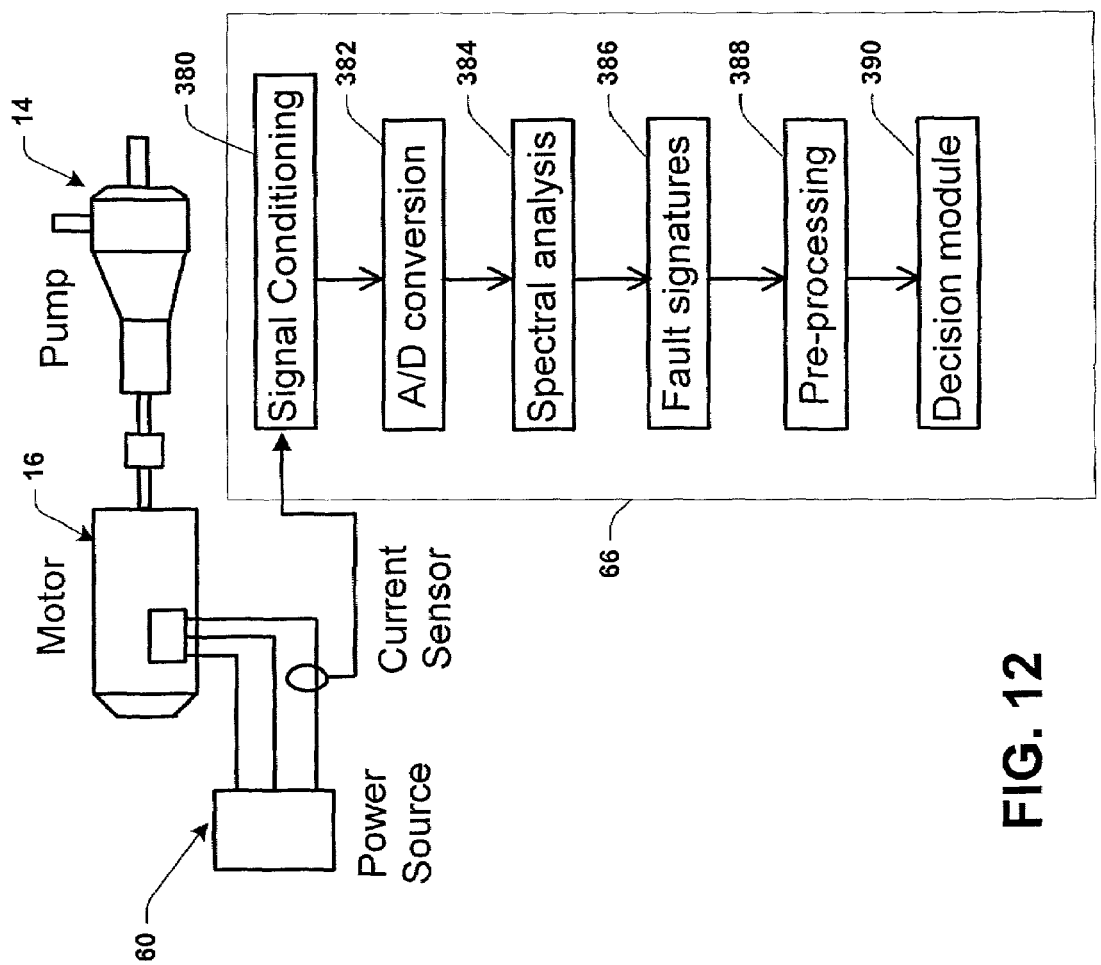
FIG. 12 is a function block diagram further illustrating the diagnostics and control system of the present invention.

FIG. 12 illustrates an implementation of the present invention wherein the diagnostics and control system 66 performs the signal conditioning 380, A/D conversion 382, spectral analysis 384, formation of the fault signatures 386 and pre-processing 388. The diagnostics and control system 66 may also include a decision module 390 which may be comprised of neural network 80 and post processing 332.

Figure 16:
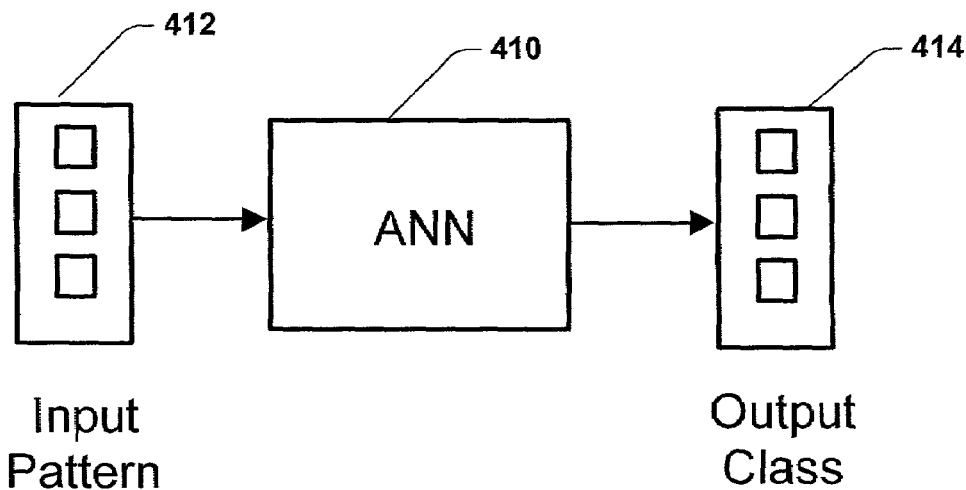
FIG. 16 is a block diagram of an artificial neural network in accordance with the present invention.

Neural network 80, which may comprise an Artificial Neural Network (ANN), will now be discussed with regards to another implementation in accordance with the present invention. ANNs are a set of algorithms or processing acts that can be used to impart the capabilities such as generalization and pattern recognition to a standard computer system. These algorithms can learn to recognize patterns or classify data sets by two methods, known as supervised learning and unsupervised learning. Considering the block diagram shown in the FIG. 16, in which an ANN is represented by a 'square block' 410, the ANN is supervised if the network is provided with a set of input patterns 412 along with their designated outputs 414, and the network learns by changing its internal parameters in such a way that it produces the corresponding designated output pattern for a given input pattern. The ANN is known as unsupervised if the network chooses its own output class for a given input pattern without any external supervision or feed-back.

The ANN structure basically contains processing nodes called neurons arranged in two or more layers. The nodes are extensively interconnected typically in a feed forward manner through connections and associated interconnection weights. For a pattern recognition application, the input pattern could be a digitized image of an object to be recognized and the output could be the same image (e.g., with reduced noise), or it could be a class representation of the image. For a condition monitoring application such as for motorized systems, the input pattern may include preprocessed fault signature data derived from the stator current spectra, and the output is a class representation of various fault conditions. There are various architectures and learning schemes for the ANNs and some of the ANNs may be more suitable for use as decision makers for condition diagnostics applications than others.

Figure 17:
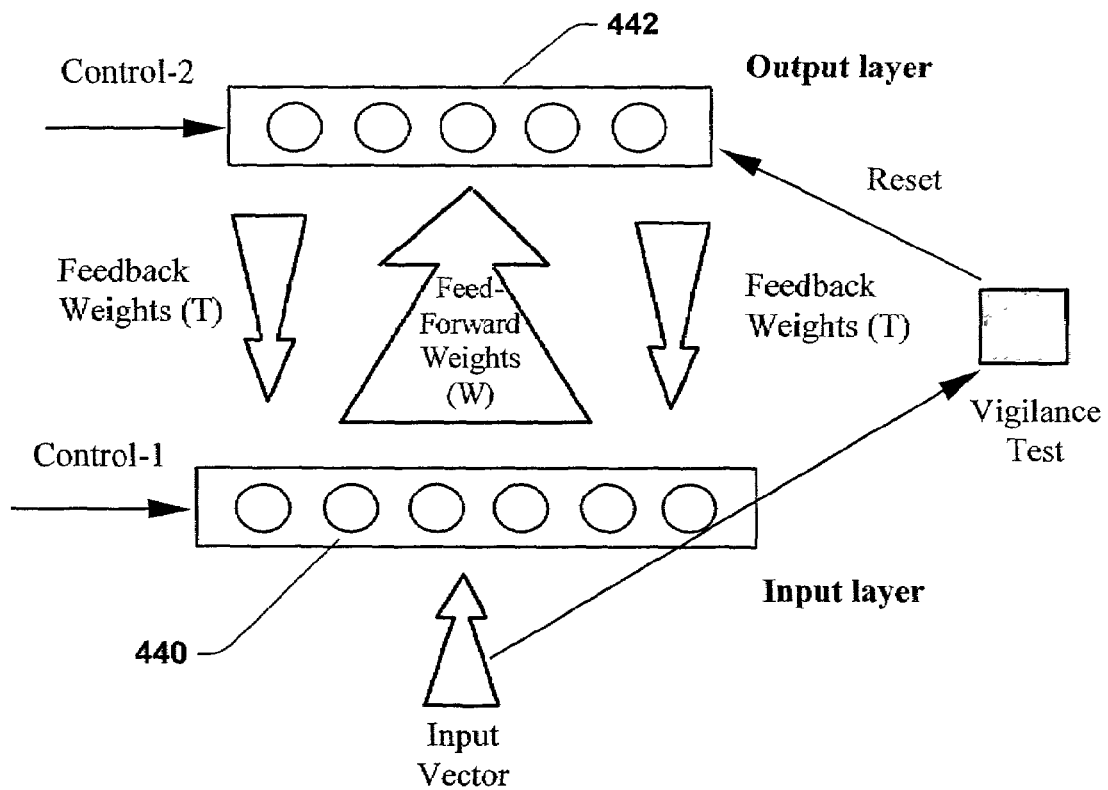
FIG. 17 is a block diagram of an artificial neural network in accordance with the present invention utilizing an Adaptive Resonance Theory paradigm.

It has been found that one-shot unsupervised ANN paradigms may be more suitable for the development of condition monitoring system than supervised ANN paradigms. Furthermore, a monitoring system based on an unsupervised neural network that can learn about the conditions of a process plant from a single pass of the training data, can provide a better solution for detecting new plant conditions. Supervised networks must be trained off line, and thus have a fixed set of variables and cannot give a valid output upon receipt of a new condition. A block diagram of a one such one-shot unsupervised ANN network known as the Adaptive Resonance Theory (ART) is shown in FIG. 17.

ART has two layers namely the input (or comparison) layer 440 and output (or recognition) layer 442. These layers are connected together, unlike the other networks discussed above, with feedforward (denoted by W) as well as feedback (denoted by T) connections. The neurons of the output layer also have mutual connections useful for lateral inhibition (not shown in the Figure). The signals Control-1 and Control-2 are responsible for controlling the data flow through the input and output layers, 440 and 442, respectively. The reset circuit is responsible for determining the effectiveness with which a winning output neuron represents the input pattern. It is also responsible for resetting the ineffective neurons and designating a new neuron for representing a given input pattern. The training of the ART network can be done in either a fast learning mode or in a slow learning mode. The fast learning mode allows the network's feed forward weights to attain their optimum values within few learning cycles (epochs) while the slow learning mode forces the weights to adapt over many epochs. The fast learning mode can be used to train the network even in a single epoch. This is appropriate for the present case because the salient features of the problem domain are already well defined in the fault signatures.

Figure 18:
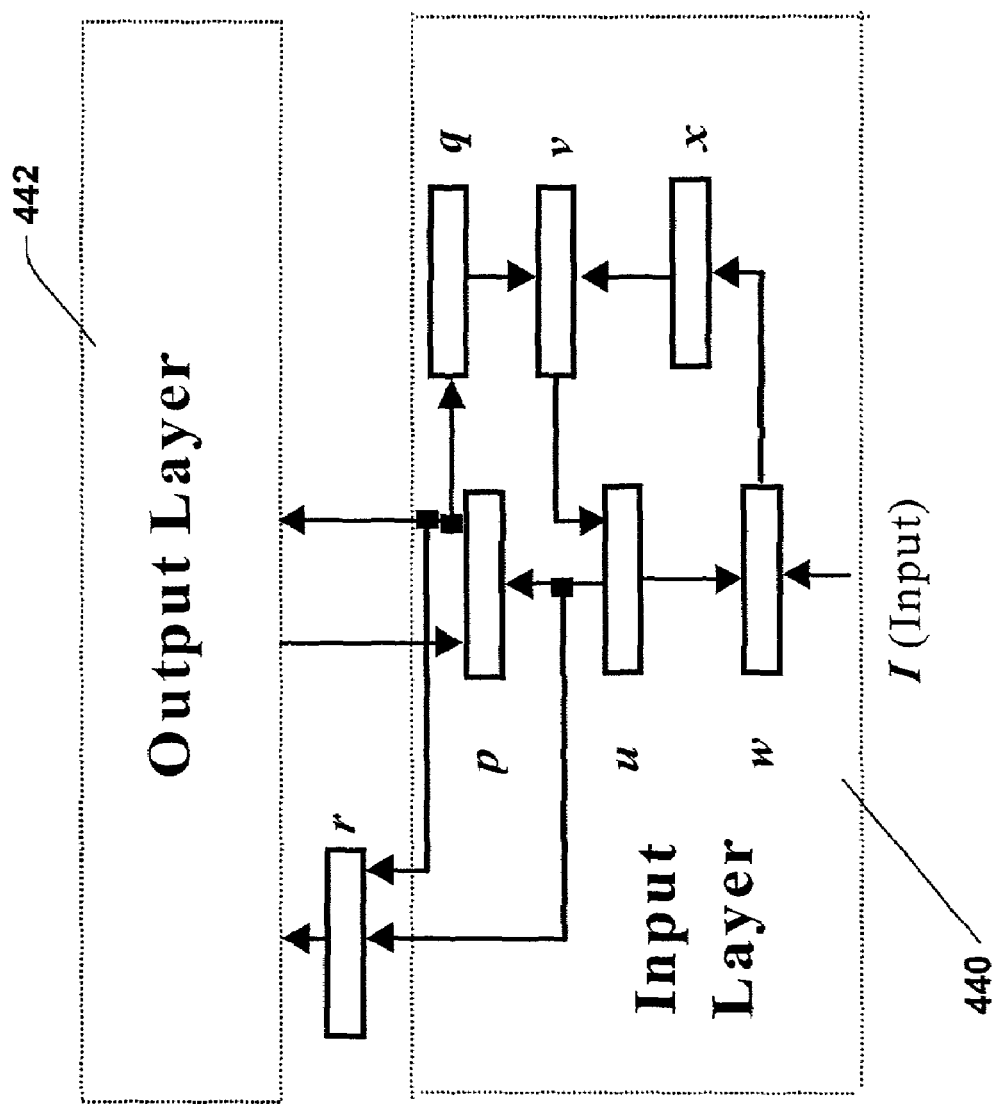
FIG. 18 is a block diagram of an artificial neural network in accordance with the present invention utilizing the second version of the Adaptive Resonance Theory paradigm.

FIG. 18 illustrates the ART-2 architecture, which is essentially the same as the ART architecture except that the input layer of ART-2 has six sublayers (w, x, v, u, p and q) which are designed to enhance the performance of the network to cope with the continuously varying real input data. The additional sublayers incorporate the effects of feature enhancement, noise suppression, sparse coding and expectation from the recognition layer. The reset function is incorporated by an additional sublayer (r) containing the same number of nodes as are in the sublayers of the input layer.

Another useful unsupervised ANN algorithm applicable to the present invention is the Associative List Memory (ALM) paradigm. Associative List Memory (ALM) is an autoassociative memory capable of handling long bit strings (up to $10^4$ bits) of data. ALM's learning mechanism is based on unsupervised training technique and can learn within a single epoch. It has been successfully applied to reduce and classify the data produced by satellites and the results have shown that ALM is comparable or better than other associative memories such as the Sparse Distributed Memory for this application. It provides direct access to the learned exemplars and can be implemented on a low-cost computing platform (e.g., a 16 bit microprocessor). With suitable modifications ALM can be used for classifying analogue inputs (e.g., pump fault signature data). Its one-shot learning capability, simple algorithm structure, and incremental learning capability make it a suitable choice for implementing a stand-alone decision module for pump diagnostics.

In a typical commercial or industrial motorized system, it may not be possible to generate a dataset containing all possible operating conditions or faults. Simple linear scaling of the available data may not ensure that any future data, which might occur due to a new plant operating condition, would lie within the same initial limits. Hence an adaptive preprocessing scheme may be employed in accordance with the invention, which adaptively updates the maximum and minimum values of each attribute so that the entire database is maintained to have values between 0 and 1. This increases the computational task, but the potential advantages of the generic condition monitoring scheme out-weigh this minor drawback. Output generated by an unsupervised neural network needs to be post processed in order to obtain useful classification information. In the classification applications using the unsupervised ANN paradigms, usually the domain expert (a human expert, having knowledge about the problem) examines the output classes assigned by the ANN in conjunction with system details such as which of the input patterns has activated which of the output entries, the class to which a given input actually belongs etc., and then assigns the class representation to each of the output entries. The above procedure is suitable for applications such as classification of satellite pictures etc., but may not be suitable for on-line condition monitoring applications.

Without the above mentioned post processing, an unsupervised ANN based decision module for the condition monitoring applications, can only signal the formation of a new output entry indicating that a possible new plant condition has occurred, but it cannot diagnose the new condition to be a particular case, such as a new normal condition, cavitation etc. It is, however, possible that an intelligent post processor based on expert system rules, can be used to assign the class representation to each of the output entries formed by the unsupervised neural networks such as ART and ALM. The attributes of the fault signatures obtained from the stator current of the motor are derived based on the physical interpretation of the functioning of the pumps and pumping systems. This means that the variation of each of the attributes are associated with the physical status of the pump. Thus, it is possible to correlate the attribute representing the pump condition with rules such as 'IF attribute-1 is high and attribute-2 is high THEN the pump condition is cavitation', etc. An expert system based on such generic rules can be used to assign the class representation to the output entries formed by the unsupervised ANN paradigm so that the decision module produces a meaningful output without any external human supervision.

Figure 19:
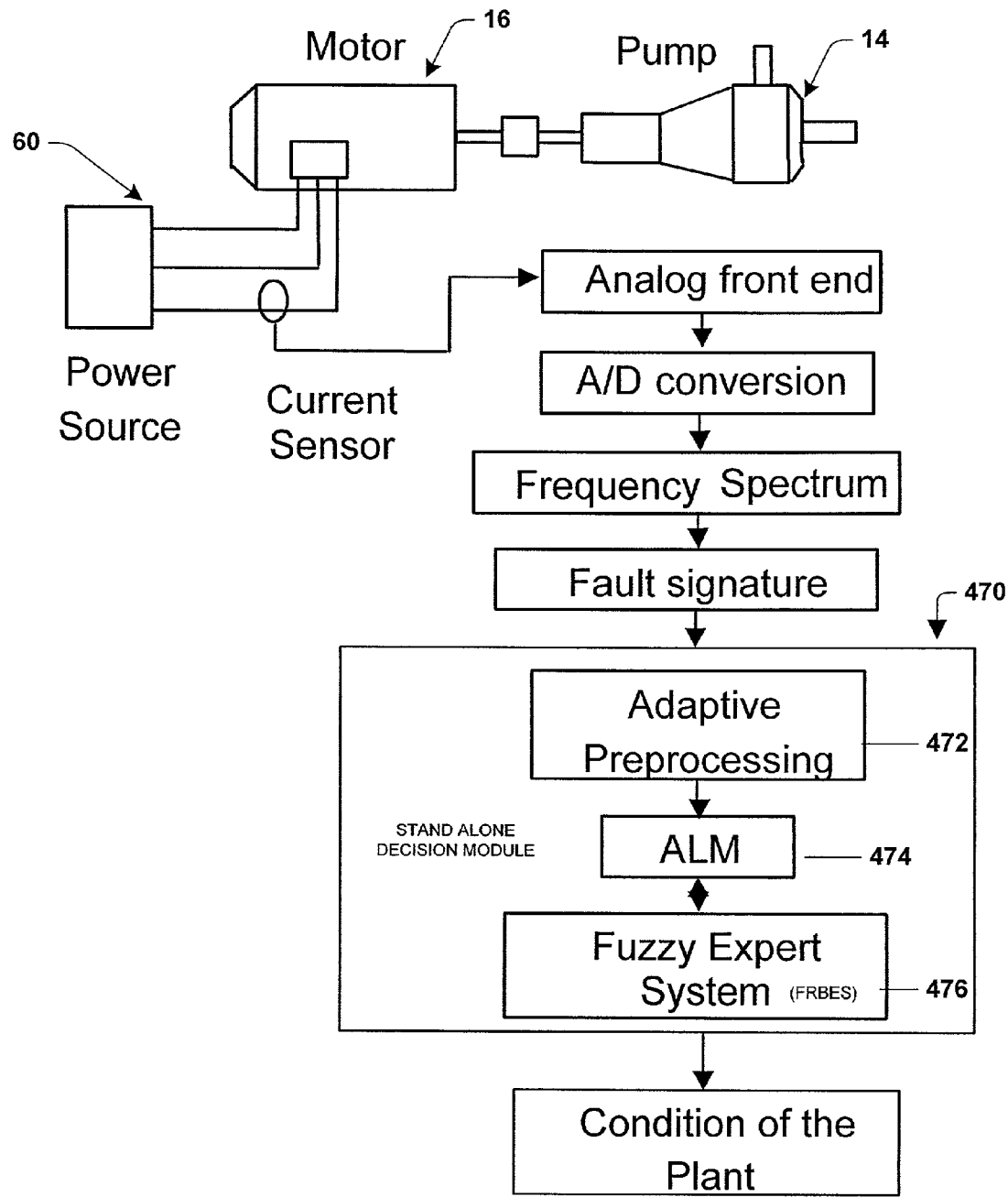
FIG. 19 is a functional schematic diagram of the diagnostics and control system including a stand-alone decision module adapted for pump diagnosis in accordance with the present invention.

Referring to FIG. 19, a condition monitoring system is provided that utilizes a stand-alone decision module 470 within the diagnostics and control system 66. The stand-alone decision module 470 includes hardware and/or software that performs an adaptive preprocessing act, an ALM neural network and software that utilizes a Fuzzy Expert System in a post processing act. To exploit the potential advantages of one-shot methods as decision modules for the on-line condition monitoring schemes, a flexible preprocessing method is employed which adaptively preprocesses the incoming data to bind its attribute values to the predefined limits of 0 to 1, by using pre-specified maximum and minimum limits, which can be easily defined by the domain expert, who has knowledge of the equipment (type of motor, pump etc.) and the plant (flow rate, differential pressure head etc.).

Where attribute values are not predictable, limits are set based on observation of the range encountered during measurement. These initial limits act as maximum and minimum boundaries for calculating scaling factors to preprocess the incoming data as long as the incoming data patterns fall within range. When any of the attributes of the incoming data patterns has a value beyond these limits then the maximum and minimum boundaries are expanded to include the present pattern and new scaling factors are obtained. Whenever such a change of maxima or minima boundaries occurs, the neural network paradigm that uses the preprocessed data may be updated to account for the new changes in the scaling factors and also the previously accumulated data base may need to be rescaled using the new scaling factors based on how much the new boundaries have expanded.

Figure 20:
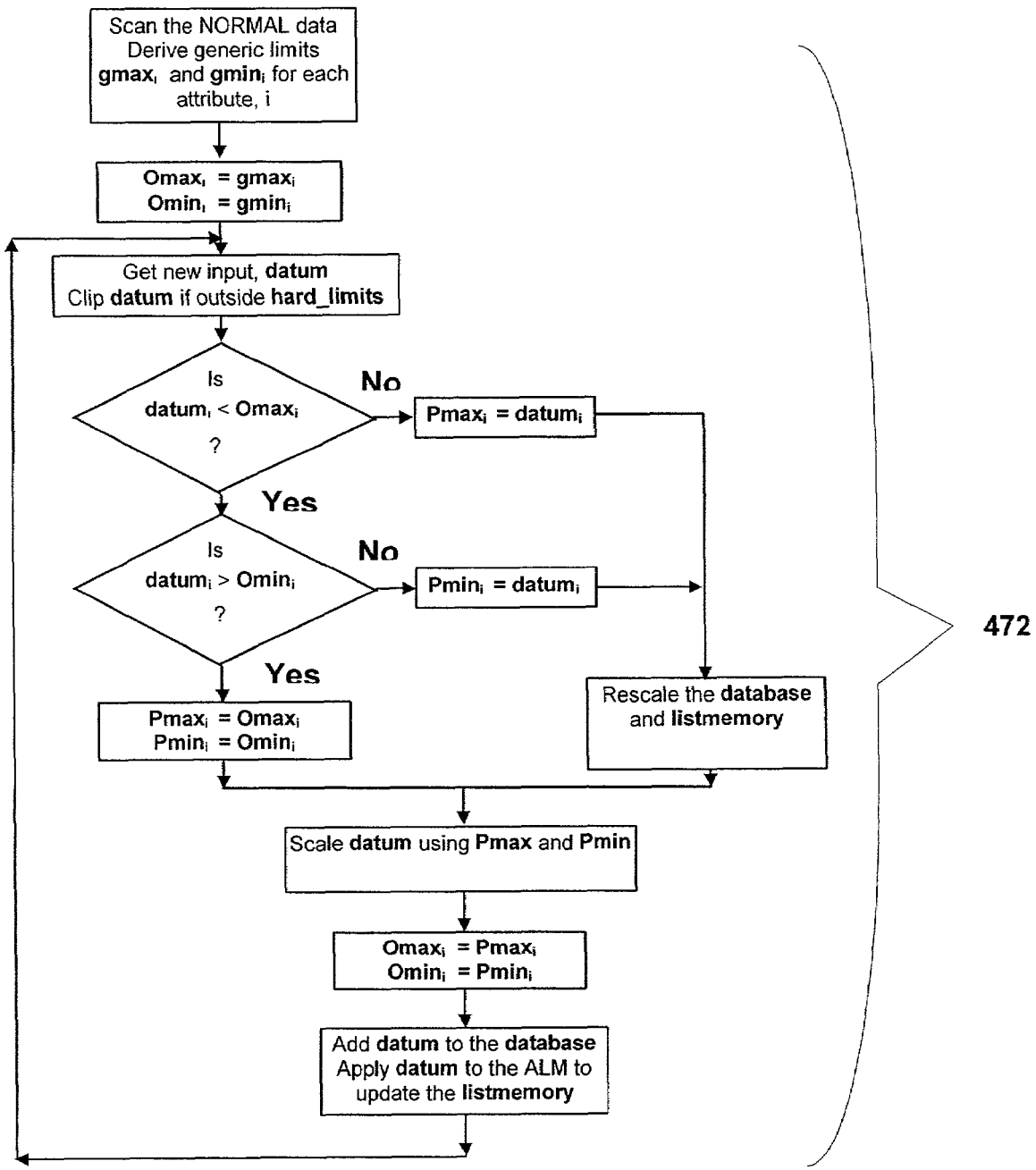
FIG. 20 is a flow diagram for performing an adaptive preprocessing act for the stand-alone decision module of FIG. 19 in accordance with the present invention.

In the case of the ART-2 algorithm, the feed-forward and feed-back weight vectors may be rescaled to account for the new changes, and for an ALM the memory entries themselves rescaled. Although the proposed adaptive preprocessing scheme will work without defining any maximum and minimum limits beforehand, it is faster and more efficient to specify and utilize initial expected limits. It should be appreciated that the present invention could employ operator input training techniques. FIG. 20 illustrates a flow-chart of the functional description of the adaptive preprocessing scheme 472. The expected maxima and minima for each attribute are first derived by analyzing the normal condition data and the other relevant pump/plant details, ratings and physical system. It should be noted that in some circumstances it may not be necessary to employ preprocessing and postprocessing techniques.

Figure 21:
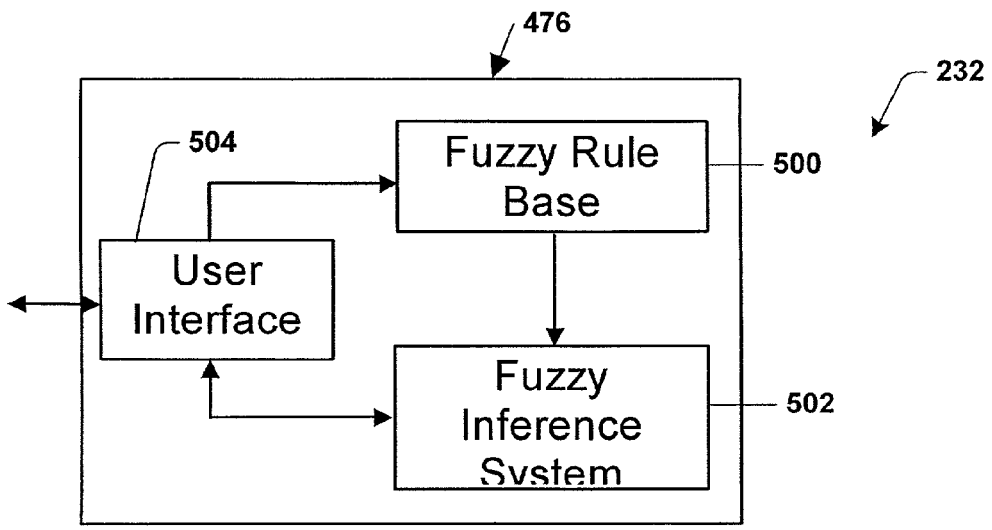
FIG. 21 is a schematic representation of the Fuzzy Rule Base Expert System in accordance with the present invention.

A block diagram of a Fuzzy Rule Based Expert System (FRBES) 476 is shown in FIG. 21. It comprises three modules namely, a Fuzzy Rule Base 500, a Fuzzy Inference Engine 502 and a User Interface 504. The Fuzzy Rule Base 500 consists of Fuzzy type 'IF-THEN' rules, while the Fuzzy Inference Engine 502 is the core logic program which includes details of the Fuzzy system such as the number and types of membership functions of inputs and outputs, their range, method of defuzzification, etc. The User Interface 504, in a production-level expert system is capable of querying the user for additional information in case the expert system is unable to reach a conclusion with the existing information in its data base.

Figure 22:
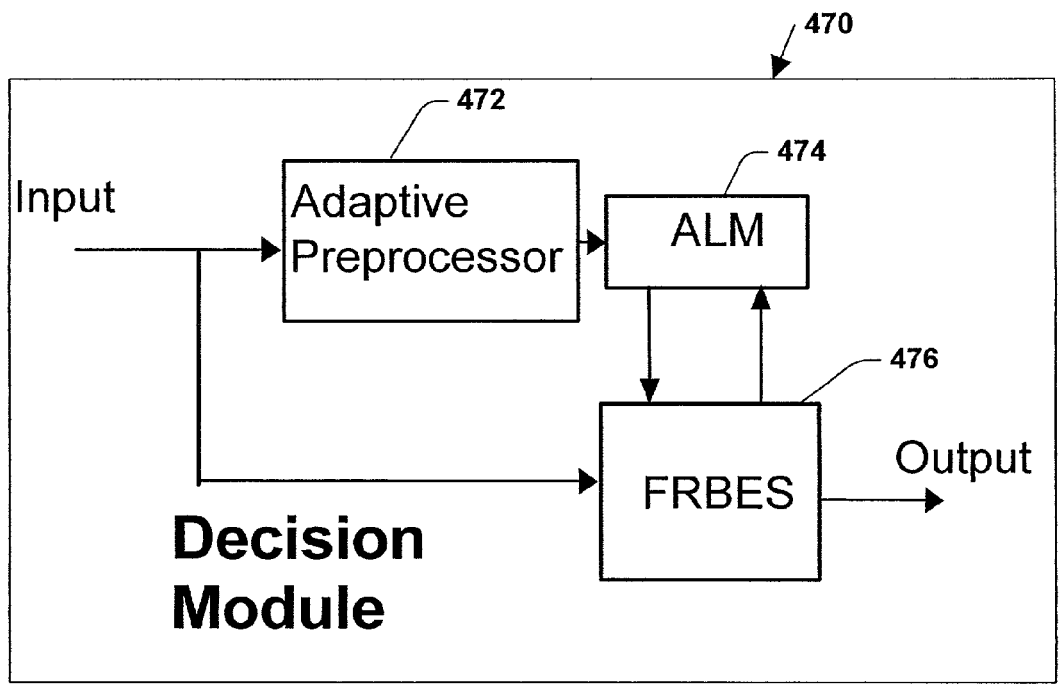
FIG. 22 is a schematic representation of the stand-alone decision module in accordance with the present invention.

As can be seen in FIG. 22, the decision module 470 can be integrated as a stand-alone decision module where the input can be received both by the Adaptive Preprocessor 472 and the FRBES 476. Bidirectional communication is set up between the ALM Neural Net 474 and the FRBES 476. The ALM may receive new classification information which may be entered from the user interface portion of the FRBES 476. The ALM Neural Net 474 then generates the appropriate output pattern to a user interface. The rule base of the FRBES in the present example comprises fifteen generic rules formed on the basis of the generic knowledge about the behavior of the attributes with respect to a given plant condition. These rules are listed in FIG. 23. The MATLAB source code corresponding to the FRBES described above can be implemented using MATLAB's Fuzzy Logic Tool-Box. It should be appreciated that the Adaptive Preprocessor 472, ALM paradigm 474, and the FRBES 476 could be implemented in stand-alone hardware modules or in a single integrated hardware module within the system 66. Furthermore, separate processors and software programs could be used or a single processor and software program could be used to run the Adaptive preprocessing and FRBES acts. It should be appreciated that the stand-alone decision module 470 can be used to diagnose the operating condition of the pump system 12 (e.g., cavitation), the health or condition of the pump 14 (e.g., impeller damage), and also the condition of the motor 16 driving the pump 14 (e.g., rotor bar damage).

Figure 24:
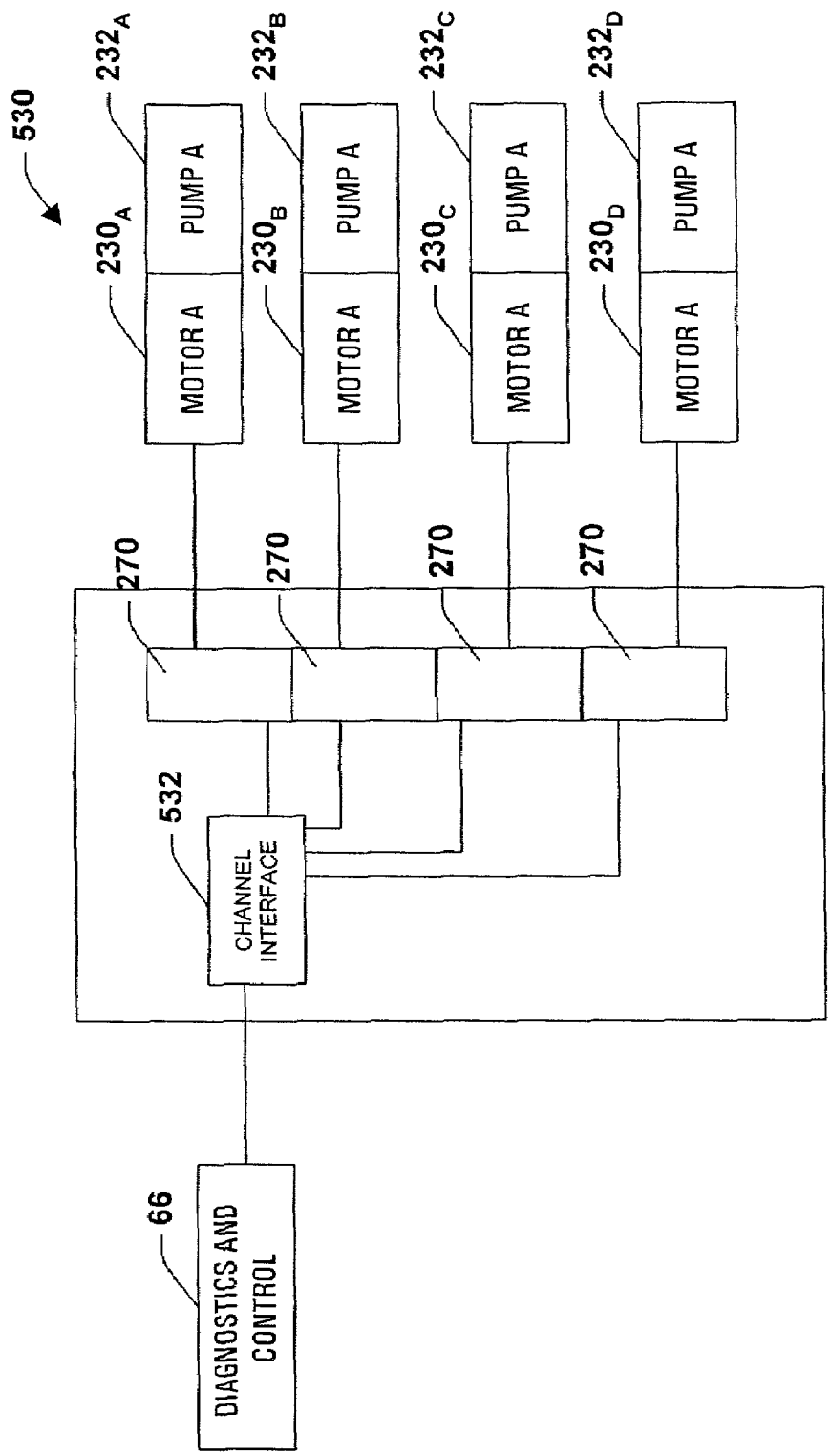
FIG. 24 is a schematic representation of a system for diagnosing and controlling a plurality of pumps in accordance with the present invention.

Turning now to FIG. 24, the diagnostics and control system 66 is shown as part of a system 530 where the diagnostics and control system 66 performs classical current signature analysis on a plurality of motors $230_A$-$230_D$. The motors $230_A$-$230_D$ drive pumps $232_A$-$232_D$. Although only four motors and four pumps are shown as part of the system 530, it will be appreciated that virtually any number of motors and pumps may be employed in this system 530. The motors $230_A$-$230_D$ are each individually tied to the diagnostics and control system 66. The system 66 may include motor starters to start and stop the motors along with circuit breakers to protect the electric motors and electric wiring. Each respective motor $230_A$-$230_D$ has current sensor(s) coupled to its respective lead wire(s) to obtain current signal data. The digitized current signal data 320 for each motor $230_A$-$230_D$ is applied to a channel interface 532. The channel interface 532 includes a separate channel for each motor of the system 530. The channel interface 532 is coupled to the diagnostics and control system 66.

The diagnostics and control system 66 cycles through each channel at predetermined intervals to obtain current data with respect to each motor $230_A$-$230_D$. The diagnostics and control system 66 then essentially carries out the same acts as described above with reference to FIG. 12 as to performing classical fault signature analysis to determine the operating condition of the pumps $232_A$-$232_D$. The advantage of this system 530 is that it allows for the analyzing a plurality of pumps by a single diagnostics and control system 66. In this way, a user of the diagnostics and control system 66 could monitor and analyze every motor or machine within a facility from a single location.

Figure 25:
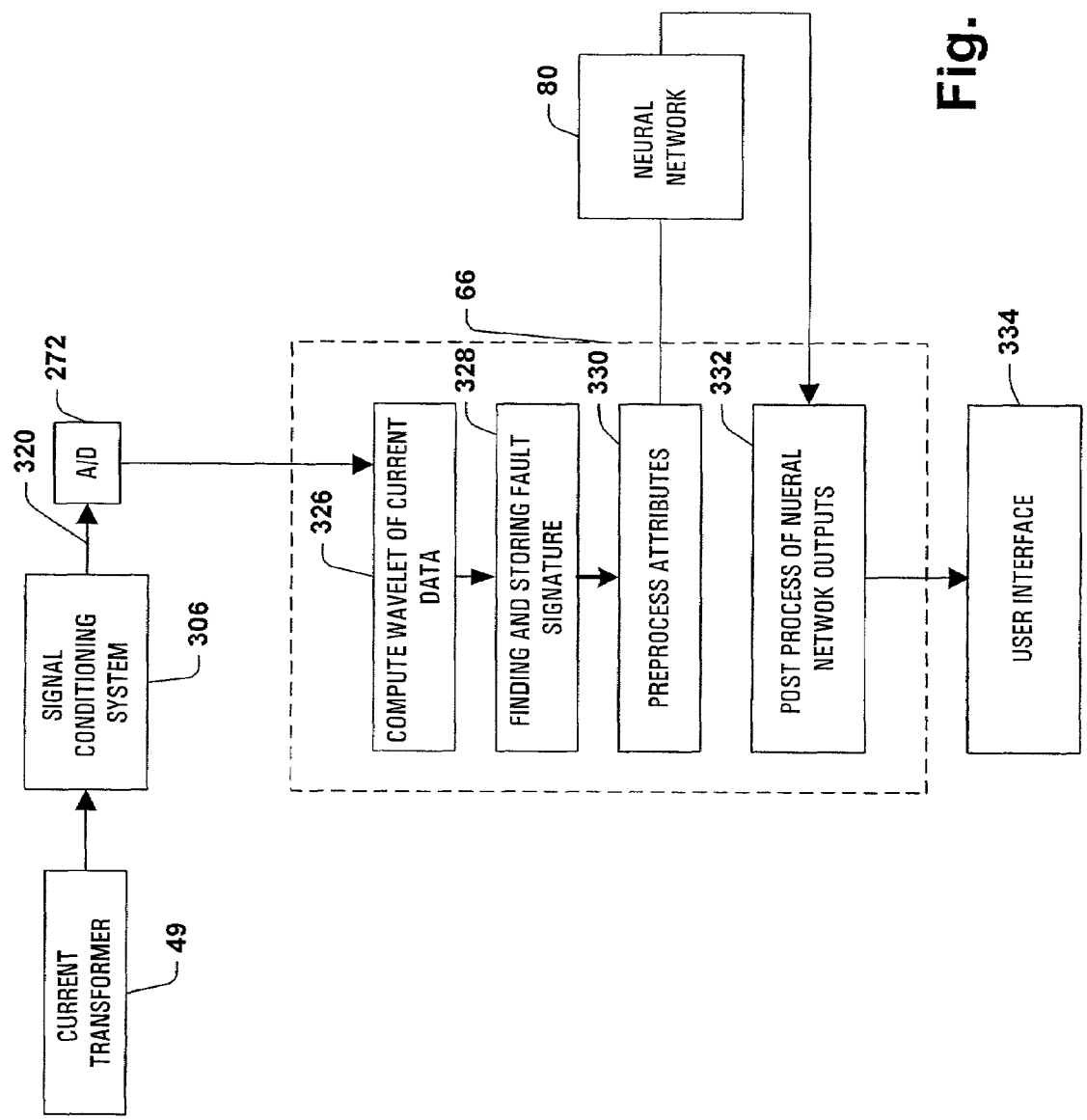
FIG. 25 is a function block diagram illustrating the diagnostics and control system utilizing wavelets in accordance with the present invention.

Although the present invention has been described with respect to obtaining Fast Fourier Transforms of the current signals, it should be appreciated that other suitable techniques may be employed. For example, wavelet transforms may be derived from the current data. FIG. 25 shows replacing the act 326 (FIG. 11) of computing the Fast Fourier Transformation of digital conditioned signal 320 with computing the wavelet of the conditioned signal 320. All that is required for performing a wavelet transform is an appropriate set of analysis and synthesis filters. By using the wavelet transform with the neural network 80, a much smaller, compact, training set may be employed, which still enables the present invention to correctly classify the operating state of the motor pump system. Furthermore, original signal information from the wavelet coefficients as may be needed in the future. This approach also affords for a pseudo frequency domain and time domain analysis of the signal data. Such a combination involves relative simplicity of implementation while affording great flexibility in accommodating a broad range of signal types and noise levels.

It should be appreciated that the present invention employs techniques that show direct application to machinery diagnosis using a variety of techniques, algorithms and models. These techniques could be readily expanded to include pump hardware and pump process protection via automatic shutdown, failure prediction/prognostics, corrective action recommendations, monitor and control energy usage and to ensure EPA and safety guidelines are complied with using monitoring and archival data storage. It should also be appreciated that the techniques provided in the present invention could be applicable to a broad range of pumps (e.g., centrifugal, positive displacement, compressors, vacuum pumps, etc.).

In order to further illustrate the various aspects of the invention, FIGS. 26-44 and the following description are provided, including exemplary experimental and simulated results showing the diagnostic capabilities according to the invention. The space vector angular fluctuation technique (SVAF), provides significant advantages over prior analytical methodologies, such as the zero cross times method (ZCT) for motor failure prediction. The ZCT method employs zero crossing times of three phase motor current waveforms as data for spectral analysis of induction motor current. The inventors of the present invention have found that fluctuations in the angle of the space vector hold information on motor condition, and that when these are analyzed by means of FFT or other frequency spectral analysis techniques, diagnostic indices for stator and rotor faults can be defined. The main drawback in the ZCT method was limited sampling frequency, whereas the SVAF method overcomes this limitation, thus giving more reliable diagnostic data, since aliasing effects are removed.

The ZCT method of induction motor fault detection measures times $t_i$ at which the three phase currents cross through zero. A series of data values is derived as the time difference between pairs of adjacent zero crossing times minus the expected 60 degree time interval $\Delta T$ between two zero crossings. For a three phase system with six zero crossings per mains cycle, this produces six samples per supply cycle with the data given by $$\delta t_i = t_i - t_{i-1} - \Delta T, \tag{1}$$

with $\Delta T = \frac{1}{300}$ sec for a 50 Hz supply.

Since the phase lag angle of motor current behind the supply voltage varies with load, it follows that fluctuations in load or speed from any cause will be encoded as modulation of the ZCT data values $\delta t_i$. These data values represent the fluctuations in the zero crossing times, and in an ideal system at constant speed, would all be equal to zero. Hence, only the fluctuations in load are encoded. Because there are six zero current crossings in each supply cycle in a typical three phase system, the ZCT sampling is fixed at only six samples per cycle. Hence the sampling frequency of the ZCT signal is 300 Hz with a 50 Hz supply, giving a range of frequencies covering only (0-150) Hz in a ZCT spectrum.

The SVAF methodology according to the present invention is not so limited in sampling rate, and hence aliasing may be overcome or minimized, which heretofore has been problematic in association with the ZCT technique. Thus, the invention provides for deriving sampled data from the rotational motion of the space vector representing the three phase currents, instead of just from the zero crossings. The balanced stator currents of amplitude I, phase angle $\phi$ and angular frequency $\omega_s$ for a symmetrical three phase winding are represented by the following equation (2):

$$\begin{bmatrix} i_a(t) \\ i_b(t) \\ i_c(t) \end{bmatrix} = I \begin{bmatrix} \cos(\omega_s t + \phi) \\ \cos(\omega_s t + \phi - 2\pi/3) \\ \cos(\omega_s t + \phi - 4\pi/3) \end{bmatrix}. \tag{2}$$

These stator currents define a space vector as the sum of space vectors of individual phases given by equation (3):

$$\vec{i}_s = \frac{3}{2}[i_a(t) + a i_b(t) + a^2 i_c(t)], \tag{3}$$

where $a = e^{j2\pi/3}$ is a space operator.

For a balanced, symmetrical, steady state system, this vector rotates in the space vector plane with constant amplitude in the positive direction at synchronous speed. Its locus in the space vector plane is a perfect circle, as shown in (4):

$$\vec{i}_s = I e^{j\phi} \cdot e^{j\omega_s t}. \tag{4}$$

However, for a system, with presence of any other additional component caused by either stator fault, rotor fault or other unbalance, of amplitude $I_{comp.}$, angular frequency $\omega_{comp.}$ and phase angle $\phi_{comp.}$, the three phase currents may be written as in (5).

$$\begin{bmatrix} i_a(t) \\ i_b(t) \\ i_c(t) \end{bmatrix} = \quad (5)$$

$$I \begin{bmatrix} \cos[\omega_s t + \phi] \\ \cos[\omega_s t + \phi - 2\pi/3] \\ \cos[\omega_s t + \phi - 4\pi/3] \end{bmatrix} + I_{comp.} \begin{bmatrix} \cos[\omega_{comp.} t + \phi_{comp.}] \\ \cos[\omega_{comp.} t + \phi_{comp.} - 2\pi/3] \\ \cos[\omega_{comp.} t + \phi_{comp.} - 4\pi/3] \end{bmatrix}$$

Substituting (5) into (3), the currents in (5) can be expressed in space vector form:

$$\vec{i}_s = I e^{j\phi} e^{j\omega_s t} + I_{comp.} e^{j\phi_{comp}} e^{j\omega_{comp} t} \quad (6)$$

$$\vec{i}_s = \vec{I} e^{j\omega_s t} + \vec{I}_{comp.} e^{j\omega_{comp} t} = \vec{i} + \vec{i}_{comp.} \quad (7)$$

The resultant space vector is the sum of the fundamental and additional component corresponding space vectors. The locus of the space vector will no longer be a perfect circle due to the combined effect of the present components. Apart from distortion in the space vector's amplitude, the result is that the rotational speed of the space vector fluctuates so that it does not pass any specific point on the circle at equal intervals $2\pi/\omega_s$, but does so with fluctuating delays. The space vector angular fluctuation (SVAF) method explores these fluctuations by measuring them with respect to the balanced referent signal of amplitude I and angular frequency $\omega_s$. The resultant space vector from (6) divided by referent space vector is given in (8):

$$\frac{\vec{i}_s}{\vec{i}_{sr}} = 1 + \vec{I}' e^{-j\omega' t}, \quad (8)$$

with $$\vec{I}' = \frac{\vec{I}_{comp.}}{\vec{I}},$$

and $\omega' = \omega_s - \omega_{comp.}$. Finally, the angular fluctuation of the space vector may be found using equation (9):

$$\theta = \arctan\left(\frac{\vec{i}_s}{\vec{i}_{sr}}\right) = \arctan\left(\frac{I' \sin\omega' t}{1 + I' \cos\omega' t}\right). \quad (9)$$

The following polynomial expansion (10) computes the arctangent of a variable x, when (x<1):

arctan(x)=0.318253x+0.003314x$^2$−0.130908x$^3$+ 0.0068542x$^4$−0.009159x$^5$ $$\arctan(x) = \alpha \cdot x + \beta \cdot x^2 - \gamma \cdot x^3 + \delta \cdot x^4 \cdot \epsilon \cdot x^5 \quad (10)$$

Since I'<<1, this expansion can be applied to (9). If only the first term of the expansion, αx, is taken into consideration, together with binomial expansion for the argument of the arctangent function in (9), the following expression (11) is obtained:

$$\theta = \quad (11)$$

$$-\alpha \left[ I' \sin\omega' t - \frac{I'^2}{2} \sin 2\omega' t + \frac{I'^3}{2} \left[ \sin\omega' t + \frac{1}{2}(\sin 3\omega' t - \sin\omega' t) \right] - \ldots \right]$$

Equation (11) indicates frequencies that can be expected in the spectrum of the SVAF signal. To obtain the fluctuations in a real system, the instantaneous rotational position $\theta_i$ of the current space vector, which advances with each sample instant, is measured in the space vector plane. When the expected increment in rotational position $\Theta_i = \omega_s t_i$ for uniform rotation at angular frequency $\omega_s$ is subtracted, fluctuations $\delta\theta_i$ in the angular position are obtained and given by (12):

$$\delta\theta_i = \theta_i - \omega_s t_i, \quad (12)$$

where $\theta_i$ is the sampled phase angle of the rotating space vector of the real system during faulty condition, $\omega_s$ is the supply angular frequency and $t_i$ is the sample time. A voltage signal can be taken as a referent signal, since it will hold accurate information about mains supply frequency currently present in the signal. Alternatively, equally spaced samples from the space vector circle can be taken and from two consecutive samples and the expected rotation increment $\Theta$ can be subtracted, as in equation (13):

$$\delta\theta_i = \theta_i - \theta_{i-1} - \Theta. \quad (13)$$

Figure 26:
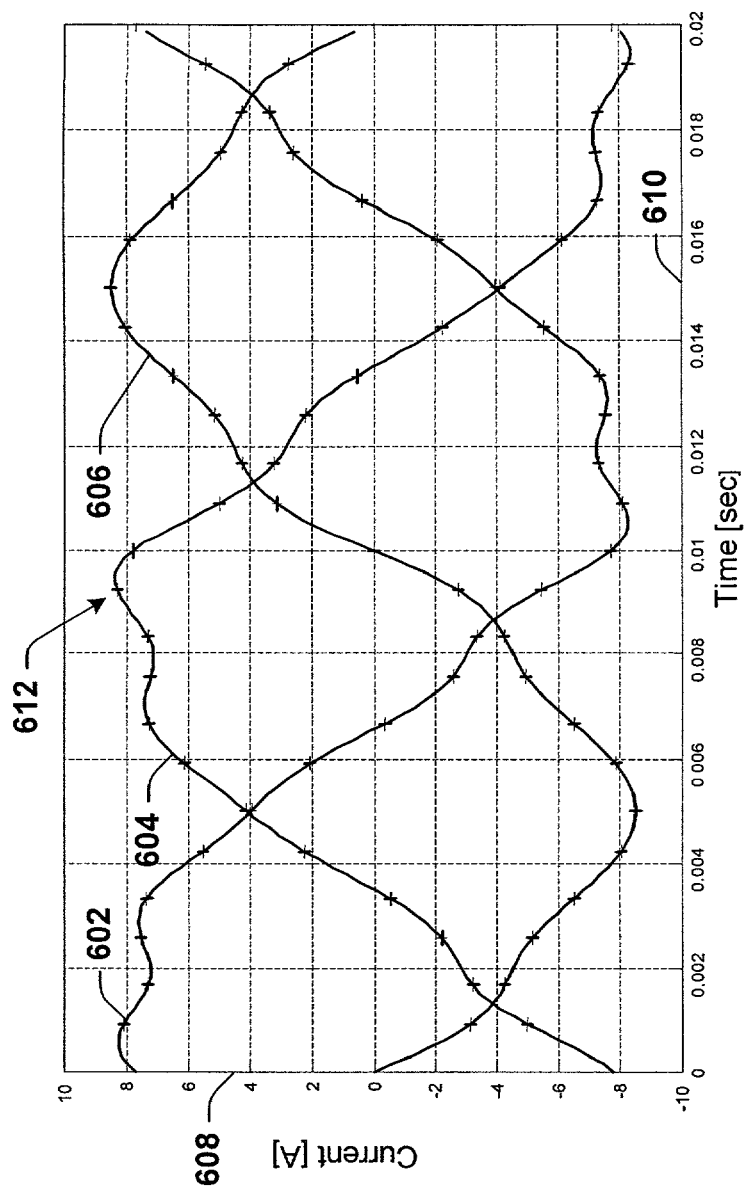
FIG. 26 is an exemplary plot illustrating sampled three phase currents with unbalanced harmonics in accordance with the invention.

$\Theta$ is the expected, undisturbed rotation of the space vector between successive samples of the space vector taken at intervals $t_s$ when the space vector is sampled, where $\Theta$ equals $\omega_s t_s$. FIG. 26 illustrates an exemplary plot 600 of three phase currents 602, 604, and 606 with harmonics plotted as current 608 versus time 610 in the time domain. Instants of time at which samples for SVAF analysis are taken, are indicated with crosses 612, wherein there are 24 samples taken in the single cycle (e.g., at 50 Hz) illustrated.

Figure 27:
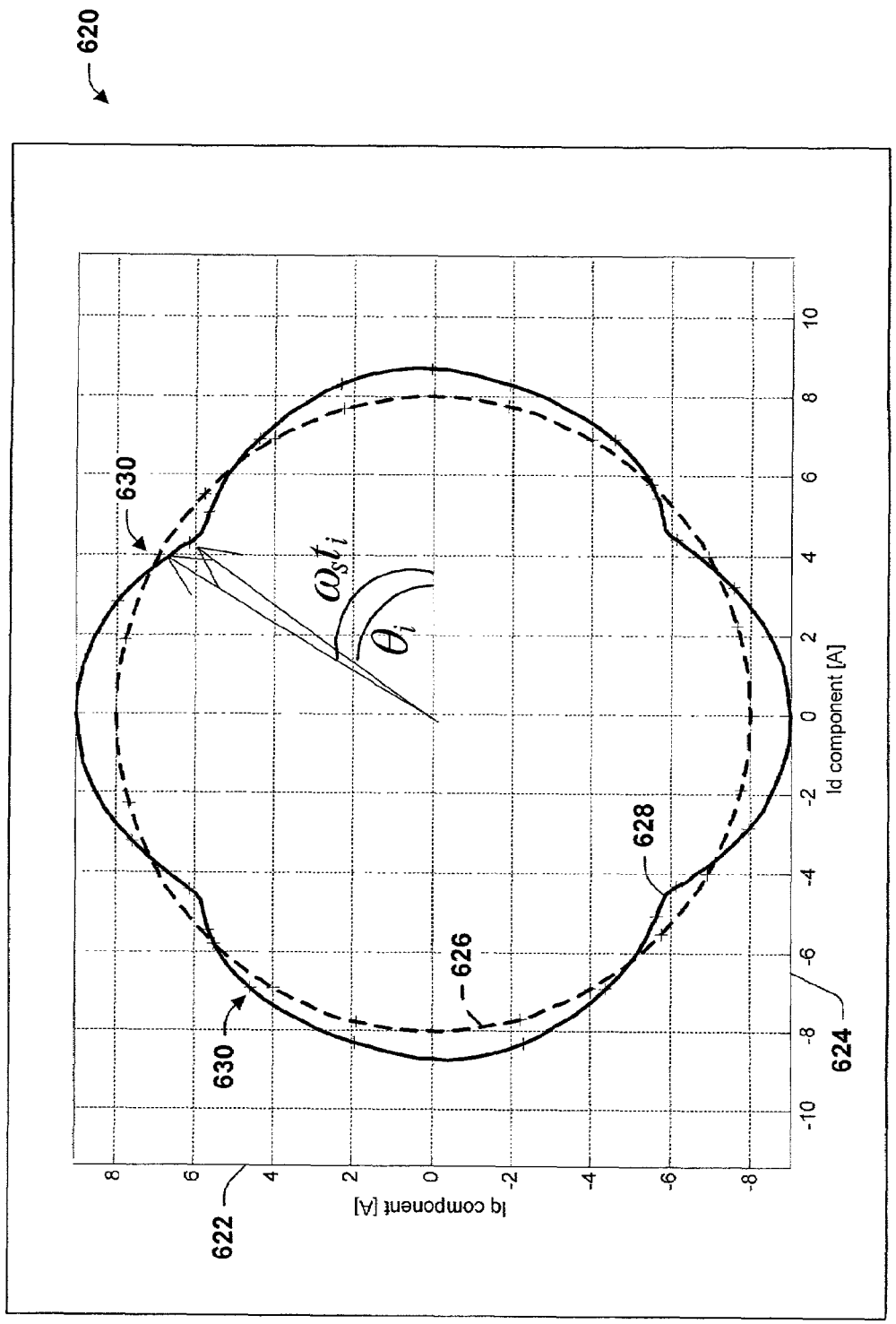
FIG. 27 is an exemplary plot illustrating sampled current space vectors for a balanced and an unbalanced system in accordance with the invention.
Figure 28:
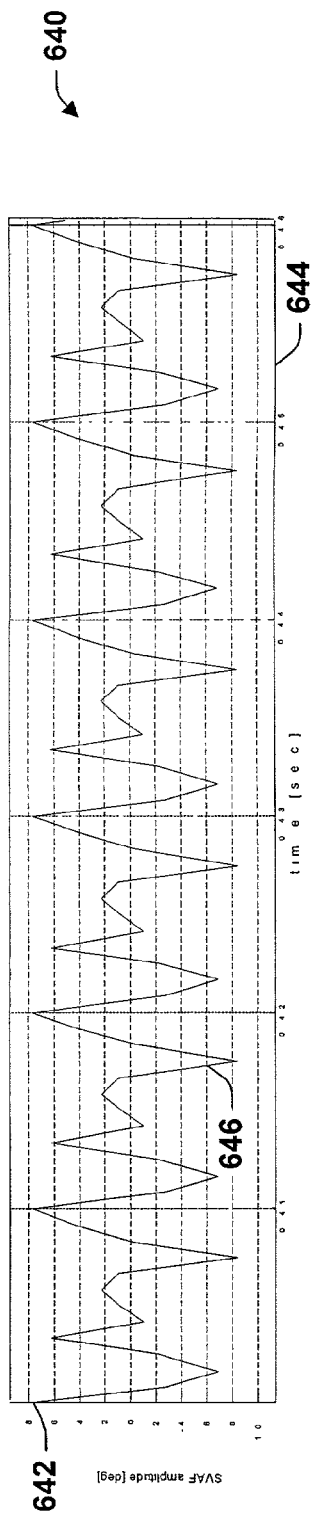
FIG. 28 is an exemplary plot illustrating space vector angular fluctuations in the time domain in accordance with the invention.

FIG. 27 illustrates an exemplary plot 620 of Iq component 622 versus Id component 624, wherein a circular space vector 626 is illustrated in dashed line for the case of an ideal balanced system without harmonics, and where an exemplary space vector 628 is illustrated for the case of three phase system with unbalanced harmonics (solid). Samples chosen for the SVAF calculations from the space vector circle are marked with crosses 630. Referring also to FIG. 28, an exemplary plot 640 of space vector angular fluctuations SVAF 642 versus time 644 illustrates sampled values $\delta\theta_i$ 646 presented in the time domain. With the SVAF techniques according to the present invention, it is possible to select any sampling frequency to sample the space vector circle, whereas the sample rate of the zero crossing times ZCT technique is limited. Thus, the frequency range in the spectrum of the SVAF signal may be extended, whereby aliasing from higher frequencies may be avoided.

Figure 29:
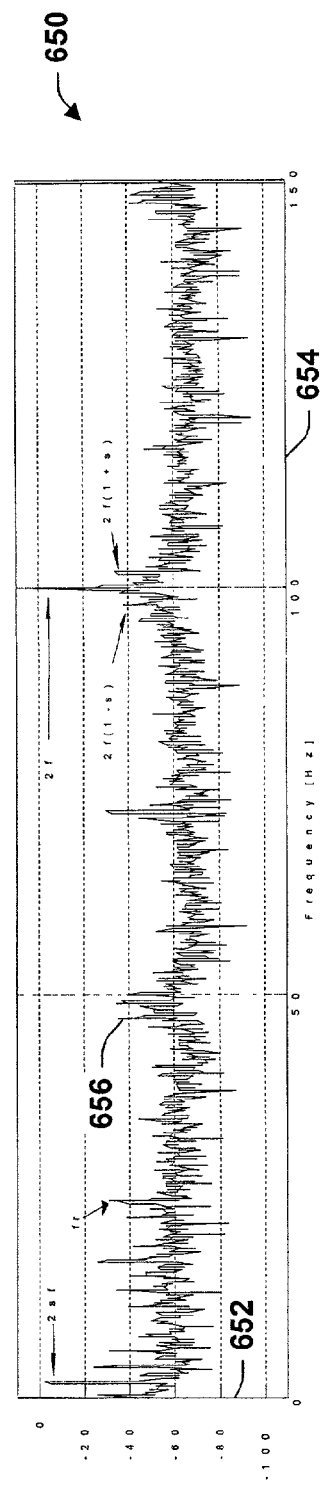
FIG. 29 is an exemplary plot illustrating frequency spectrum of space vector angular fluctuation with fault indicative frequencies in accordance with the invention.

As illustrated in FIG. 29, an exemplary plot 650 of SVAF 652 versus frequency 654 shows an exemplary frequency spectrum 656 of the space vector angular fluctuation. The inventors have found that one or more fault indicative frequencies are present in the SVAF spectrum 656. In addition, the spectral data includes lines at frequencies corresponding to the physical process. For example, torque fluctuations at shaft frequency will appear at exactly rotor frequency ($f_r$), compared to spectra from direct current sampling which provide this information as sidebands to the mains frequency, or its harmonics. Other frequencies of interest are illustrated and described in greater detail hereinafter.

Experimental data has been obtained using three induction motors, with special windings on the stator to enable stator fault experiments. A 4 hp motor was used in which slot windings were brought out to panel terminals, to allow short circuiting of selected slots to simulate a stator fault. The motor was connected as a four pole induction motor with stator windings in 46 slots, each slot having 64 turns. The rotor of the 4 hp motor was a wound rotor, which enabled the rotor circuit to be unbalanced by adding extra resistance to simulate rotor faults. Also used were a 2 hp, four pole induction motor, and a 2.2 kW, four pole induction motor, in which stator faults were simulated through taps on the winding, that could be connected to short circuit two, three, four or ten neighboring turns. A resistor was added to the shorting link to limit the fault current to protect the winding. In addition, rotor faults were simulated by cutting rotor bars.

With respect to stator fault detection, short-circuited turns on the stator of an induction motor cause asymmetry of the three phase stator winding. When explained by symmetrical components theory, the overall effect of such a fault is the presence of three phase negative sequence currents, as is known. Negative sequence currents rotate at angular frequency ($\omega_s$) and so does their corresponding space vector. Thus, the three phase system from equation (5) has negative sequence currents as additional component and angular fluctuations of the resultant space vector from equation (11) include terms with following frequency $\omega'=\omega_s-(-\omega_s)=2\omega_s$. The spectrum of the SVAF signal will include a spectral component at $2f_s$, where $f_s$ is the frequency of power applied to the motor. The amplitude of this spectral component has been found by the inventors to change when a stator fault condition exists. Consequently, the amplitude of the SVAF at this frequency may be employed as a diagnostic measure for such stator faults.

To monitor stator faults in real time, the changes of the $2f_s$ amplitude may be monitored. The Goertzel algorithm may be employed to extract this spectral component amplitude information using data sampled over a single supply cycle. The Goertzel algorithm advantageously provides expression of the computation of the DFT as a linear filtering operation. This may be used, for example, when the DFT is to be computed from a sequence of N samples, at a relatively small number M of values, where $M \leq \log_2 N$. In the present example, M=1 since only one DFT value is needed from the block of input data. The length of the input data is N=6 for the ZCT method, or more for SVAF method, depending on the selected sampling rate. The Goertzel algorithm may thus be more efficient than the FFT algorithm for this type of calculation. Where the spectral information is thus obtained, e.g., through monitoring the behavior of one spectral frequency or component over a period of one mains cycle, a very fast response time results, making it suitable for real time, on-line detection of stator faults.

Figure 30:
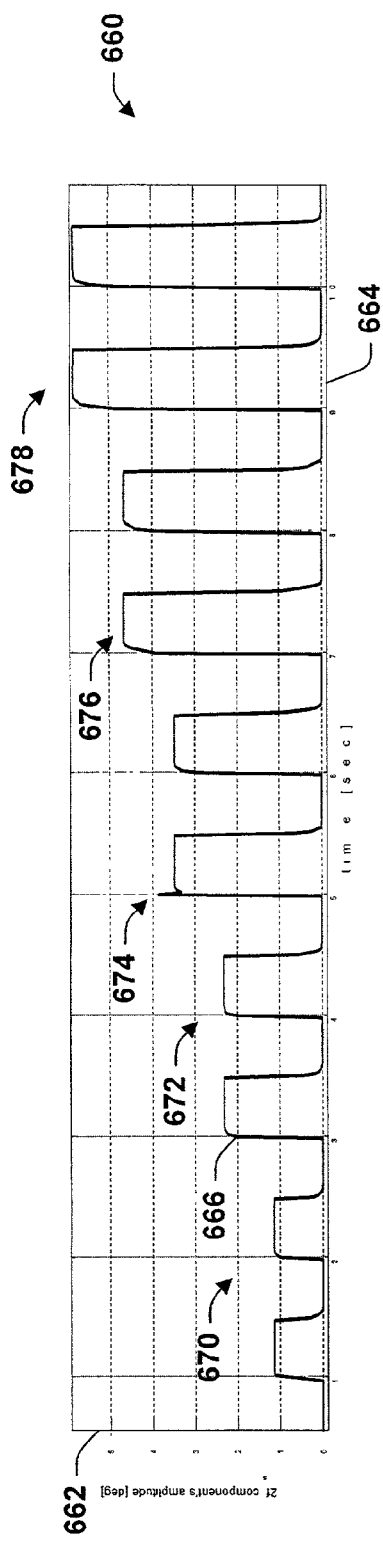
FIG. 30 is an exemplary plot illustrating an exemplary 2fs real time component obtained via a Goertzel algorithm in accordance with the invention.

An induction motor with 652 turns in each stator phase was simulated. One, two three, four and five turns respectively were short-circuited in a computer model and the results are illustrated in FIG. 30 as an exemplary plot 660 of $2f_s$ component amplitude 662 versus time 664. The $2f_s$ diagnostic metric 666 was extracted on-line and its amplitude plotted, wherein the SVAF technique responds virtually immediately to various stator faults 670, 672, 674, 676, and 678, corresponding to 1, 2, 3, 4, and 5 of 652 turns shorted, respectively, in the motor. The SVAF methodology detects the first supply cycle having increased negative sequence current, which is reflected in the diagnostic index 666 (e.g., SVAF spectral component amplitude fluctuation), as illustrated in FIG. 30. The number of shorted turns, e.g., the severity of the fault, is also indicated with rise in the amplitude of this index 666, wherein the fault was alternatively switched on and off repetitively in FIGS. 30 and 32.

Figure 31:
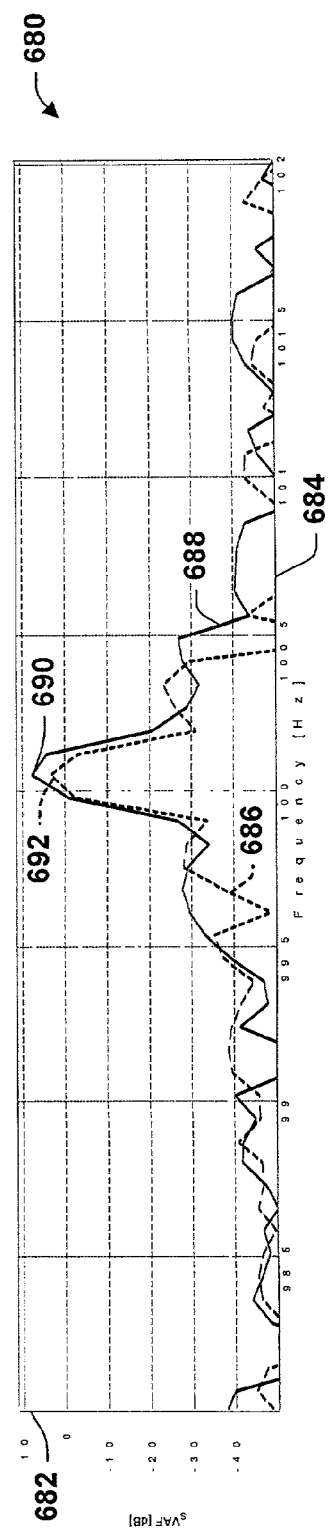
FIG. 31 is and exemplary plot illustrating a fluctuation in amplitude of a 2fs component due to stator fault in accordance with the invention.
Figure 32:
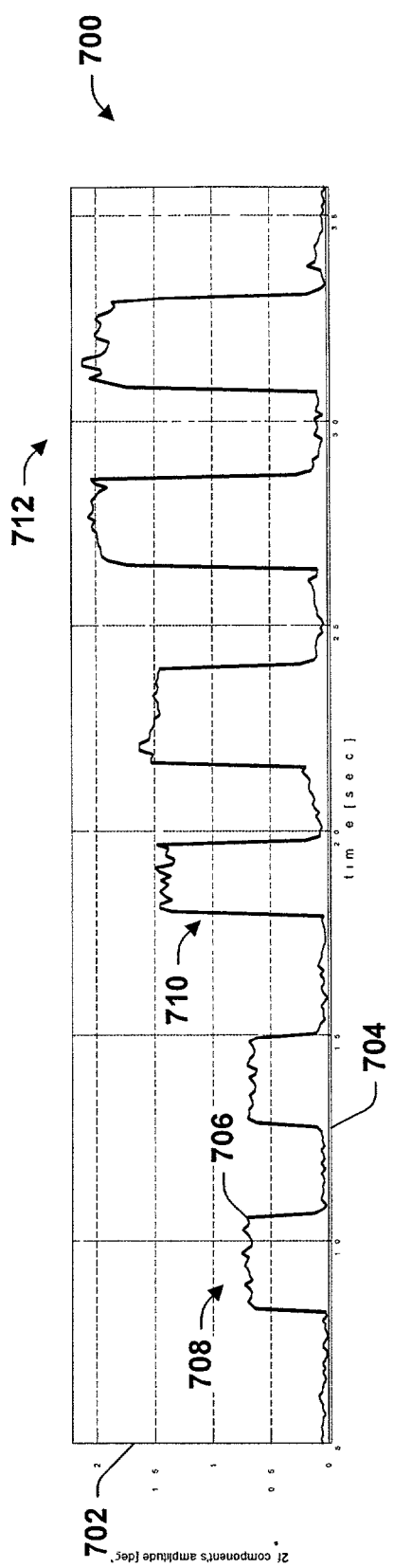
FIG. 32 is an exemplary plot illustrating another exemplary 2fs real time component obtained via a Goertzel algorithm in accordance with the invention.

FIG. 31 illustrates an exemplary plot 680 of SVAF 682 versus frequency 684, centered around the $2f_s$ frequency of 100 HZ, wherein a spectrum 686 is illustrated in dashed line for a healthy motor, and an SVAF spectrum 688 is illustrated for the motor with a stator short circuit (solid), for 1.4% of phase voltage short-circuited turns, as obtained experimentally. As illustrated, the amplitude 690 of the component at approximately 2fs for the faulted motor is higher than the corresponding amplitude 692 for the healthy motor. Further experimental results are illustrated in FIG. 32 as an exemplary plot 700 of $2f_s$ component amplitude 702 versus time 704, wherein the $2f_s$ diagnostic metric 706 was extracted on-line and its amplitude plotted. The SVAF technique responds quickly to various stator faults 708, 710, and 712, corresponding to 0.7%, 1.05%, and 1.4% of stator turns shorted, respectively, in the motor.

The SVAF technique may further be employed to detect problems associated with unbalanced supply voltages, and to distinguish such faults from stator faults in accordance with another aspect of the invention. When the supply voltage is unbalanced and contains negative sequence voltages, negative sequence currents result on the stator of the induction motor. The $2f_s$ current component amplitude is directly affected when the supply voltage is unbalanced. The invention further provides for distinguishing stator faults from supply unbalance conditions based on angular fluctuations in current and voltage space vectors.

For instance, analysis of diagnostic index $2f_s$ from voltage space vector angular fluctuations may be combined with analysis of diagnostic index $2f_s$ from the current space vector angular fluctuations, to classify the condition affecting the motor. In this regard, the inventors have found that a sudden change in the current $2f_s$ spectral component amplitude occurring within one supply cycle with a corresponding sudden change in the voltage $2f_s$ spectral component amplitude indicates an unbalanced condition, whereas a sudden change in the current $2f_s$ spectral component amplitude occurring within one supply cycle without such a corresponding sudden change in the voltage $2f_s$ spectral component amplitude indicates a stator fault. Thus, fuzzy logic systems or other techniques may be employed in the diagnostic component in order to distinguish unbalanced power and stator fault conditions in accordance with the present invention.

The invention further provides for detection and/or diagnosis of rotor problems or faults within an electric motor using space vector angular fluctuation. The existence of a rotor cage fault has been found to cause an electrical asymmetry of the rotor circuit of a motor. This asymmetry gives rise to a $(1-2s)f_s$ spectral component in the stator current, wherein the amplitude of these sidebands reflects the extent of the rotor asymmetry. For instance, the interaction of the $(1-2s)f_s$ harmonic of the motor current with the fundamental air-gap flux produces speed ripple at $2sf_s$ and gives rise to additional motor current harmonics at frequencies given by the following equation (14):

$$f_{rb}=(1+2ks)f_s, k=1, 2, 3 \ldots \quad (14)$$

The three phase system of currents from (5), for rotor fault, includes additional components at angular frequency $\omega_{comp.}=(1-2s)\omega_s$ and the space vector angular fluctuation from equation (11) holds sinusoidal components at $\omega'=\omega_s-\omega_{comp.}=2s\omega_s$ and its multiples. Spectral analysis of the experimental SVAF signals with rotor asymmetry confirms that this component appears in the spectrum of the SVAF signal and may be used as a diagnostic index for rotor faults. In addition, spectral components at sidebands $(1-s)2f_s$ and $(1+s)2f_s$, appear around $2f_s$ in the SVAF spectrum and their amplitude increases with the severity of the rotor asymmetry. The origin of these sidebands can be found when current space vector spectrum is analyzed. For instance, if the motor is supplied from a non-ideal power source, e.g., one which has negative sequence current on the stator due to the negative sequence voltage, negative sidebands $-(1-2s)f_s$ and $-(1+2s)f_s$ are found in the motor current spectrum. Thus, the SVAF spectrum includes $\omega'=\omega_s-\omega_{comp.}=\omega_s-[-(1+/-2s)\omega_s]$ $(1+/-s)2\omega_s$ components. Modulation of the $2f_s$ component in the SVAF spectrum by these sidebands causes $2sf_s$ ripple in the $2f_s$ component, giving an indication of the rotor unbalance, when this frequency component is monitored on-line.

Referring now to FIGS. 33-44, an exemplary plot 720 is illustrated in FIG. 33 as SVAF power 722 versus frequency 724, wherein a spectrum 726 for a mildly unbalanced rotor is shown in dashed line, and a spectrum 728 is shown for a rotor having greater imbalance, obtained by simulation. For the simulation, different amounts of rotor unbalance were created with respect to a healthy rotor resistance of $R_r'=0.816$ Ohm. The first case of unbalance 726 assumes added resistance of $\Delta R_r'=0.1$ Ohm in one rotor phase, while in the second case 728, an added resistance of $\Delta R_r'=0.2$ Ohm is used. Twice the slip frequency is 6 Hz, and sidebands to the $2f_s$ component occur correspondingly at 94 Hz and 106 Hz for a source frequency of 50 Hz. FIG. 34 illustrates an exemplary plot 730 of SVAF power 732 versus frequency 734, wherein a rise in the $2sf_s$ and $4sf_s$ spectral components is seen due to one broken bar. A normal spectrum 736 is illustrated in FIG. 34 in dashed line together with a faulted motor spectrum 738. As illustrated in FIG. 34, the peak 740 for the normal motor is lower than the peak 742 for the faulted motor case.

Figure 35:
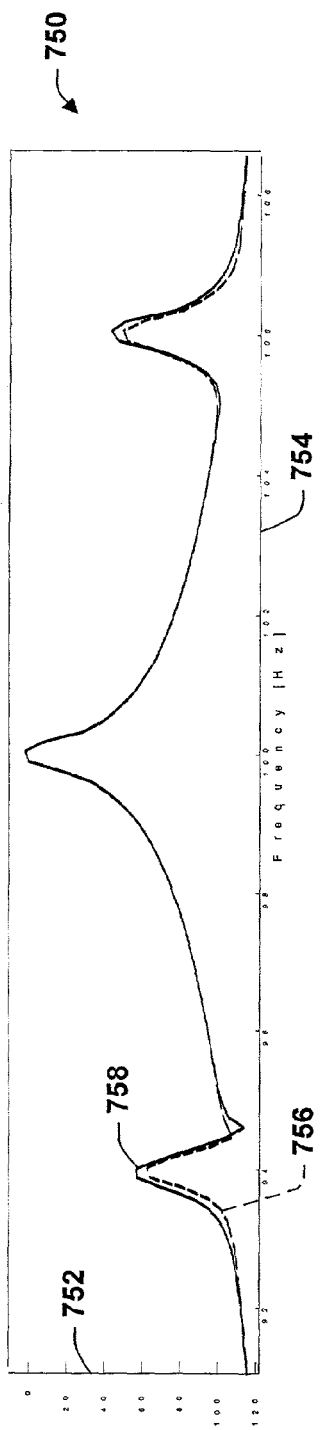
FIG. 35 is an exemplary plot illustrating sidebands due to rotor resistance imbalance in accordance with the invention.
Figure 36:
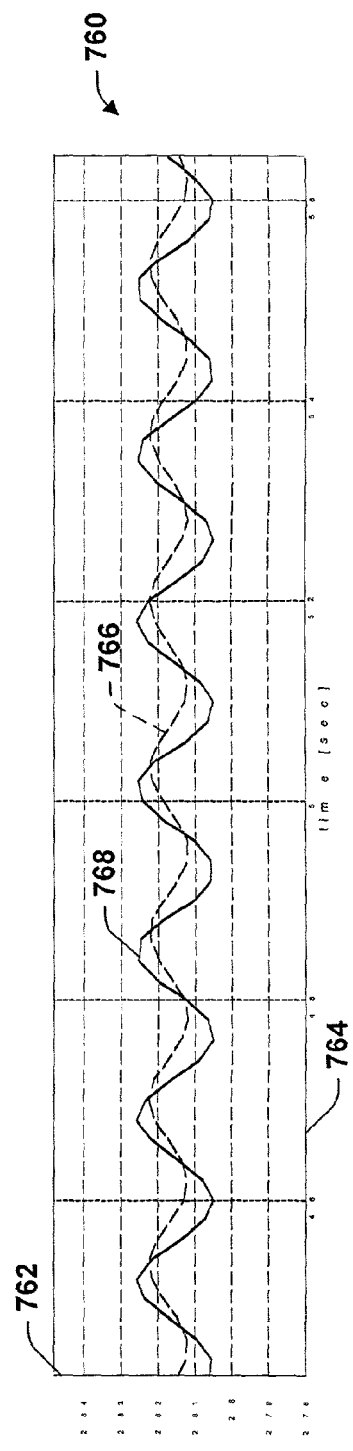
FIG. 36 is an exemplary plot illustrating oscillation of 2fs and 2sfs components due to rotor asymmetry in accordance with the invention.
Figure 39:
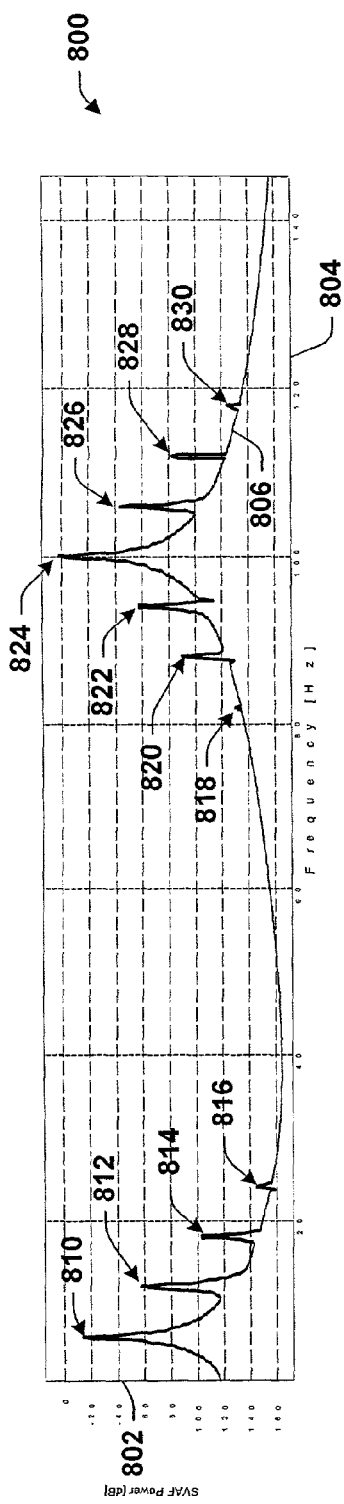
FIG. 39 is an exemplary plot illustrating a space vector angular fluctuation spectrum with components due to rotor imbalance in accordance with the invention.

FIG. 35 illustrates an exemplary plot 750 of SVAF power 752 versus frequency 754, wherein a rise in the $(1-s)2f_s$ and $(1+s)2f_s$ sidebands is illustrated from the mild rotor resistance imbalance spectrum 756 to a spectrum 758 for higher degree of imbalance, for the imbalance conditions discussed above with respect to FIG. 33. In FIG. 36, a plot 760 of SVAF power 762 versus time 764 illustrates oscillations of the $2f_s$ component at $2sf_s$ frequency, via mild imbalance curve 766 and higher imbalance curve 768 for the same degrees of rotor resistance unbalance. FIG. 37 provides a plot 770 of current space vector power 772 versus frequency 774 illustrating an exemplary current space vector spectrum 776, and FIG. 38 provides a plot 780 of voltage space vector power 782 versus frequency 784 illustrating a voltage space vector spectrum 786.

FIGS. 37 and 38 illustrate the spectrum of the current and voltage space vectors, respectively, under unbalanced rotor ($\Delta R_r'=0.1$ Ohm) and unbalanced voltage supply condition of 0.6%, wherein supply voltage unbalance condition is the ratio of negative to positive sequence voltage. This voltage negative sequence causes 4.86% unbalance in the stator currents. A spectral component at (−50 Hz) is present in the spectrum of the voltage space vector, as well as in the spectrum of the current space vector. Negative sidebands $-(1-2s)f_s$ and $-(1+2s)f_s$ in the current spectrum are also distinguishable. These cause sidebands $(1-s)2f_s$ and $(1+s)2f_s$ in the SVAF spectrum, which are shown on the FIG. 39, which provides a plot 800 of SVAF power 802 versus frequency 804. As illustrated in the spectrum 806 of FIG. 39, spectral components 810, 812, 814, 816, 818, 820, 822, 824, 826, 828, and 830 are seen for $2sf_s$, $4sf_s$, $6sf_s$, $(1-s)6f_s$, $(1-s)4f_s$, $(1-s)2f_s$, $2f_s$, $(1+s)2f_s$, $(1+s)4f_s$, and $(1+s)6f_s$, respectively.

Figure 40:
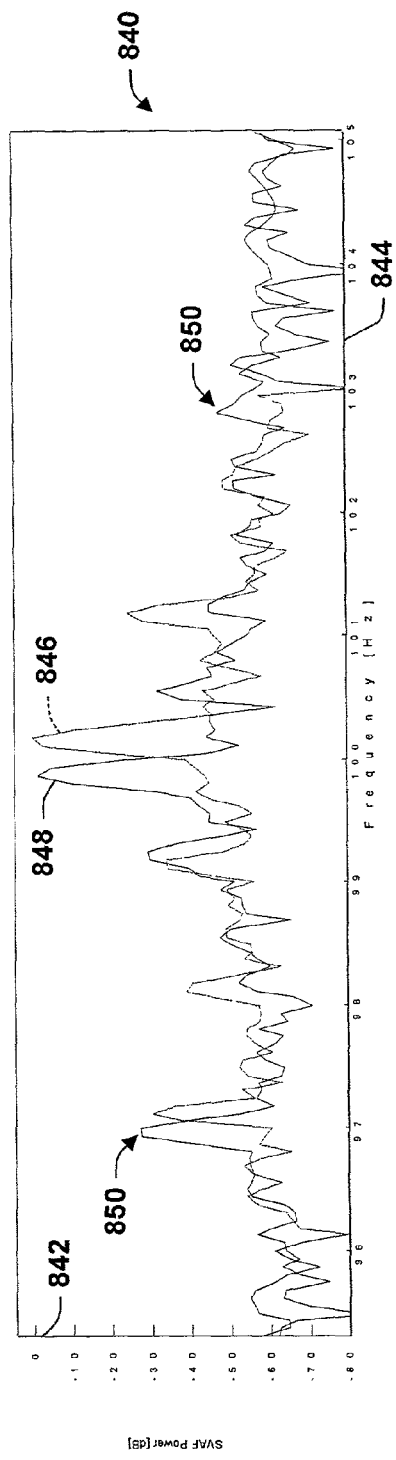
FIG. 40 is an exemplary plot illustrating an amplitude fluctuation in (1−s)2fs and (1+s)2fs components due to a broken rotor bar in accordance with the invention.
Figure 41:
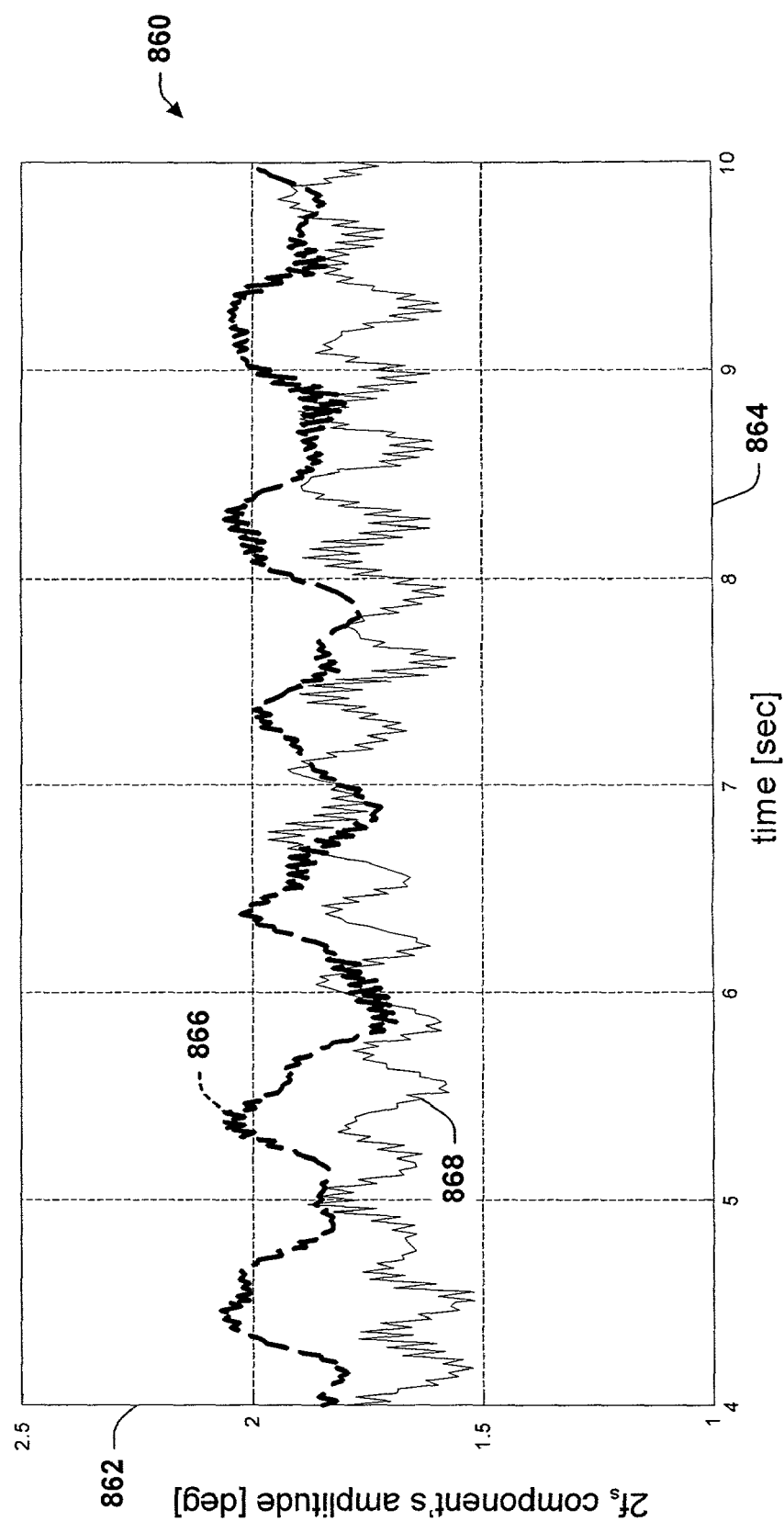
FIG. 41 is an exemplary plot illustrating oscillation of a 2fs component due to a broken rotor bar in accordance with the invention.
Figure 42:
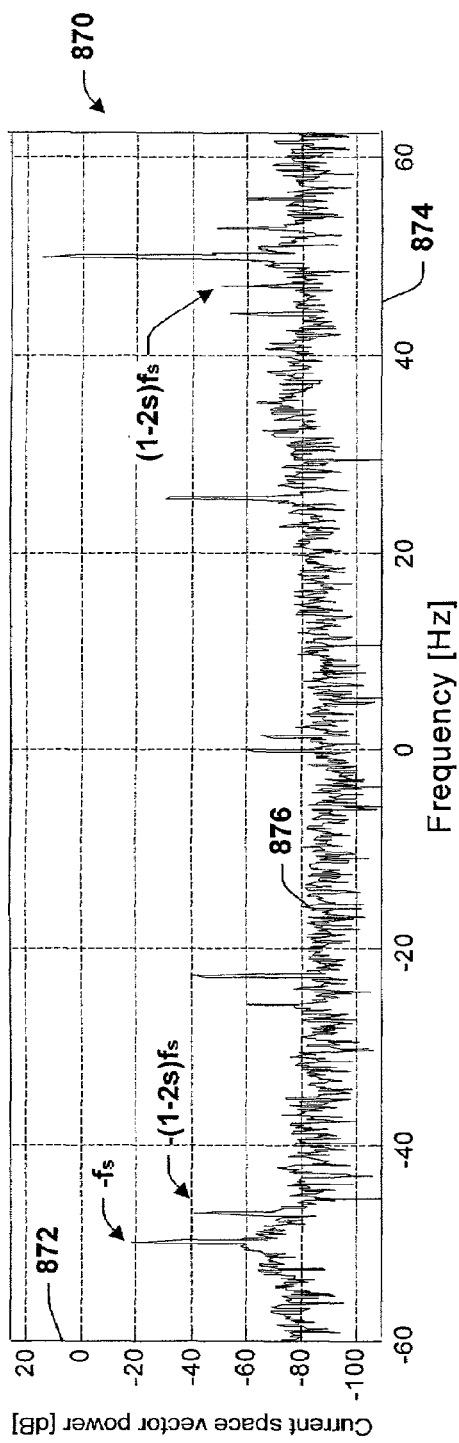
FIG. 42 is an exemplary plot illustrating a current space vector spectrum in the presence of a broken rotor bar in accordance with the invention.
Figure 43:
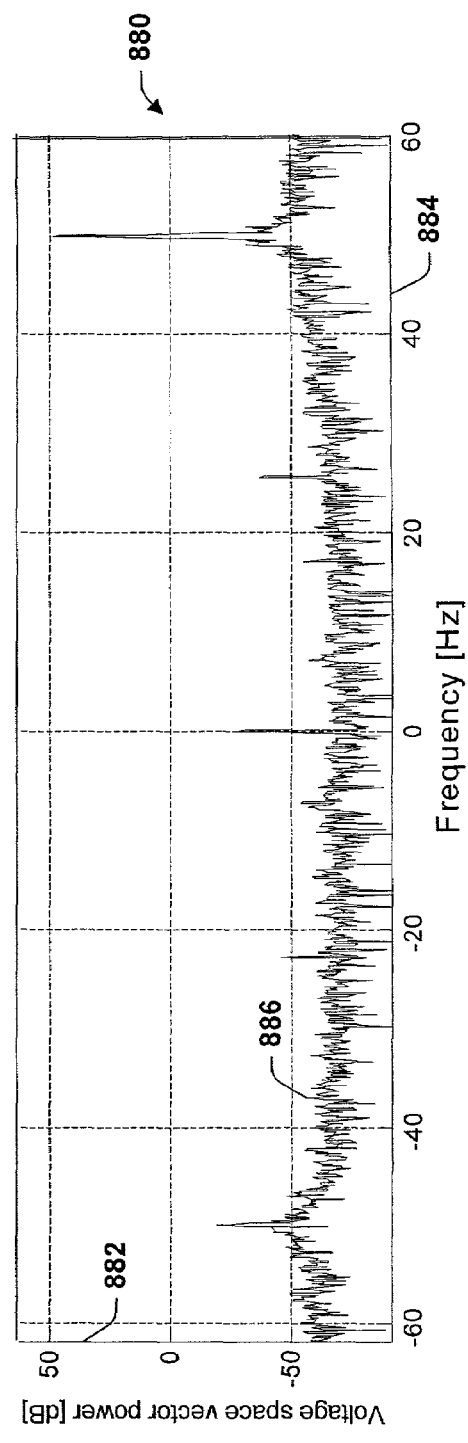
FIG. 43 is an exemplary plot illustrating a voltage space vector spectrum in the presence of a broken rotor bar in accordance with the invention.
Figure 44:
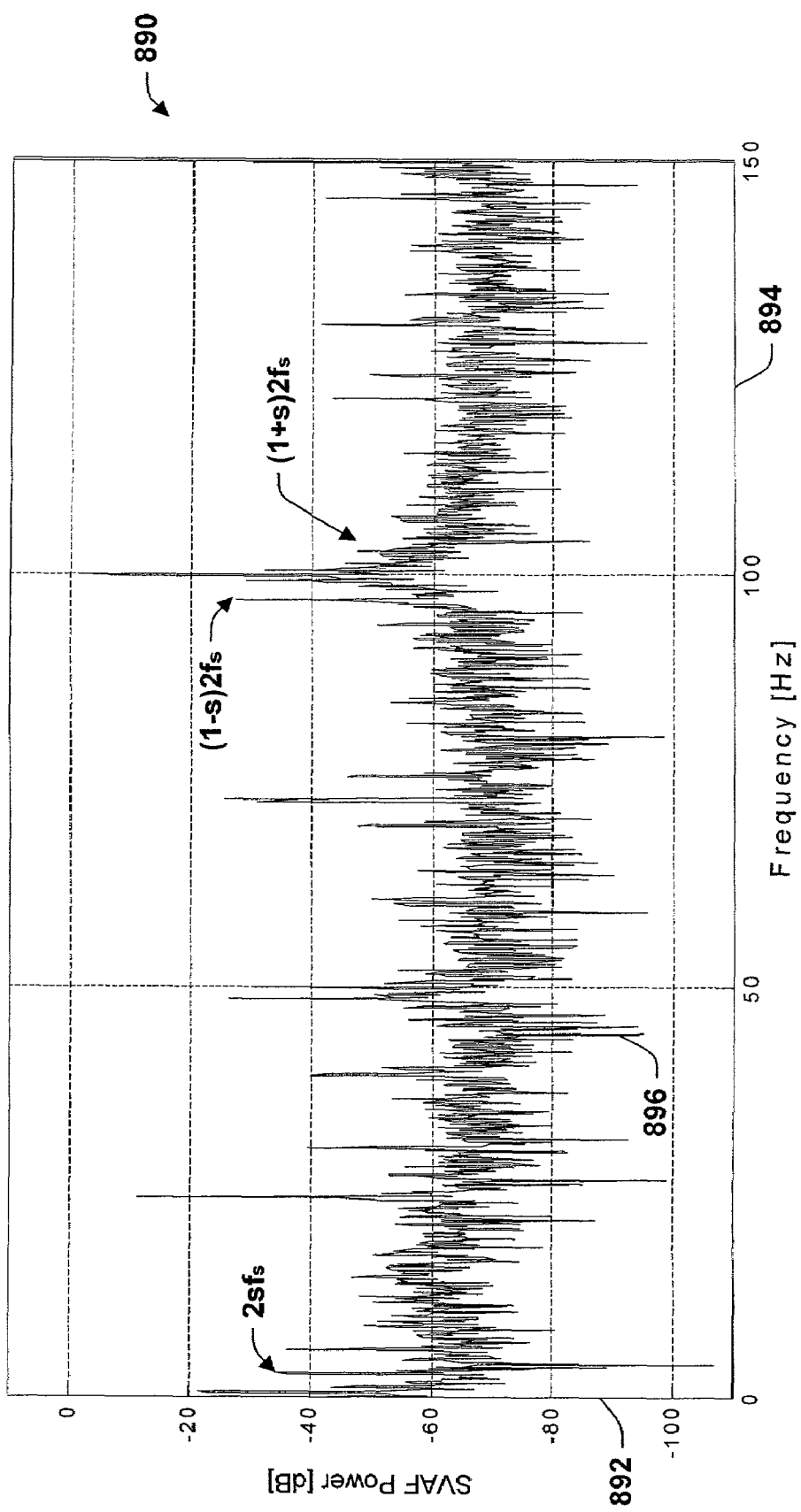
FIG. 44 is an exemplary plot illustrating a space vector angular fluctuation spectrum in the presence of a broken rotor bar in accordance with the invention.

FIG. 40 illustrates a plot 840 of SVAF power 842 versus frequency 844 for a normal motor spectrum 846 and a broken bar fault spectrum 848, wherein fault indicative frequency spectrum components 850 are illustrated. Results presented are for normal condition on the motor and for one broken rotor bar, out of twenty six. Supply voltage is 1% unbalanced. FIGS. 34 and 40 show $2sf_s$, and $(1-s)2f_s$ and $(1+s)2f_s$ spectral components, respectively. FIG. 41 illustrates a plot 860 of $2f_s$ component amplitude 862 versus time 864 for a normal motor 866 and for a motor having one broken bar 868. Finally, complex spectra of the current and voltage space vectors are presented on FIGS. 42 and 43, respectively. FIG. 42 includes a plot 870 of current space vector power 872 versus frequency 874 showing a spectrum 876, and FIG. 43 illustrates a plot 880 of voltage space vector 882 versus frequency 884 with a spectrum 886. Negative sequence current and voltage, as well as $-(1-2s)f_s$, negative current sideband can be clearly be seen. FIG. 44 presents full spectrum with rotor fault indicative frequencies, wherein a plot 890 of SVAF power 892 versus frequency 894 illustrates a spectrum 896.

The angular fluctuations of the induction motors current space vector may thus be employed in accordance with the invention as diagnostic data for stator and rotor induction motor faults, as well as for diagnosing unbalanced supply conditions. The SVAF methodology allows monitoring of fault indicative changes in the diagnostic data, through analyzing characteristic frequencies in the spectrum of the space vector angular fluctuations. The following table summarizes various diagnostic indices for stator and rotor faults which may be detected according to the invention:

TABLE I

DIAGNOSTIC INDICES FOR SVAF METHOD

| Diagnostic index | Origin of index | Required for | Monitoring type | Trend |
|---|---|---|---|---|
| Current SVAF $2f_s$ | Current neg. sequence | Stator fault | Real time | Increase with neg. sequence |
| Voltage SVAF $2f_s$ | Voltage neg. sequence | Stator fault | Real time | Increase with neg. sequence |
| Current SVAF $2sf_s$ | $(1-2s)f_s$ current sideband | Rotor fault | On-line spectrum | Increase with fault |
| Current SVAF $(1-s)2f_s$ | $-(1-2s)f_s$ current sideband | Rotor fault | On-line spectrum | Increase with fault |
| Current SVAF $(1+s)2f_s$ | $-(1+2s)f_s$ current sideband | Rotor fault | On-line spectrum | Increase with fault |

Stator faults may thus be indicated in the spectrum as change of the $2f_s$ and other component amplitudes. The Goertzel algorithm may be advantageously employed to extract the component's amplitude from the signal during each cycle of the mains supply. This avoids lengthy procedure required for creating frequency spectrum by Fourier Transformation as well as allowing real-time monitoring of motor faults. The $2f_s$ component will respond to the change in the angular fluctuations as soon as fault happens, allowing fast recognition in accordance with the present invention. The recognition process may include angular fluctuations of the voltage space vector, since voltage unbalance and load changes will affect this frequency. Rotor faults are indicated in the current space vector angular fluctuations spectrum with spectral lines at $2sf_s$, caused by $(1-2s)f_s$ and $(1+2s)f_s$ in the motor current spectrum, and at $(1-s)2f_s$ and $(1+s)2f_s$, which are directly caused by spectral lines $-(1-2s)f_s$ and $-(1+2s)f_s$ in the motor current space vector spectrum. Additionally, the $2f_s$ SVAF spectral component will oscillate at $2sf_s$ when monitored during each cycle, giving indication of the rotor unbalance in real-time.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. As used in this application, the term "component" is intended to refer to a computer-related entity, either hardware, a combination of hardware and software, software, or software in execution. For example, a component may be, but is not limited to, a process running on a processor, a processor, an object, an executable, a thread of execution, a program, and a computer. Furthermore, to the extent that the terms "includes", "including", "has", "having", and variants thereof are used in either the detailed description or the claims, these terms are intended to be inclusive in a manner similar to the term "comprising."

What is claimed is:

1. A diagnostics and control system for controlling a motorized system and diagnosing the health thereof, comprising:
    a controller that conveys a control signal to a motor drive to operate the motorized system in a controlled fashion; and
    a diagnostics system integrated with the controller and the motor drive to comprise a single unit that diagnoses the health of the motorized system according to a measured attribute associated with the motorized system, the diagnostics system providing a diagnostic signal to the controller, the diagnostic system includes at least one of a post processing portion that is a fuzzy rule based expert system and an associative list memory component that handles long bit strings of data, the associative list memory component based at least on an unsupervised training technique capable of learning within a single epoch.

2. The diagnostics and control system of claim 1, the measured attribute comprises at least one of vibration, pressure, current, speed, and temperature.

3. The diagnostics and control system of claim 1, the motorized system comprises a motor and a load, the load comprises at least one of a valve, a pump, a conveyor roller, a fan, a compressor, and a gearbox.

4. The diagnostics and control system of claim 1, the diagnostics system provides a diagnostics signal according to the health of the motorized system, and the controller provides a control signal to the motorized system according to at least one of a setpoint and the diagnostics signal.

5. The diagnostics and control system of claim 1, the measured attribute comprises at least one vibration signal obtained from a sensor associated with a motor in the motorized system.

6. The diagnostics and control system of claim 5, the diagnostics system diagnoses the health of at least one of a motor bearing, motor shaft alignment, and motor mounting according to the measured vibration.

7. The diagnostics and control system of claim 6, the diagnostics system performs frequency spectral analysis of the vibration signal.

8. The diagnostics and control system of claim 7, the diagnostics system comprises at least one of a neural network and an expert system, the diagnostics system provides a diagnostics signal indicative of the health of the motorized system according to frequency spectral analysis of the measured vibration signal using the at least one of a neural network and an expert system.

9. The diagnostics and control system of claim 8, the controller provides a control signal to the motorized system according to at least one of a setpoint and the diagnostics signal.

10. The diagnostics and control system of claim 1, the motorized system comprises a motorized pump, the measured attribute comprises at least one vibration signal obtained from a sensor associated with the pump, and the diagnostics system diagnoses the health of the pump according to the measured vibration.

11. The diagnostics and control system of claim 10, the diagnostics system performs frequency spectral analysis of the vibration signal.

12. The diagnostics and control system of claim 11, the diagnostics system comprises at least one of a neural network and an expert system, and the diagnostics system provides a diagnostics signal indicative of the health of the pump according to frequency spectral analysis of the measured vibration signal using the at least one of a neural network and an expert system.

13. The diagnostics and control system of claim 12, the controller provides a control signal to the motorized system according to at least one of a setpoint and the diagnostics signal.

14. The diagnostics and control system of claim 12, the diagnostics system employs data fusion techniques in order to derive the at least one vibration signal from at least one sensor associated with the motorized system.

15. The diagnostics and control system of claim 1, the motorized system comprises a motorized pump, the measured attribute comprises a current associated with a motor in the motorized system, and the diagnostics system provides a diagnostics signal indicative of pump cavitation according to the measured current.

16. The diagnostics and control system of claim 15, the diagnostics system comprises a neural network that synthesizes a change in condition signal from the measured current.

17. The diagnostics and control system of claim 16, wherein the diagnostics system comprises:
    a preprocessing portion operatively coupled to the neural network, the preprocessing portion conditions the measured current prior to inputting the current into the neural network; and
    the post processing portion operatively coupled to the neural network, the post processing portion determines whether the change in condition signal is due to a fault condition related to the motorized system.

18. The diagnostics and control system of claim 17, the diagnostics system detects at least one fault relating to the operation of the pump and at least one fault relating to the operation of the motor driving the pump according to the measured current.

19. The diagnostics and control system of claim 1, the diagnostics system obtains a space vector angular fluctuation from a current signal relating to operation of the motor, and analyzes the space vector angular fluctuation in order to detect at least one fault in the motorized system.

20. The diagnostics and control system of claim 19, the diagnostics system obtains a current signal associated with the motor, calculates a space vector from the current signal, determines a space vector angular fluctuation from the space vector, and analyzes the space vector angular fluctuation in order to detect the at least one fault associated with the motor.

21. The diagnostics and control system of claim 20, the diagnostics system samples first, second, and third phase current signals associated with the motorized system in order to obtain the current signal, calculates first, second, and third phase space vectors according to the first, second, and third phase current signals, respectively, and calculates the space vector by summing the first, second, and third phase space vectors, in order to calculate the space vector from the current signal.

22. The diagnostics and control system of claim 21, the diagnostics system performs a comparison of the space vector with a reference space vector, wherein the reference space vector is a function of a constant frequency and amplitude, and computes angular fluctuations in the space vector according to the comparison, in order to determine the space vector angular fluctuation.

23. The diagnostics and control system of claim 22, the diagnostics system computes a polynomial expansion of an arctangent function in order to compute angular fluctuations in the space vector.

24. The diagnostics and control system of claim 23, the diagnostics system performs frequency spectrum analysis of the space vector angular fluctuation in order to analyze the space vector angular fluctuation in order to detect at least one fault associated with the motorized system.

25. The diagnostics and control system of claim 24, the diagnostics system computes a frequency spectrum of the space vector angular fluctuation, and analyzes the amplitude of a first spectral component of the frequency spectrum at a first frequency in order to perform frequency spectrum analysis of the space vector angular fluctuation.

26. The diagnostics and control system of claim 25, the diagnostics system analyzes fluctuations in amplitude of the first spectral component in order to detect at least one fault associated with the motorized system.

27. The diagnostics and control system of claim 26, the first frequency is approximately twice the frequency of power applied to a motor in the motorized system.

28. The diagnostics and control system of claim 27, the diagnostics system utilizes a Goertzel algorithm to extract the amplitude of the first spectral component in order to analyze the amplitude of the first spectral component.

29. The diagnostics and control system of claim 28, the at least one fault comprises at least one of a stator fault, a rotor fault, and an imbalance in the power applied to the motor in the motorized system.

30. The diagnostics and control system of claim 1, the diagnostics system comprises at least one of a neural network, an expert system, and a data fusion component.

31. A method of controlling a motorized system and diagnosing the health thereof, comprising:
    employing a motor drive to operate a motor in the motorized system in a controlled fashion;
    utilizing a component integrated with a controller to diagnose the health of the motorized system according to a measured attribute associated with the motorized system, the motor drive, the controller and the component integrated with the controller form a single entity, the component integrated with the controller includes a section that includes at least one of a fuzzy rule based expert system and an associative list memory neural network component capable of handling long bit strings of data, the fuzzy rule based expert system in bidirectional communication with the associated list memory neural network component; and
    generating a diagnostics signal communicated to the controller.

32. The method of claim 31, further comprising providing a diagnostics signal indicative of the health of the motorized system, wherein operating the motor comprises controlling the motor according to at least one of a setpoint and the diagnostics signal.

33. The method of claim 32, further comprising measuring an attribute associated with the motorized system, wherein providing the diagnostics signal comprises obtaining a frequency spectrum of the measured attribute and analyzing the frequency spectrum in order to detect at least one fault in the motorized system.

34. The method of claim 33, providing the diagnostics signal comprises computing a space vector angular fluctuation, obtaining a frequency spectrum of the space vector angular fluctuation, and analyzing the amplitude of a first spectral component of the frequency spectrum at a first frequency.

35. The method of claim 31, diagnosing the health of the motorized system according to a measured attribute associated with the motorized system comprises:
    providing the measured attribute to at least one of a neural network, an expert system, and a data fusion component; and
    providing a diagnostics signal indicative of the health of the motorized system from the at least one of a neural network, an expert system, and a data fusion component.

36. The method of claim 35, operating the motor comprises controlling the motor according to at least one of a setpoint and the diagnostics signal.

37. An integrated control and diagnostics system for a motor, the system comprising:
    a diagnostics module to generate a health assessment signal indicative of the health of the motor, the diagnostics module includes a post processing section that includes a fuzzy rule based expert system and a component that handles long bit strings in an associative list memory, the component employs an unsupervised training technique capable of learning in a single epoch, the fuzzy rule based expert system and the component in bidirectional communication; and
    a controller integrated with the diagnostics module and coupled to a motor drive, the controller outputting a driving output based on the health assessment signal, the driving output is applied to the motor drive, the motor drive and the controller integrated with the diagnostics module form an indivisible unit.

38. The control and diagnostics system according to claim 37, the diagnostics module generates the health assessment signal at least partially based on the driving output produced by the controller.

39. The control and diagnostics system according to claim 38, the health assessment signal is indicative of whether the motor is deviating from a normal operating characteristic.

40. The control and diagnostics system according to claim 37, the controller is associated with at least one controllable parameter, the parameter being controllable in response to the health assessment signal.

41. The control and diagnostics system according to claim 37, further including at least one sensor, the sensor generating a signal indicative of a parameter associated with the motor, the health assessment signal is based on the sensor signal.

42. The control and diagnostics system according to claim 41, the controller includes a velocity feedback loop and a torque feedback loop.

43. The control and diagnostics system according to claim 42, the velocity feedback loop generates a current reference signal in response to the sensor signal, and the torque feedback loop generates the driving output in response to the current reference signal.

44. The control and diagnostics system according to claim 43, the velocity feedback loop includes a P-I controller to generate the current reference signal.

45. The control and diagnostics system according to claim 41, the motor parameter is one of a group consisting of velocity and vibration.

46. The control and diagnostics system according to claim 37, the diagnostics module includes an ASIC that generates the health assessment signal based on a process constraint.

47. The control and diagnostics systems according to claim 37, further comprising a coordination module coupled to a plurality of the control and diagnostics systems, the coordination module alters the driving output associated with one of the control and diagnostics systems based on the driving output of another one of the control and diagnostics systems.

48. An integrated control and diagnostics system, comprising:
means for controlling a motorized system utilizing a health assessment signal indicative of the health of the motorized system;
means for driving a motorized system based at least in part on input from the means for controlling; and
means for generating the health assessment signal, the means for generating integrated with the means for controlling and the means for driving to constitute a single unit, the means for generating further includes a means for post processing based on fuzzy rule based logic, the means for post processing utilizes a means for persisting an associative list that handles long bit strings of data, the means for persisting capable of unsupervised training the means for generating the health assessment signal in at least one of a fast learning mode or a slow learning mode.

49. A composite control and diagnostics system to control a motor, comprising:
means for effectuating movement of the motor;
means for controlling the means for effectuating movement in a controlled fashion based in part on a health assessment signal; and
means for formulating the health assessment signal, the means for effectuating movement, the means for controlling and the means for formulating the health assessment signal forming a single integrated unit, the means for formulating includes means for utilizing fuzzy rule based logic obtained from an expert and means for employing a one-shot unsupervised adaptive resonance theory-2 (ART-2) architecture comprising at least six layers.

50. An integrated control and diagnostics system, comprising:
means for diagnosing the health of a motorized system amalgamated to from a unitary whole with a means for controlling the motorized system and a means for driving the motorized system based in part on a control signal from the means for controlling, the means for diagnosing producing a diagnostic signal based at least in part on application of a fuzzy rule set acquired from an expert and means for employing an unsupervised adaptive resonance theory (ART) construct comprising at least six layers, the unsupervised adaptive resonance theory construct trains the means for employing in at least one of a fast learning mode or a slow learning mode, the fast learning mode effectuates training of the means for employing within a single cycle; and
means for communicating the diagnostic signal to the means for controlling.

\* \* \* \* \*